（12）United States Patent
Maeda et al.

(10) Patent No.: US 8,098,703 B2
(45) Date of Patent: Jan. 17, 2012

(54) LASER DIODE AND METHOD OF MANUFACTURING THE SAME

(75) Inventors: Osamu Maeda, Kanagawa (JP); Yuji Masui, Kanagawa (JP); Masaki Shiozaki, Kanagawa (JP); Susumu Sato, Kanagawa (JP); Takahiro Arakida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/656,427

(22) Filed: Jan. 29, 2010

(65) Prior Publication Data
US 2010/0226402 A1    Sep. 9, 2010

(30) Foreign Application Priority Data
Mar. 9, 2009    (JP) .................................. 2009-054677

(51) Int. Cl.
*H01S 5/00*    (2006.01)
(52) U.S. Cl. .............................. 372/46.013; 372/50.124
(58) Field of Classification Search ............. 372/46.013, 372/50.124
See application file for complete search history.

(56) References Cited

U.S. PATENT DOCUMENTS

| 5,778,018 | A | 7/1998 | Yoshikawa et al. |
| 6,639,931 | B1 | 10/2003 | Dowd et al. |
| 7,920,615 | B2 * | 4/2011 | Maeda et al. ............ 372/46.013 |
| 2009/0129417 | A1 | 5/2009 | Maeda et al. |

FOREIGN PATENT DOCUMENTS

| JP | 2891133 | 2/1999 |
| JP | 2001-525995 | 12/2001 |
| JP | 2003-332685 | 11/2003 |
| JP | 2008-016824 | 1/2008 |
| WO | WO 2007/142184 | * 12/2007 |

* cited by examiner

*Primary Examiner* — Armando Rodriguez
(74) *Attorney, Agent, or Firm* — Rader, Fishman & Grauer PLLC

(57) ABSTRACT

A laser diode allowed to stabilize the polarization direction of laser light in one direction is provided. The laser diode includes a laminate configuration including a lower multilayer reflecting mirror, an active layer and an upper multilayer reflecting mirror in order from a substrate side, in which the laminate configuration includes a columnar mesa section including an upper part of the lower multilayer reflecting mirror, the active layer and the upper multilayer reflecting mirror, and the lower multilayer reflecting mirror includes a plurality of pairs of a low refractive index layer and a high refractive index layer, and a plurality of oxidation layers nonuniformly distributed in a direction rotating around a central axis of the mesa section in a region except for a central region of one or more of the low refractive index layers.

17 Claims, 40 Drawing Sheets

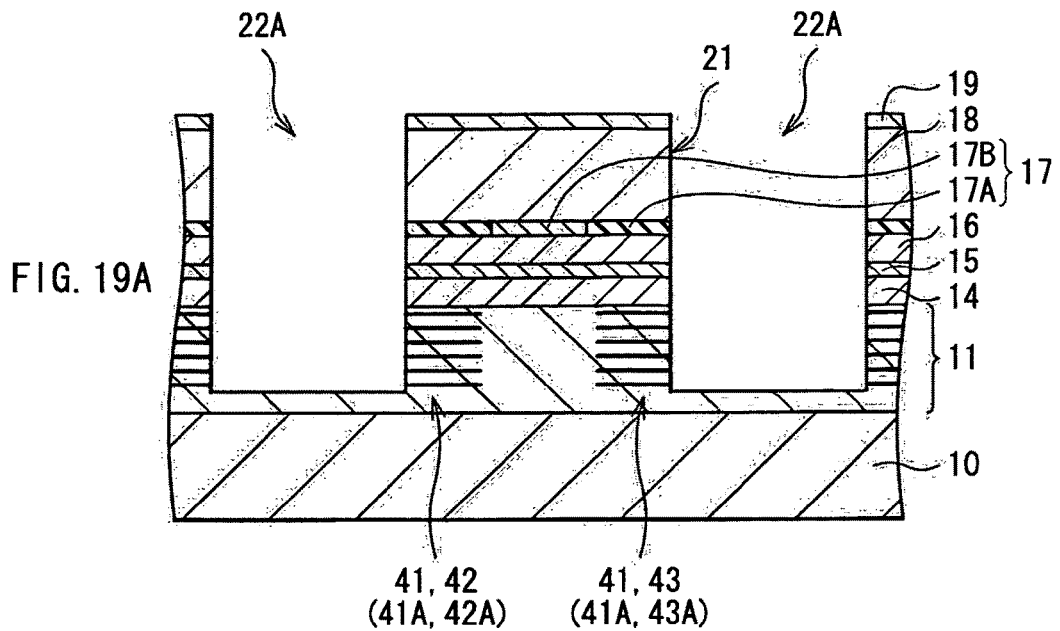
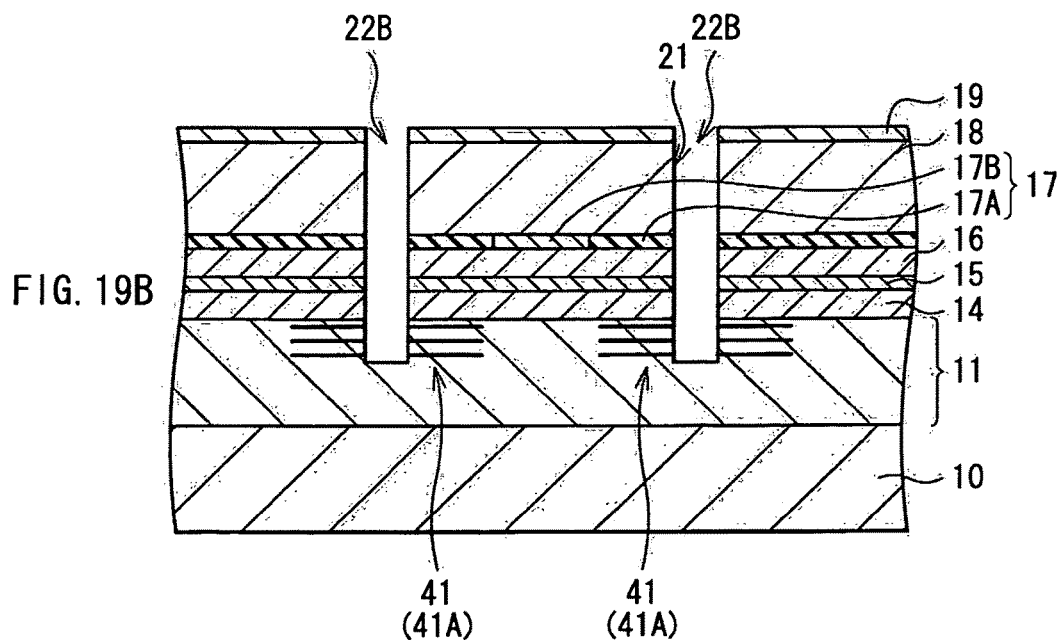

STRAIN RATE (MPa)

LASER DIODE AND METHOD OF MANUFACTURING THE SAME

BACKGROUND OF THE INVENTION

1. Field of the Invention

The present invention relates to a laser diode suitably applicable to applications demanding light output having a stable polarization direction and a method of manufacturing the same.

2. Description of the Related Art

Types of laser diodes include an edge-emitting laser diode, a surface-emitting diode and the like. The surface-emitting laser diode emits light in a direction orthogonal to a substrate, and a large number of devices are allowed to be arranged in a two-dimensional array on a single substrate. Therefore, the surface-emitting laser diode has received attention as a light source for digital copying machine or printer.

In the surface-emitting laser diode, for example, a pair of multilayer reflecting mirrors are formed on a semiconductor substrate, and an active layer including a light emission region is included between the pair of multilayer reflecting mirrors. A current narrowing layer is arranged on one of the multilayer reflecting mirrors so as to increase current injection efficiency into the active layer and to reduce a threshold current. In the surface-emitting laser diode, a current is confined by the current narrowing layer, and then the current is injected into the active layer, thereby light is emitted in the active layer, and while the light is repeatedly reflected by the pair of multilayer reflecting mirrors, the light is emitted from the light emission opening of one electrode (a p-side electrode) as laser light.

Such a surface-emitting laser diode typically has such non-uniformity that a polarization direction varies due to device variations, or such instability that the polarization direction is changed by output or environmental temperature. Therefore, an issue arises in the case where the surface-emitting laser diode is applied to a polarization-dependent optical device such as a mirror or a beam splitter. For example, in the case where the surface-emitting laser diode is used as a light source for digital copying machine or printer, variations in the polarization direction cause a difference in imaging position or output, thereby blur or color unevenness occurs.

Therefore, to solve such an issue, some techniques of stabilizing a polarization direction in one direction by arranging a polarization controllability function in the surface-emitting laser diode have been reported.

For example, a technique using a special inclined substrate which has a (311) plane as a normal and is made of gallium-arsenic (GaAs) is known. In the case where a surface-emitting laser diode is formed using such a special inclined substrate, gain characteristics with respect to the [−233] direction are enhanced, and the polarization direction of laser light is controllable to this direction. In addition, the polarization ratio of laser light is very high, so this technique is effective to stabilize the polarization direction of the surface-emitting laser diode in one direction.

Moreover, in Japanese Patent No. 2891133, a technique of controlling polarization by reducing the size of a section of a post structure to be smaller than the mode size of light is disclosed.

Moreover, in Published Japanese Translation. No. 2001-525995 of PCT international application, a technique of forming a discontinuity in a part of a metallic contact layer which does not have an influence on characteristics of laser light emitted from a light emission opening so as to obtain polarization in a direction parallel to a boundary of the discontinuity is disclosed.

Further, in Japanese Unexamined Patent Application Publication No. 2008-016824, a technique of arranging a pair of oxidation regions so as to face each other with a light emission region in between, thereby obtaining polarization in a direction orthogonal to a direction where the pair of oxidation regions face each other is disclosed.

SUMMARY OF THE INVENTION

However, the above-described inclined substrate is a special substrate having a (311) plane as a normal, so the inclined substrate is much more expensive than a (001) plane substrate as a typical substrate. In addition, in the case where such a special inclined substrate is used, epitaxial growth conditions such as doping conditions, a gas flow rate and the like are completely different from those in the case of the (001) plane substrate, so it is difficult to easily manufacture the incline substrate.

Moreover, in Japanese Patent No. 2891133, the size of the section of the post structure is smaller than the mode size of light, so light output is as low as approximately 1 mW. Therefore, the surface-emitting laser diode is not suitable for applications demanding high output such as a light source for digital copying machine or printer.

Moreover, in Published Japanese Translation No. 2001-525995 of PCT international application, as an example, a surface-emitting laser diode in which a groove (a discontinuity) with a depth of 4.0 to 4.5 μm is formed in a position 7 μm away from an edge of a light emission opening is disclosed, thereby polarization in a direction parallel to the groove is obtained. However, unless the distance of a short side of a resonance region is reduced to such an extent that a diffraction loss effect is generated, the polarization direction is not stabilized in one direction. Therefore, it is considered that the polarization direction is not allowed to be stabilized by the discontinuity formed in a range where the diffraction loss effect is not obtained (the distance of the short side is 7 μm).

Further, in Japanese Unexamined Patent Application Publication No. 2008-016824, the polarization direction of laser light is stabilized in one direction in predetermined light output, but it is difficult to obtain sufficient stability, and variations in stability of the polarization direction among surface-emitting laser diodes easily occur.

Thus, in the techniques in related art, it is difficult to easily manufacture a high-power surface-emitting laser diode allowed to stabilize the polarization direction of laser light in one direction at low cost.

It is desirable to provide a laser diode which is easily manufacturable at low cost and is allowed to stabilize the polarization direction of laser light in one direction and to achieve higher output, and a method of manufacturing the same.

According to an embodiment of the invention, there is provided a laser diode including a laminate configuration including a lower multilayer reflecting mirror, an active layer and an upper multilayer reflecting mirror in order from a substrate side. The laminate configuration includes a columnar mesa section including an upper part of the lower multilayer reflecting mirror, the active layer and the upper multilayer reflecting mirror. The lower multilayer reflecting mirror includes a plurality of pairs of a low refractive index layer and a high refractive index layer, and a plurality of oxidation layers nonuniformly distributed in a direction rotating around a central axis of the mesa section in a region except for a central region of one or more of the low refractive index layers.

In the laser diode according to the embodiment of the invention, the lower multilayer reflecting mirror includes a plurality of oxidation layers in one or more of the low refractive index layers, and these oxidation layers are nonuniformly distributed in a direction rotating around a central axis of the mesa section in a region except for a central region of the low refractive index layer. Thereby, a stress by the plurality of oxidation layers is nonuniformly and largely generated in the active layer, compared to the case where only one oxidation layer nonuniformly distributed in the same manner is included in one or more of the low refractive index layers. At this time, in the case where a nonuniform distribution of the plurality of oxidation layers has anisotropy, an anisotropic stress by the plurality of oxidation layers is generated in the active layer, so while a polarization component in a direction orthogonal to the direction of the stress is enhanced, a polarization component in a direction parallel to the direction of the stress is suppressed. Thereby, a polarization component of laser light is firmly fixed in one direction.

According to an embodiment of the invention, there is provided a method of manufacturing a laser diode including the following steps (A) to (E):

(A) forming a lower multilayer reflecting mirror including a plurality of pairs of a low refractive index layer and a high refractive index layer on a substrate, and arranging a refractive index layer relatively resistant to oxidation and a plurality of refractive index layers relatively susceptible to oxidation in one or more of the low refractive index layer;

(B) forming an active layer and an upper multilayer reflecting mirror in this order on a top surface of the lower multilayer reflecting mirror;

(C) forming a coating layer including one or a plurality of ring-shaped openings with a nonuniform width on a top surface of the upper multilayer reflecting mirror;

(D) forming a groove section with a nonuniform depth corresponding to the width of the opening by dry etching using the coating layer as a mask; and (E) forming an oxidation section nonuniformly distributed corresponding to a depth of the groove section in the lower multilayer reflecting mirror by oxidizing a side surface of the groove section.

In the method of manufacturing a laser diode according to the embodiment of the invention, the groove section with a nonuniform depth corresponding to the width of the opening is formed by dry etching in a laminate configuration including the lower multilayer reflecting mirror, the active layer and the upper multilayer reflecting mirror. Next, a plurality of refractive index layers relatively susceptible to oxidation of the low refractive index layer are oxidized from a side surface of the groove section so as to form the oxidation section nonuniformly distributed corresponding to the depth of the groove section. At this time, in the case where the nonuniform depth of the groove section has anisotropy, the distribution of the oxidation section has the same anisotropy as that of the groove section. In this case, an anisotropic stress by the oxidation section is strongly generated in the active layer, compared to the case where the low refractive index layer includes only one refractive index layer relatively susceptible to the oxidation. Thereby, while a polarization component in a direction orthogonal to the direction of the stress is enhanced, a polarization component in a direction parallel to the direction of the stress is suppressed. Therefore, a polarization component of laser light is fixed in one direction.

In the laser diode according to the embodiment of the invention, the lower multilayer reflecting mirror includes a plurality of oxidation layers nonuniformly distributed in a direction rotating around the central axis of the mesa section in a region except for the central region in one or more low refractive index layers. Thereby, a polarization direction of laser light is allowed to be stabilized in one direction.

In the method of manufacturing a laser diode according to the embodiment of the invention, the groove section with a nonuniform depth corresponding to the width of the opening is formed by dry etching, and then the oxidation section nonuniformly distributed corresponding to the depth of the groove section is formed by oxidation. Thereby, a polarization direction of laser light is allowed to be stabilized in one direction.

Moreover, the substrate is not necessarily a special substrate such as an (n11) plane substrate (n is an integer), and may be a typical (100) plane substrate, so the laser diode is manufacturable easily at low cost. Moreover, it is not necessary to expand the oxidation layer to a region corresponding to a light emitting region of the active layer in the low refractive index layer, so there is little possibility that light output declines, and high-power laser light is allowed to be emitted.

Thus, in the laser diode and the method of manufacturing a laser diode according to the embodiment of the invention, the laser diode is manufacturable easily at low cost, and the polarization direction of laser light is allowed to be stabilized on one direction, and higher output is achievable.

Other and further objects, features and advantages of the invention will appear more fully from the following description.

BRIEF DESCRIPTION OF THE DRAWINGS

FIGS. 19A and 19B are sectional views for describing a step following FIGS. 18A and 18B.

DETAILED DESCRIPTION OF THE PREFERRED EMBODIMENTS

Preferred embodiments will be described in detail below referring to the accompanying drawings. Descriptions will be given in the following order.

1. First Embodiment (example of configuration and manufacturing method of surface-emitting laser diode)
2. Modifications of First Embodiment (other configuration examples of lower DBR mirror layer)
3. Second Embodiment (example of surface-emitting laser diode including another lower DBR mirror layer)
4. Third Embodiment (example of surface-emitting laser diode including still another lower DBR mirror layer)
5. Fourth Embodiment (example of surface-emitting laser diode including transverse mode adjustment layer)
6. Fifth Embodiment (example of another surface-emitting laser diode)
7. Modifications of Fifth Embodiment (example of another surface-emitting laser diode)

1. First Embodiment

Configuration of Laser Diode 1 (Surface-Emitting Type)

Figure 1:
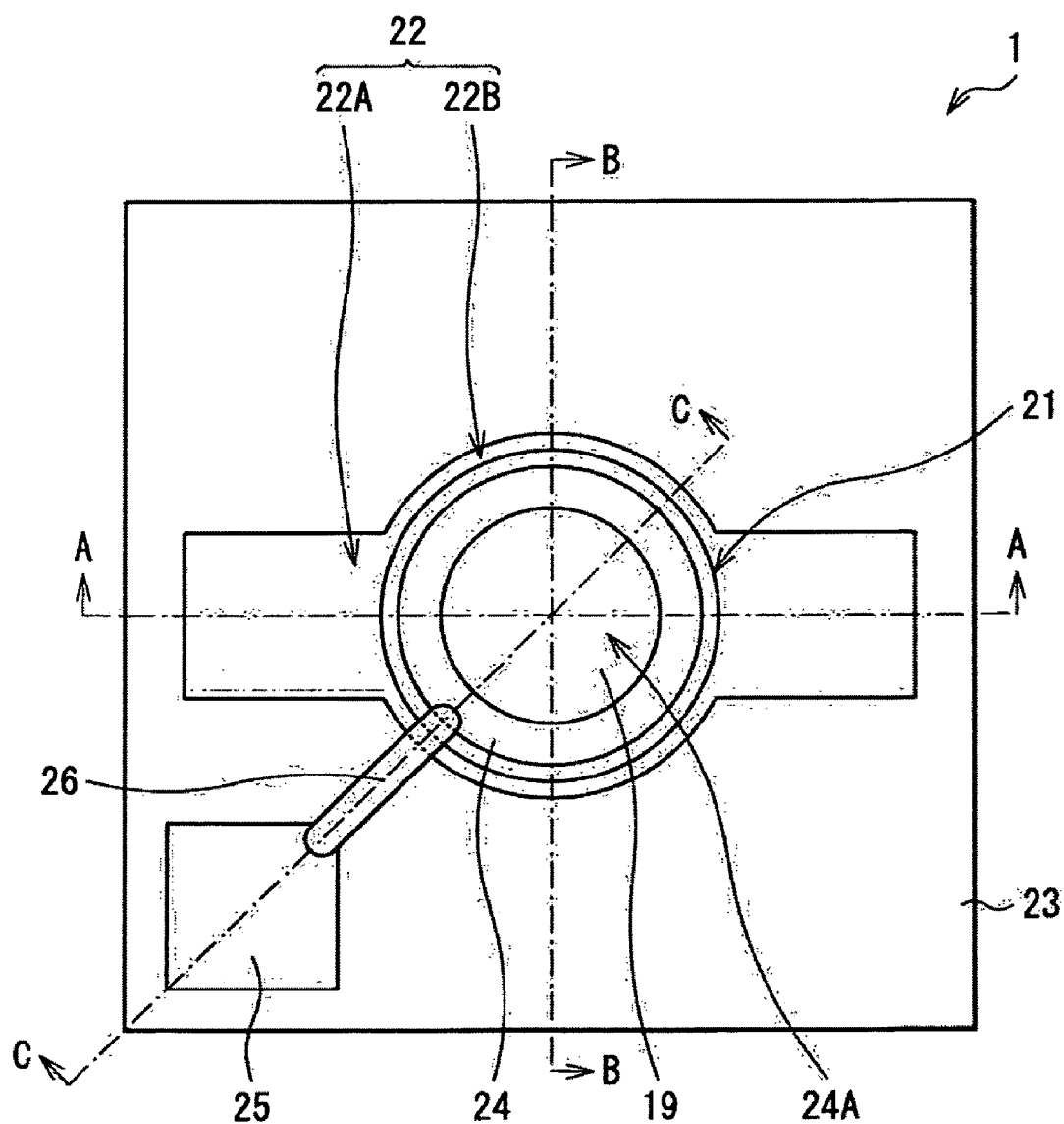
FIG. 1 is a top view of a laser diode according to a first embodiment of the invention.
Figure 2:
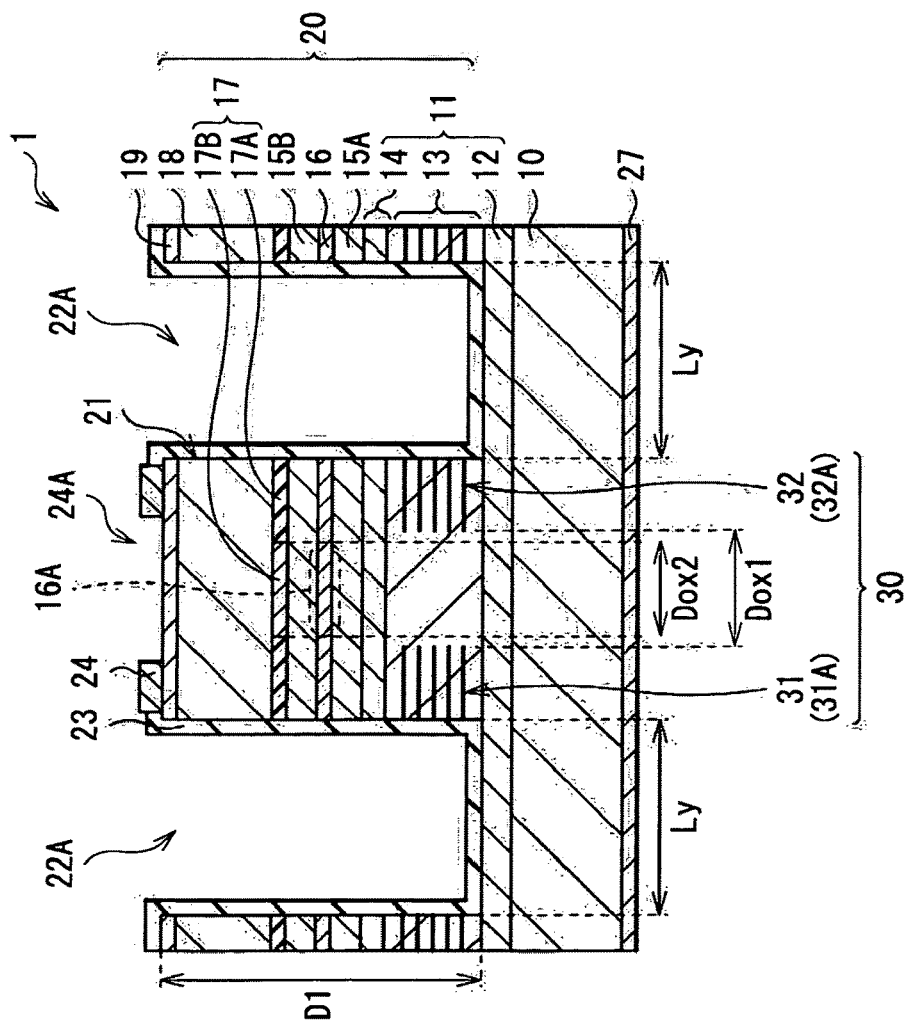
FIG. 2 is a sectional view of the laser diode taken along an arrow direction A-A of FIG. 1.
Figure 3:
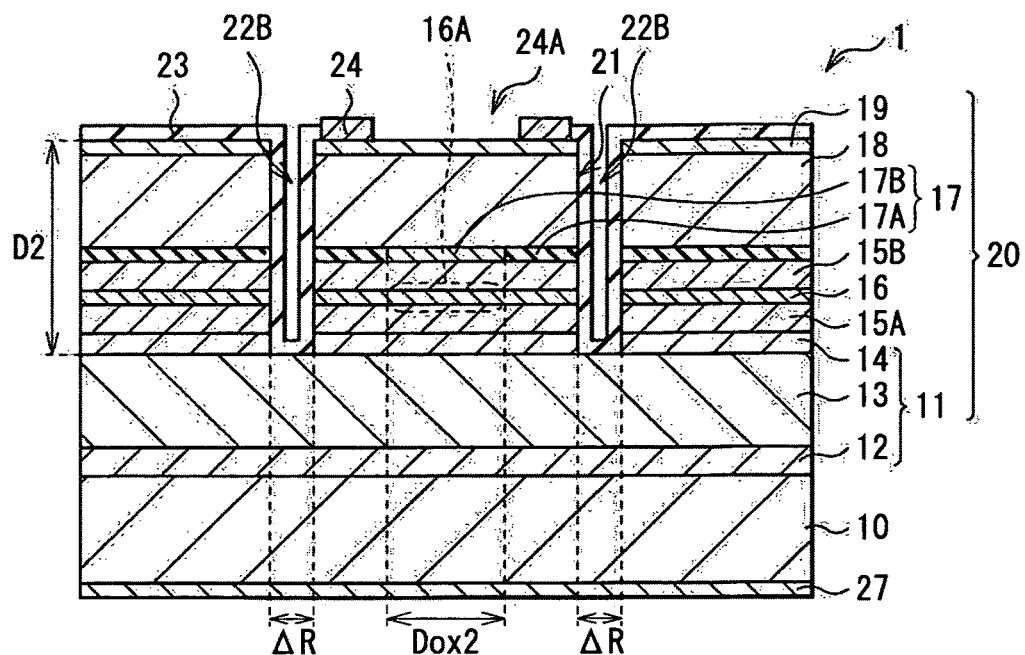
FIG. 3 is a sectional view of the laser diode taken along an arrow direction B-B of FIG. 1.
Figure 4:
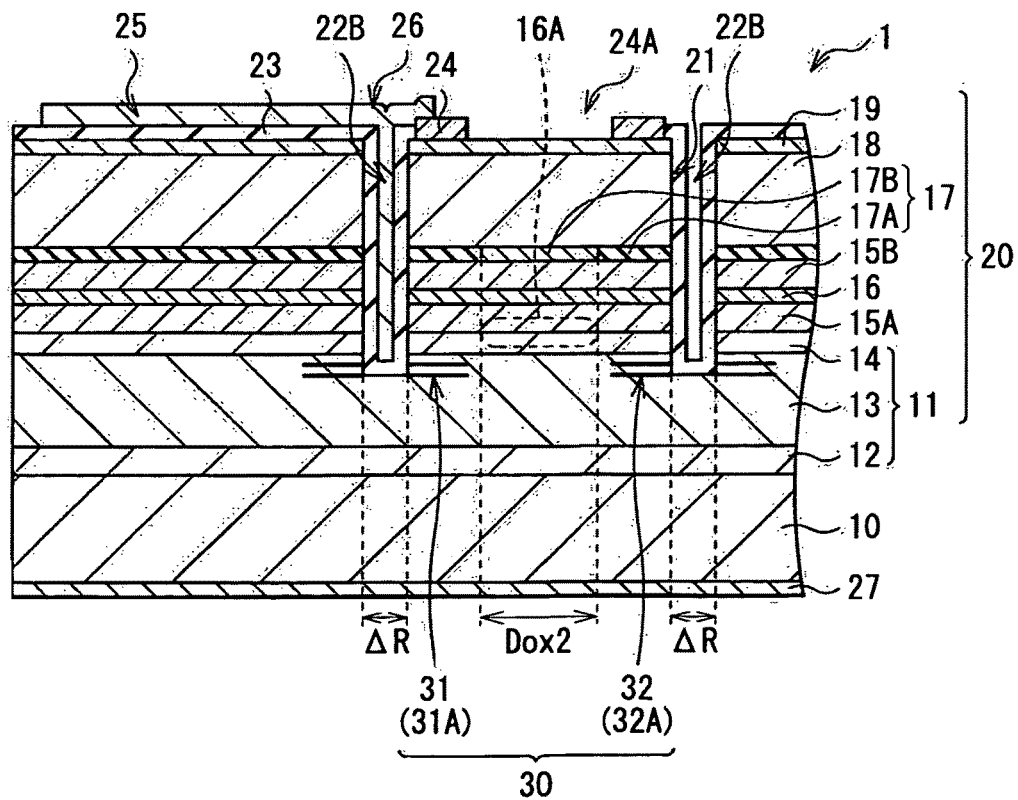
FIG. 4 is a sectional view of the laser diode taken along an arrow direction C-C of FIG. 1.
Figure 5:
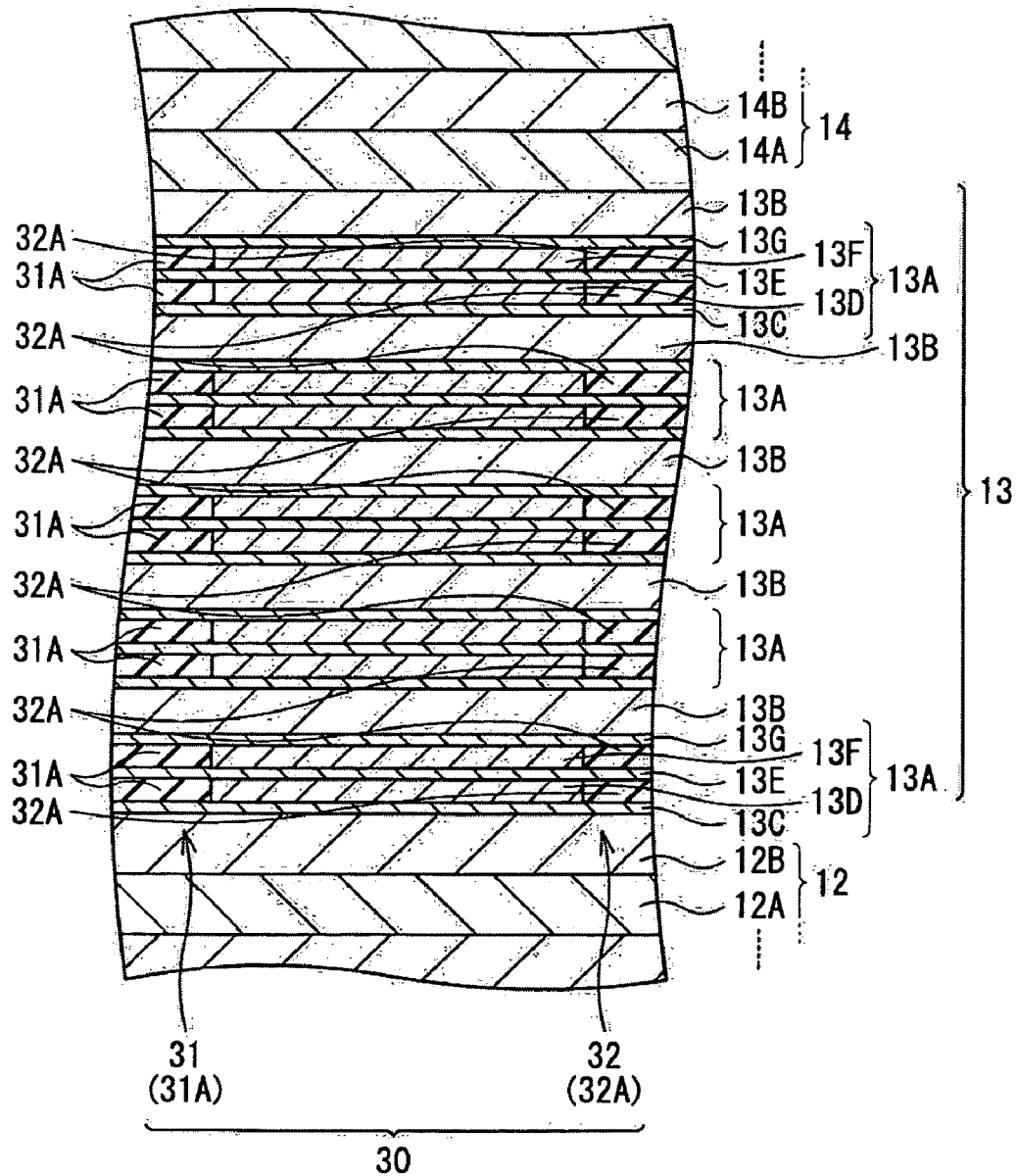
FIG. 5 is an enlarged sectional view of an example of a lower DBR mirror layer in FIG. 2.
Figure 6:
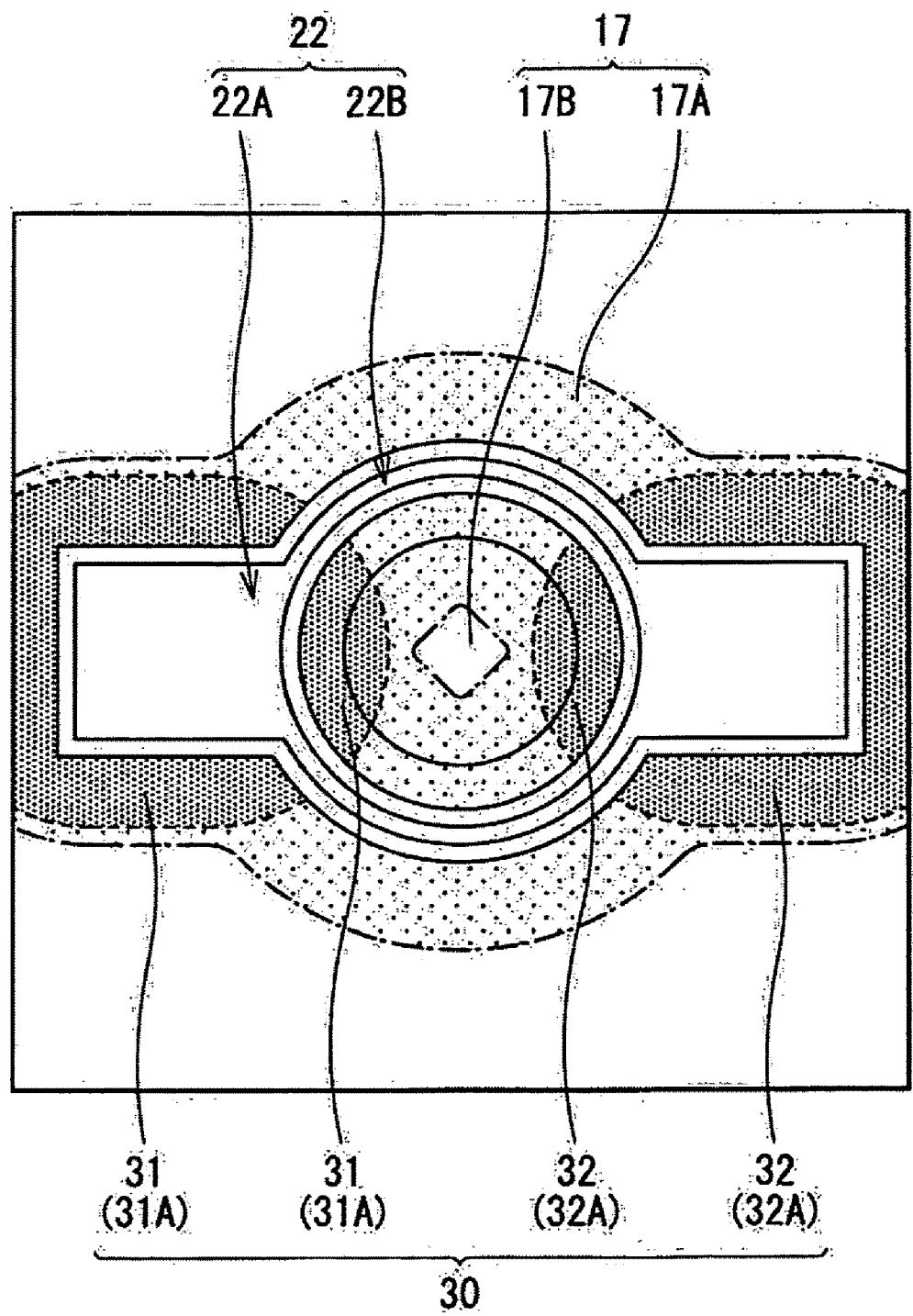
FIG. 6 is a plan view of an oxidation section and a current narrowing layer in FIG. 2.

FIG. 1 illustrates a top view of a laser diode 1 according to a first embodiment of the invention. FIGS. 2, 3 and 4 illustrate sectional views of the laser diode 1 taken along arrow directions A-A, B-B and C-C of FIG. 1, respectively. FIG. 5 illustrates a sectional view of a lower DBR mirror layer 11 (which will be described later) in FIG. 2. FIG. 6 illustrates a top view of distributions (shapes) of a current narrowing layer 17 and an oxidation section 30 (which will be described later) while seeing through the surface-emitting laser diode 1 in FIG. 1.

The laser diode 1 is of a surface-emitting type, and includes a laminate configuration 20 on one surface of a substrate 10. The laminate configuration 20 includes the lower DBR mirror layer 11 (a lower multilayer reflecting mirror), a lower spacer layer 15A, an active layer 16, an upper spacer layer 15B, the current narrowing layer 17, an upper DBR mirror layer 18 (an upper multilayer reflecting mirror) and a contact layer 19 in order from a side closer to the substrate 10. In the laminate configuration 20, for example, a mesa section 21 and a groove section 22 surrounding the mesa section 21 are formed in a upper part of the lower DBR mirror layer 11, the lower spacer layer 15A, the active layer 16, the upper spacer layer 15B, the current narrowing layer 17, the upper DBR mirror layer 18 and the contact layer 19. The mesa section 21 has, for example, a columnar shape with a width of approximately 10 μm to 30 μm.

A protective film 23 is formed on an edge part of a top surface of the mesa section 21, an inner surface of the groove section 22, and a surface of the contact layer 19 except for a part formed on the mesa section 21. A ring-shaped upper electrode 24 is formed on the surface of the contact layer 19.

The upper electrode 24 includes a light emission opening 24A in a region corresponding to a current injection region 17B. An upper electrode pad 25 is formed on a surface of a part away from the mesa section 21 of the protective film 23. Moreover, as illustrated in FIGS. 1 and 4, a connection section 26 is formed on a surface of a part including the groove 22B of the protective film 23. The upper electrode 24 and the upper electrode pad 25 are electrically connected to each other through the connection section 26. Moreover, a lower electrode 27 is formed on a back surface of the substrate 10.

The groove section 22 is a ring-shaped groove having a nonuniform width, and has a nonuniform depth according to (in proportion to) the width of the groove. More specifically, a pair of grooves 22A with a width Ly in a radical direction and a width Lx in a circumferential direction are arranged in a part corresponding to one axis (a line A-A of FIG. 1) parallel to a laminate surface and passing through a central part of the mesa section 21, and a pair of grooves 22B with a width ΔR in a radical direction are arranged in communication with the grooves 22A. The grooves 22A each have a depth D1 reaching a second lower DBR mirror layer 13 (which will be described later) and not reaching a first lower DBR mirror layer 12 (which will be described later) in the lower DBR mirror layer 11. On the other hand, the grooves 22B each have a depth D2 not reaching the second lower DBR mirror layer 13. In other words, the depth D2 of the groove 22B is smaller than the depth D1 of the groove 22A, and the height of the mesa section 21 is nonuniform corresponding to the depth of the groove section 22 accordingly, and the layer configuration exposed to a side surface of the mesa section 21 varies corresponding to the depth of the groove section 22. In addition, in FIG. 3, the case where the grooves 22B reach a third lower DBR mirror layer 13 (which will be described later) of the lower DBR mirror layer 11 is exemplified.

The widths Lx and Ly of the groove 22A are preferably large enough to prevent an etching rate which will be described later from being slowed down, and preferably 5 μm or over. Moreover, the width ΔR of the groove 22B is preferably smaller than the widths Lx and Ly, and is preferably large enough for the etching rate of the grooves 22B to become slower than that of the groove 22A by a loading effect which will be described later. The width ΔR of the groove 22B is preferably within a range from 1 μm to 3 μm both inclusive, and more preferably within a range from 1 μm to 2 μm both inclusive.

The substrate 10 is, for example, an n-type GaAs substrate, and the GaAs substrate is preferably, for example, a (100) plane substrate, but the GaAs substrate may be a special substrate such as an (n11) plane substrate (n is an integer).

The lower DBR mirror layer 11 is formed by laminating a plurality of pairs of a low refractive index layer and a high refractive index layer. The low refractive index layers and the high refractive index layers each include, for example, an n-type impurity, aluminum (Al), gallium (Ga) and arsenic (As). Examples of the n-type impurity include silicon (Si), selenium (Se) and the like. Moreover, as illustrated in FIGS. 2 to 5, the lower DBR mirror layer 11 has a configuration in which a first lower DBR mirror layer 12 (a first multilayer film) a second lower DBR mirror layer 13 (a second multilayer film) and a third lower DBR mirror layer (a third multilayer film) are laminated in order from a side closer to the substrate 10.

The first lower DBR mirror layer 12 is also formed by laminating a plurality of pairs of a low refractive index layer 12A and a high refractive index layer 12B. The low refractive index layer 12A is made of, for example, n-type $Al_{x1}Ga_{1-x1}As$ with an optical thickness (an optical distance in a thickness direction) of $\lambda/4$ ($\lambda$ is an oscillation wavelength), and the high refractive index layer 12B is made of, for example, n-type $Al_{x2}Ga_{1-x2}As$ with an optical thickness of $\lambda/4$.

The second lower DBR mirror layer 13 is formed by laminating a plurality of pairs of a low refractive index layer 13A and a high refractive index layer 13B. The low refractive index layer 13A has, for example, an optical thickness $L_1$ of $\lambda/4$ or over (($L_1 \geqq \lambda/4$), and has a multilayer configuration including a refractive index layer which is relatively resistant to oxidation and a plurality of refractive index layers which are relatively susceptible to oxidation. More specifically, the low refractive index layer 13A includes a first refractive index layer 13C made of n-type $Al_{x3}Ga_{1-x3}As$, a second refractive index layer 13D made of n-type $Al_{x4}Ga_{1-x4}As$, a third refractive index layer 13E made of n-type $Al_{x5}Ga_{1-x5}As$, a fourth refractive index layer 13F made of n-type $Al_{x6}Ga_{1-x6}As$ and a fifth refractive index layer 13G made of n-type $Al_{x7}Ga_{1-x7}As$ in order from a side closer to the substrate 10. In this case, the second refractive index layer 13D and the fourth refractive index layer 13F correspond to refractive index layers relatively susceptible to oxidation. The high refractive index layer 13B has, for example, an optical thickness $L_2$ of $\lambda/4$ or less, and is made of n-type $Al_{x8}Ga_{1-x8}As$.

The third lower DBR mirror layer 14 is formed by laminating a plurality of pairs of a low refractive index layer 14A and a high refractive index layer 14B. The low refractive index layer 14A is made of, for example, n-type $Al_{x9}Ga_{1-x9}As$ with an optical thickness of $\lambda/4$, and the high refractive index layer 14B is made of n-type $Al_{x10}Ga_{1-x10}As$ with an optical thickness of $\lambda/4$.

Values x1 to x10 of Al composition in the lower DBR mirror layer 11 satisfy a mathematical formula represented by a formula (1). Thereby, the low refractive index layer 13A of the second lower DBR mirror layer 13 is more susceptible to oxidation than the low refractive index layer 12A of the first lower DBR mirror layer 12 and the low refractive index layer 14A of the third lower DBR mirror layer 14, and is as resistant to oxidation as the current narrowing layer 17 which will be described layer or more resistant to oxidation than the current narrowing layer 17.

$$1 \geqq (x4, x6, x13) > (x1, x3, x5, x7, x9, x14) > 0.8 > (x2, x8, x10) \geqq 0 \quad (1)$$

In the formula (1), x13 is a value of Al composition included in a material forming the current narrowing layer 17, and x13 is a value of Al composition included in a material forming the low refractive index layer of the upper DBR mirror layer 18. Moreover, (x4, x6, x13) means x4, x6 or x13, and (x1, x3, x5, x7, x9, x14) means x1, x3, x5, x7, x9 or x14. Further, (x2, x8, x10) means x2, x8 or x10. In addition, 0.8 corresponds to a boundary between the refractive index of the low refractive index layer and the refractive index of the high refractive index layer.

In the second lower DBR mirror layer 13, the optical thickness $L_1$ of the low refractive index layer 13A may be larger than $\lambda/4$. In other words, the optical thickness $L_1$ of the low refractive index layer 13A may satisfy $\lambda/4 \leqq L_1$. In this case, the optical thickness $L_1$ satisfies $\lambda/4 \leqq L_1 \leqq 1.4 \times (\lambda/4)$, and the optical thickness $L_2$ of one of the high refractive index layers 13B adjacent to the low refractive index layer 13A preferably satisfies $0.6 \times (\lambda/4) \leqq L_2 \leqq \lambda/4$, because when the optical thickness $L_1$ of the low refractive index layer 13A is $1.4 \times (\lambda/4)$ or less, an increase in a threshold current is limited to smaller than 10%. More specifically, when the optical thickness $L_1$ of the low refractive index layer 13A is larger than $1.4 \times (\lambda/4)$, the threshold current easily increases by 10% or over, and when the optical thickness $L_1$ is $1.5 \times (\lambda/4)$ or over, the low refractive index layer 13 is resistant to oscillation. Moreover, the optical thickness $L_2$ of one of the high refractive index layers 13B adjacent to the low refractive index layer 13A is preferably within the above-described range, because the optical thickness $L_2$ of the high refractive index layer 13B paired with the low refractive index layer 13A is allowed to be reduced by an increase in the optical thickness $L_1$ of the low refractive index layer 13A, thereby the optical thickness of each pair is kept to $\lambda/2$. Further, the optical thickness $L_1$ of the low refractive index layer 13A preferably satisfies $\lambda/4 \leq L_1 \leq 1.2 \times (\lambda/4)$, and the optical thickness $L_2$ of one of the high refractive index layers 13B adjacent to the low refractive index layer 13A preferably satisfies $0.8 \times (\lambda/4) \leq L_2 \leq \lambda/4$, because approximately three refractive index layers relatively susceptible to oxidation are formable in the low refractive index layer 13A. Moreover, the total optical thickness $L_1 + L_2$ of the optical thicknesses $L_1$ and $L_2$ is preferably $\lambda/2$ while the optical thicknesses $L_1$ and $L_2$ are within the above-described ranges, respectively. Further, the optical thickness $L_1$ of the low refractive index layer 13A is preferably larger than $\lambda/4$ within the above-described range. Thereby, the physical thickness of the low refractive index layer 13A is allowed to be increased, and by an increase in the low refractive index layer 13, the number of the refractive index layers which include highly concentrated Al and are relatively susceptible to oxidation are allowed to be increased, or the thickness of each of the refractive index layers is allowed to be increased. Therefore, the thermal conductivity of the lower DBR mirror layer 11 is improved, and the heat radiation of the laser diode 1 is improved. In addition, also in the first lower DBR mirror layer 12, for example, as long as the optical thickness of each pair of the low refractive index layer 12A and the high refractive index layer 12B is $\lambda/2$, the optical thickness of each of the low refractive index layer 12A and the high refractive index layer 12B is not necessarily $\lambda/4$. The same holds true in the third lower DBR mirror layer 14.

Thus, in the lower DBR mirror layer 11, to satisfy the mathematical formula represented by the formula (1), the first lower DBR mirror layer 12 and the third lower DBR mirror layer 14 are relatively resistant to oxidation, and the second lower DBR mirror layer 13 is relatively susceptible to oxidation. An oxidation section 30 is formed in a region around a region corresponding to a central region (a light emission region 16A which will be described later) of the mesa section 21 and a region surrounding the groove 22 in each of the low refractive index layers 13A of the second lower DBR mirror layer 13. The oxidation section 30 is formed by oxidizing a part of a region except for a central region (a region corresponding to the light emission region 16A) of the low refractive index layer 13A. The oxidation section 30 includes a pair of oxidation sections 31 and 32 (a first oxidation section and a second oxidation section). These oxidation sections 31 and 32 are arranged at a distance Dox1 from each other so as to face each other with a region corresponding to the light emission region 16A of the second lower DBR mirror layer 13, and are formed corresponding to the groove 22A with a larger depth in the groove section 22. The region corresponding to the light emission region 16A is also a region corresponding to the current injection region 17B which will be described later. In other words, the oxidation section 30 (31 and 32) is nonuniformly distributed in a direction rotating around a central axis of the mesa section 21 in a region around the region corresponding to the current injection region 17B of the second lower DBR mirror layer 13, and generates a nonuniform stress according to the distribution in the active layer 16.

The length in a radial direction of the current injection region 17B is Dox2, and the distance Dox1 is preferably larger than Dox2, and to reduce high-order transverse mode oscillation, the distance Dox1 is preferably within a range of Dox2+1 μm to 15 μm both inclusive. Moreover, to further reduce high-order transverse mode oscillation, the distance Dox1 is preferably within a range of Dox2+1 μm to 10 μm both inclusive. Further, to reduce a loss of light emission efficiency by the oxidation sections 31 and 32, the distance Dox1 is preferably larger than Dox2, and more preferably equal to or larger than 1.1×Dox2.

The oxidation section 31 of each of the low refractive index layers 13A includes a plurality of oxidation layers 31A (in this case, two oxidation layers 31A), and the oxidation section 32 of each of the low refractive index layers 13A includes a plurality of oxidation layers 32A (in this case, two oxidation layers 32A). In other words, the second lower DBR mirror layer 13 includes a plurality of pairs of the low refractive index layer 13A and the high refractive index layer 13B, and a plurality of oxidation layers 31A and 32A are nonuniformly distributed in a region except for the central region (the region corresponding to the current injection region 17B) of each of the low refractive index layers 13A. The low refractive index layers 13A each include a plurality of oxidation layers 31A and 32A, so a nonuniform stress is allowed to be more strongly generated in the active layer 16. In addition, the low refractive index layers 13A of the second lower DBR mirror layer 13 are not exposed to a part facing the groove 22B of a side surface of the mesa section 21. Therefore, the oxidation layers 31A and 32A are not distributed in a part except for a part adjacent to the groove 22B in a part facing the groove 22B of the side surface of the mesa section 21.

The oxidation layers 31A and 32A each include $Al_2O_3$ (aluminum oxide). As will be described later, the oxidation layers 31A and 32A are obtained by oxidizing highly concentrated Al included in the second refractive index layer 13D and the fourth refractive index layer 13F of the low refractive index layer 13A from side surfaces of the mesa section 21 and the groove section 22. The thickness of each of the oxidation layers 31A and 32A is preferably smaller than the thickness of the current narrowing layer 17 which will be described later, because even if the value of Al composition of the refractive index layer relatively susceptible to oxidation in the low refractive index layer 13A is substantially equal to the value of Al composition of the current narrowing layer 17, when the thickness of each of the oxidation layers 31A and 31A is smaller than the current narrowing layer 17, the above-described preferable range of the distance Dox1 is easily secured.

Moreover, the total number of pairs of the low refractive index layer and the high refractive index layer in the lower DBR mirror layer 11 is preferably 40 pairs or over, because high facet reflectivity is obtained. In the case where the number of the pairs is 40 pairs or over, it is preferable that the number of pairs of the low refractive index layer 12A and the high refractive index layer 12B in the first lower DBR mirror layer 12 is 36 pairs or over, and the number of pairs of the low refractive index layer 13A and the high refractive index layer 13B in the second lower DBR mirror layer 13 is 2 pairs or over, and the number of pairs of the low refractive index layer 14A and the high refractive index layer 14B in the third lower DBR mirror layer 14 is 2 pairs or over. Thereby, in the third lower DBR mirror layer 14, a refractive index is favorably adjusted, and the oxidation section 30 distributed in the second lower DBR mirror layer 13 is allowed to favorably generate a nonuniform stress in the active layer 16. Specifically, the total number of pairs of the low refractive index layer and the high refractive index layer is preferably 45 pairs or over, and in this case, it is preferable that the number of pairs in the first lower DBR mirror layer 12 is 39 pairs or over, and the number of the pairs in the second lower DBR mirror layer 13 is 3 pairs or over, and the number of pairs in the third lower DBR mirror layer 14 is 3 pairs or over. Thereby, high facet reflectivity is obtained as a whole, and the oxidation section 30 is allowed to more strongly generate a nonuniform stress in the active layer 16. Moreover, the number of the pairs in the third lower DBR mirror layer 14 is 3 pairs or over, so the refractive index is adjusted more favorably, and even if the depths of the grooves 22A and 22B vary among individual laser diodes 1, variations in the stress (strength and distribution) generated in the active layer 16 are allowed to be reduced. Moreover, the number of pairs of the low refractive index layer 14A and the high refractive index layer 14B in the third lower DBR mirror layer 14 is preferably smaller within the above-described range, because the closer a distribution region of the oxidation section 30 is to the active layer 16, more strongly a nonuniform stress is allowed to be generated in the active layer 16.

The lower spacer layer 15A is made of, for example, $Al_{x11}Ga_{1-x11}As$ ($0<x11<1$). The active layer 16 is made of, for example, a GaAs-based material. In the active layer 16, a region facing the current injection region 17B which will be described later is the light emission region 16A, and a central region (a light emission central region) of the light emission region 16A is a region where fundamental transverse mode oscillation mainly occurs, and an edge region surrounding the light emission central region of the light emission region 16A is a region where high-order transverse mode oscillation mainly occurs. The upper spacer layer 15B is made of, for example, $Al_{x12}GA_{1-x12}As$ ($0<x12<1$). The lower spacer layer 15A, the active layer 16 and the upper spacer layer 15B preferably do not include any impurity, but may include a p-type or n-type impurity. Examples of the p-type impurity include carbon (C), zinc (Zn), magnesium (Mg), beryllium (Be) and the like.

The current narrowing layer 17 includes a current narrowing region 17A in an edge region thereof and the current injection region 17B in a central region thereof. The current injection region 17B is made of, for example, p-type $Al_{x13}Ga_{1-x13}As$ ($0<x13\leq1$). The current narrowing region 17A includes $Al_2O_3$ (aluminum oxide), and as will be described later, the current narrowing region 17A is obtained by oxidizing highly concentrated Al included in an $Al_{x13}Ga_{1-x13}As$ layer 17D from the side surface of the mesa section 21.

The current injection region 17B has a quadrilateral (for example, rhombic) shape having diagonal lines in a [011] direction and a [01-1] direction, and has in-plane anisotropy. The current narrowing region 17A has a quadrilateral shape having diagonal lines in the [011] direction and the [01-1] direction, because the oxidation rates of $Al_{x13}Ga_{1-x13}As$ in the [011] direction and the [01-1] direction are different from those in a [001] direction and a [010] direction which form an angle of 45° with these directions. In this case, the length Dox2 of the diagonal line of the current injection region 17B is preferably within a range from 3 μm to 8 μm both inclusive in the case where high-order transverse mode oscillation is desired to be suppressed. Moreover, in the case where the high-order transverse mode oscillation is desired to be further suppressed, the length Dox2 is preferably within a range from 3 μm to 5 μm both inclusive.

The upper DBR mirror layer 18 is formed by laminating a plurality of pairs of a low refractive index layer and a high refractive index layer. The low refractive index layer is made of p-type $Al_{x14}Ga_{1-x14}As$ ($0<x14<1$) with an optical thickness of λ/4, and the high refractive index layer is made of p-type $Al_{x15}Ga_{1-x15}As$ ($0<x15<1$) with an optical thickness of λ/4. The contact layer 19 is made of, for example, p-type GaAs.

The protective film 23 is formed of, for example, an insulating material such as an oxide or a nitride. The protective film 23 is formed so as to be laid over an area from an edge part of the contact layer 19 to an inner surface of the groove section 22, and an area in proximity to the area. The upper electrode 24 and the upper electrode pad 25 each are formed by laminating, for example, a titanium (Ti) layer, a platinum (Pt) layer and a gold (Au) layer in this order, and are electrically connected to the contact layer 19. The connection section 26 is a section in which a plating layer is formed on a laminate configuration formed by laminating, for example, a Ti layer, a Pt layer and an Au layer in this order. The lower electrode 27 has a configuration in which a gold (Au)-germanium (Ge) alloy layer, a nickel (Ni) layer and a gold (Au) layer are laminated in order from a side closer to the substrate 10, and is electrically connected to the substrate 10.

Method of Manufacturing Laser Diode 1

Figure 7A:
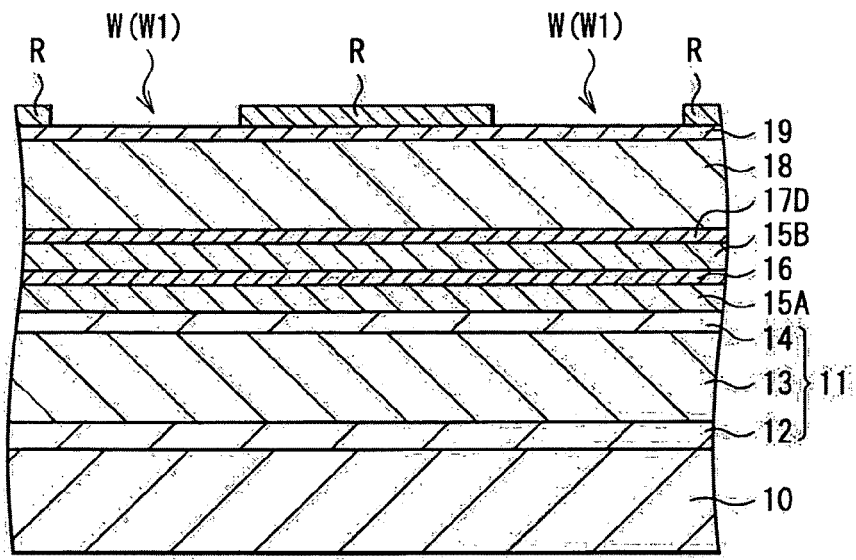
FIGS. 7A and 7B are a sectional view and a top view for describing a step of manufacturing the laser diode in FIG. 1, respectively.
Figure 7B:
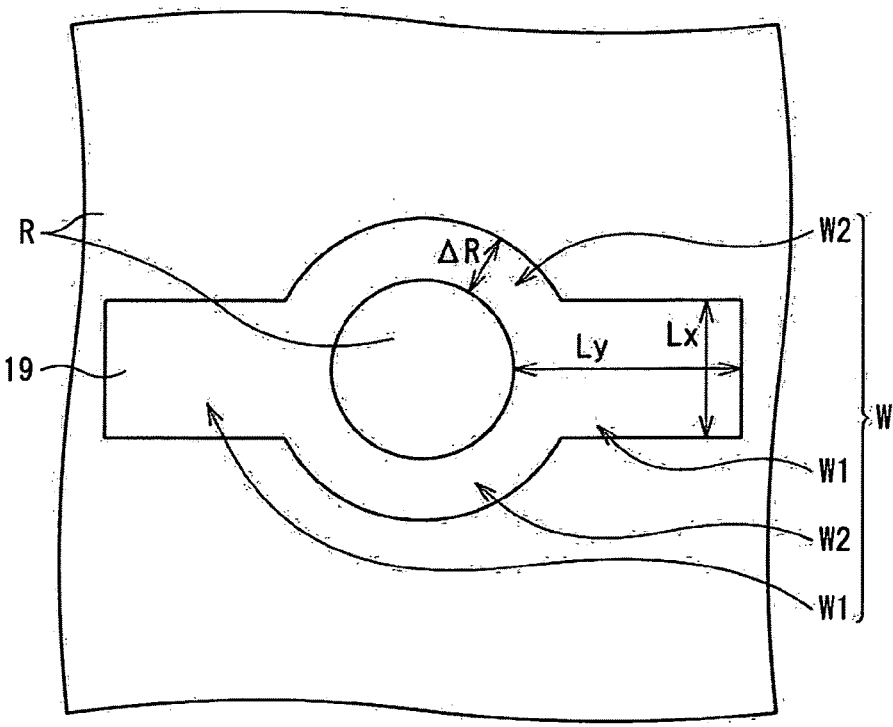
Figure 8A:
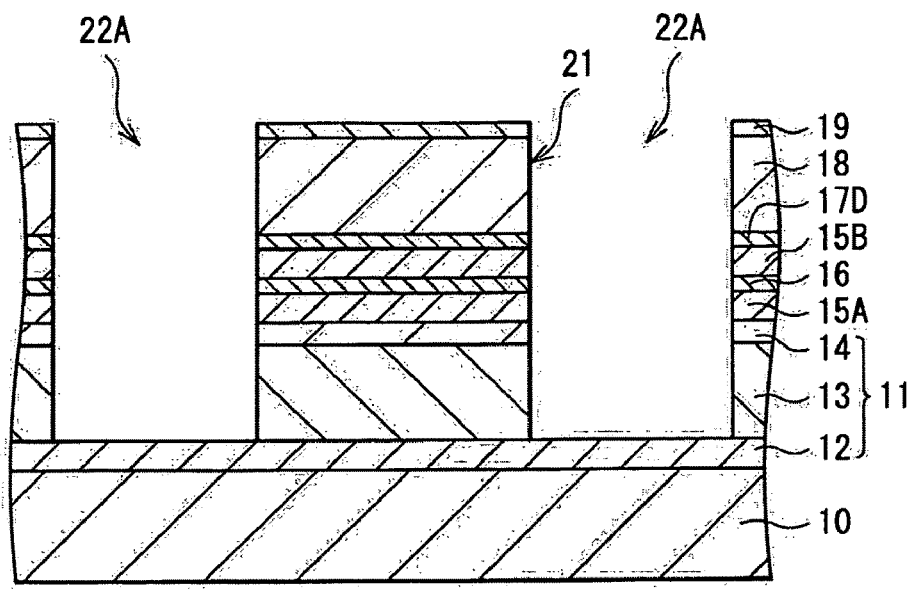
FIGS. 8A and 8B are sectional views for describing a step following FIGS. 7A and 7B.
Figure 8B:
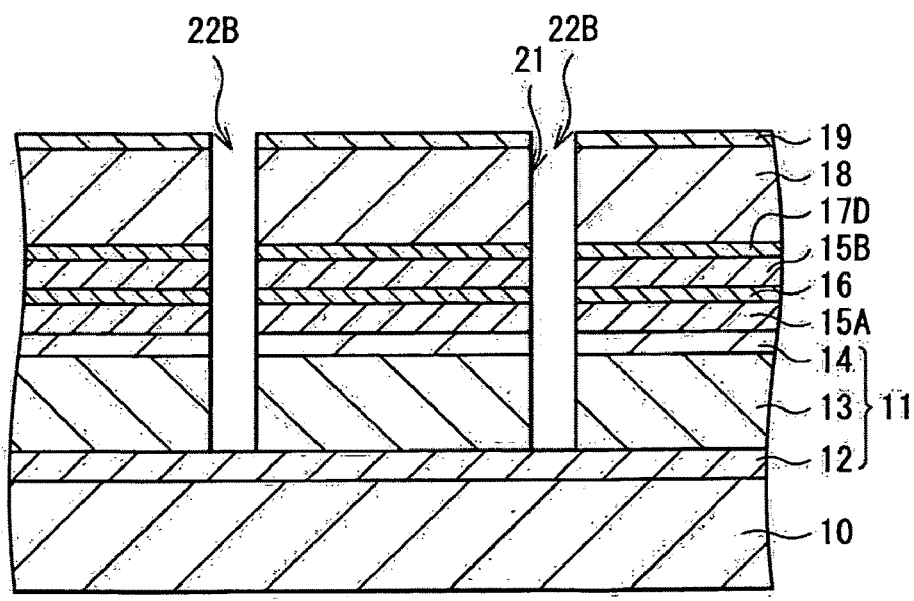
Figure 9A:
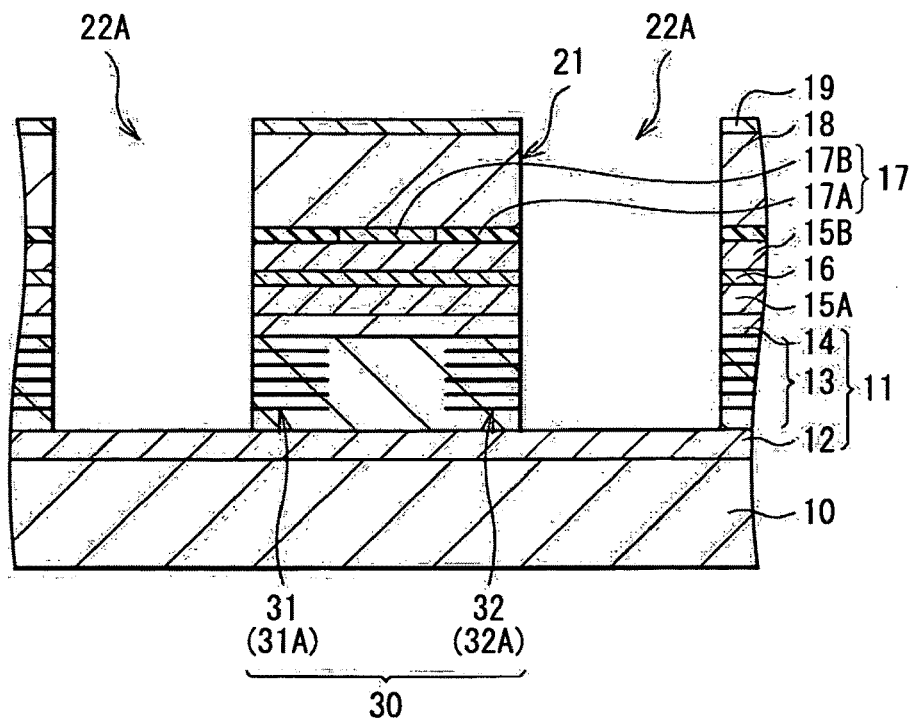
FIGS. 9A and 9B are sectional views for describing a step following FIGS. 8A and 8B.
Figure 9B:
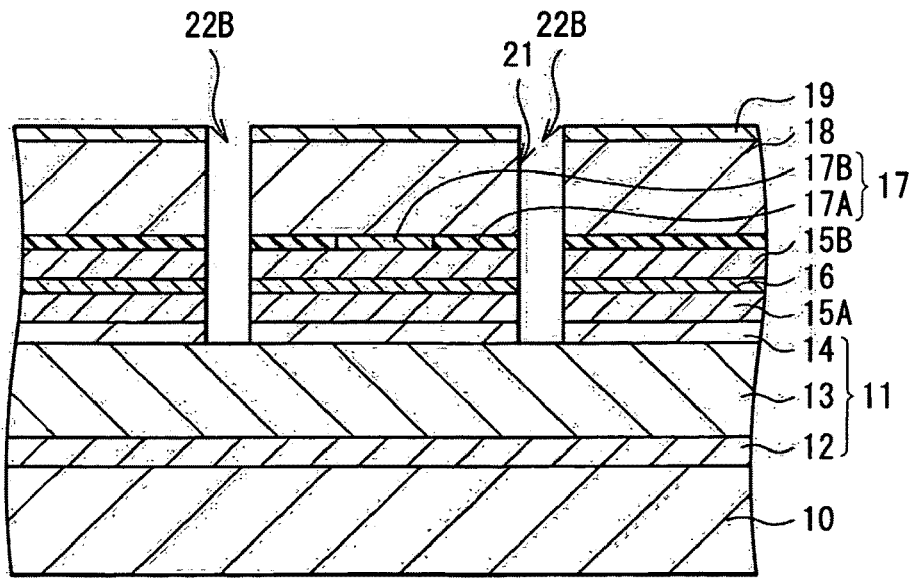

Next, a method of manufacturing the laser diode 1 will be described below referring to FIGS. 7A and 7B to FIGS. 9A and 9B. FIGS. 7A and 7B to FIGS. 9A and 9B illustrate steps of the method of manufacturing the laser diode 1 in order. FIGS. 7A, 8A and 9A illustrate sectional views of a device in a manufacturing process taken along the same direction as the arrow direction A-A of FIG. 1, FIG. 7B illustrates a top view of the device in FIG. 7A, and FIGS. 8B and 9B illustrate sectional views of the device in a manufacturing process taken along the same direction as an arrow direction B-B of FIG. 1. The laser diode 1 is manufacturable by, for example, the following steps.

In this case, a compound semiconductor layer on the substrate 10 made of GaAs is formed by, for example, a MOCVD (Metal Organic. Chemical Vapor Deposition) method. At this time, as a material of a Group III-V compound semiconductor, for example, trimethyl aluminum (TMA), trimethyl gallium (TMG), trimethyl indium (TMIn) and arsine ($AsH_3$) are used, and as a material of a donor impurity, for example, $H_2Se$ is used, and as a material of acceptor impurity, for example, dimethyl zinc (DMZ) is used.

First, the first lower DBR mirror layer 12, the second lower DBR mirror layer 13 and the third lower DBR mirror layer 14 are laminated in this order on the substrate 10 so as to form the lower DBR mirror layer 11 with the above-described configuration. Next, the lower spacer layer 15A, the active layer 16, the upper spacer layer 15B, the $Al_{x13}Ga_{1-x13}As$ layer 17D, the upper DBR mirror layer 18 and the contact layer 19 are laminated in this order on the lower DBR mirror layer 11. Thereby, the laminate configuration 20 is formed. After that, a resist layer R having a ring-shaped opening W with a nonuniform width is formed on a surface of the contact layer 19 (refer to FIGS. 7A and 7B). More specifically, the opening W includes a pair of arc-shaped openings W1 with a width Ly in a radial direction and a width Lx in a circumferential direction and a pair of arc-shaped openings W2 with a width ΔR in a radial direction in communication with the pair of openings W1.

Next, etching is performed from the contact layer 19 by, for example, a reactive ion etching (RIE) method using the resist layer R as a mask. Then, a loading effect is generated by the nonuniform width of the opening W, thereby the etching rate in the opening W2 with a small width is slower than that in the opening W1 with a large width. As a result, the groove 22A with a depth D1 is formed corresponding to the opening W1, and the groove 22B with a depth D2 is formed corresponding to the opening W2 (refer to FIGS. 8A and 8B). When the groove 22A and the groove 22B are formed in such a manner, the mesa section 21 is formed in a part surrounded by the groove 22A and the groove 22B.

Next, an oxidation process is performed at high temperature in a water vapor atmosphere so as to selectively oxidize Al of the second refractive index layer 13D and the fourth refractive index layer 13F in the low refractive index layer 13A and Al of the $Al_{x13}Ga_{1-x13}As$ layer 17D from the inside of the groove section 22. Thereby, regions around the groove section 22 of the low refractive index layer 13A and the $Al_{x13}Ga_{1-x13}As$ layer 17D become insulating layers (aluminum oxide) so as to form a plurality of oxidation layers 31A and 32A and the current narrowing region 17A. In other words, a pair of oxidation sections 31 and 32 facing each other with a region corresponding to the light emission region 16A in between are formed in a region around a region corresponding to the light emission region 16A of the active layer 16 and a region surrounding the groove 22A in each low refractive index layer 13A. Moreover, the current narrowing region 17A having an opening corresponding to the light emission region 16A is formed, and the opening becomes the current injection region 17B (refer to FIGS. 9A and 9B). A stress according to the distribution of the oxidation section 30 is generated in the active layer 16 by shrinkage of the oxidation section 30 (the oxidation sections 31 and 32) formed by oxidation at this time.

When the loading effect is generated through the use of the resist layer R having the ring-shaped opening W with a nonuniform width in such a manner, the groove section 22 with a nonuniform width is allowed to be formed by one etching process. Moreover, when the oxidation process is performed through the use of the groove section 22 with a nonuniform depth, the oxidation section 30 nonuniformly distributed in a direction rotating around the central axis of the mesa section 21 is allowed to be easily formed.

Next, an insulating material is deposited all over the surfaces of the mesa section 21, the groove section 22 and a region around the groove section 22 by, for example, a CVD (Chemical Vapor Deposition) method, and then a part corresponding to a top surface of the mesa section 21 of the insulating material deposited by etching is selectively removed. Thereby, the contact layer 19 on the top surface of the mesa section 21 is exposed. Then, a metal material is laminated all over the surface by, for example, a vacuum deposition method. After that, for example, the laminated metal material is selectively etched so as to form the upper electrode 24 having the light emission opening 24A on the top surface of the mesa section 21 (a part where the contact layer 19 is exposed) and the upper electrode pad 25 in a position away from the mesa section 21. Moreover, the connection section 26 is formed by plating to electrically connect the upper electrode 24 and the upper electrode pad 25 to each other. Further the back surface of the substrate 10 is polished as necessary to adjust the thickness of the substrate 10, and then the lower electrode 27 is formed on the back surface of the substrate 10. Finally, the substrate 10 is divided into small chips by dicing. Thereby, the surface-emitting laser diode 1 is manufactured.

In the above-described manufacturing steps, when the depth D1 of the groove 22A is changed by changing the etching time, the number of the low refractive index layers exposed to the inner surface of the groove 22A in the lower DBR mirror layer 11 is changed. More specifically, when the depth D1 of the groove 22A is increased with an increase in the etching time, the groove 22A reaches the first lower DBR mirror layer 12 so that in addition to the low refractive index layers 13A of the second lower DBR mirror layer 13, the low refractive index layers 12A are also exposed. However, the Al composition of each low refractive index layer 12A satisfies the mathematical formula represented by the formula (1), so the low refractive index layer 12A becomes resistant to oxidation by an oxidation step after that. Moreover, in this case, the depth D2 of the groove 22B is changed depending on the etching time, but in the case where the depth D2 is changed within the above-described range, the low refractive index layers 13A are not exposed to the inner surface of the groove 22B, so parts facing the groove 22B of the low refractive index layers 13A are hardly oxidized. Therefore, a stress in a direction in which the grooves 22B face each other is not generated in the active layer 16. On the other hand, when the depth D1 of the groove 22A is reduced with a decrease in the etching time, the number of the exposed low refractive index layers 13A is reduced, but a plurality of oxidation layers 31A and 32A are formed in the exposed low refractive index layers 13A by an oxidation step after that. Therefore, even if the depth D1 of the groove 22A is small, a stress in a direction in which the grooves 22A face each other is allowed to be generated in the active layer 16. When the depth D1 of the groove 22A is within a range of the thickness of the second lower DBR mirror layer 12, a stress in the direction in which the grooves 22A face each other is allowed to be set arbitrarily depending on the depth D1 of the groove 22A. Therefore, the magnitude of an anisotropic stress generated in the active layer 16 is allowed to be set freely.

Moreover, the thickness of each of a layer with a high Al composition (the second refractive index layer 13D and the fourth refractive index layer 13F) and a layer with a low Al composition (the first refractive index layer 13C, the third refractive index layer 13E and the fifth refractive index layer 13G) in the low refractive index layer 13A may be changed in a state in which the Al compositions of these layers are uniform. Thereby, the oxidation rate of the low refractive index layer 13A (the second refractive index layer 13D and the fourth refractive index layer 13F) is freely controllable. In this case, even if the thickness of the layer with a high Al composition is increased, for example, the values x1 to x10 of Al composition in the lower DBR mirror layer 11 satisfy the mathematical formula represented by the formula (1). Therefore, the layer with a high Al composition of the low refractive index layer 13A is more susceptible to oxidation than the low refractive index layers 12A and 14A, and is as susceptible or resistant to oxidation as the current narrowing layer 17 or more susceptible or resistant to oxidation than the current narrowing layer 17.

In addition, depending on oxidation conditions, for example, in the case where the value x13 of Al composition of the current narrowing layer 17 and the values x4 and x6 of Al composition of the second refractive index layer 13D and the fourth refractive index layer 13F each are 1, and the values x3, x5 and x7 of Al composition of the first refractive index layer 13C, the third refractive index layer 13E and the fifth refractive index layer 13G, and the value x14 of Al composition of the low refractive index layer of the upper DBR mirror layer 18 each are 0.9, the distance Dox1 may be within a range from Dox2+1 μm to 15 μm both inclusive.

Further, for example, the value of Al composition of the layer with a high Al composition in the low refractive index layer 13A may be equal to the value of Al composition of the current narrowing layer 17, and the value of Al composition of the layer with a low Al composition of the low refractive index layer 13A may be equal to the value of Al composition of the low refractive index layer of the upper DBR mirror layer 18. In this case, when the low refractive index layer 13A is formed, epitaxial growth conditions such as doping conditions and a gas flow rate used when manufacturing the current narrowing layer 17 or the upper DBR mirror layer 18 are usable, so the low refractive index layer 13A is manufacturable easily.

Functions and Effects

In the laser diode 1, when a predetermined voltage is applied between the lower electrode 27 and the upper electrode 24, a current is injected into the active layer 16 through the current injection region 17B in the current narrowing layer 17, thereby light is emitted by electron-hole recombination. The light is reflected by a pair of the lower DBR mirror layer 11 and the upper DBR mirror layer 18 to cause laser oscillation with a predetermined wavelength, and the light is emitted to outside as a laser beam.

In the laser diode 1 according to the embodiment, the oxidation section 30 is formed in the region around the region corresponding to the current injection region 17B of the second lower DBR mirror layer 13 in the lower DBR mirror layer 11, and the oxidation section 30 is nonuniformly distributed in a direction rotating around the central axis of the mesa section 21. Then, the oxidation section 30 includes a pair of oxidation sections 31 and 32 facing each other with the region facing the current injection region 17B in between, and has an anisotropic distribution in a direction where the grooves 22A face each other. The oxidation sections 31 and 32 are configured of a plurality of oxidation layers 31A and 32A arranged in the low refractive index layers 13A. In other words, a sufficient tension stress by the plurality of oxidation layers 31A and 32A is generated in the active layer 16, and in this case, an anisotropic tension stress according to the distribution of the plurality of oxidation layers 31A and 32A is generated in the direction where the grooves 22A face each other. As described above, the low refractive index layers 13A are not oxidized in the inner surface of the groove 22A, and a stress in the direction where the grooves 22B face each other is not generated in the active layer 16. Thereby, while a polarization component in a direction orthogonal to the direction of the tension stress is enhanced, a polarization component in a direction parallel to the direction of the tension stress is suppressed.

As described above, in the laser diode 1 according to the embodiment, the second lower DBR mirror layer 13 includes a plurality of oxidation layers 31A and 32A nonuniformly distributed in regions except for the central region (regions around the region corresponding to the current injection region 17B) of the low refractive index layers 13A. The plurality of oxidation layers 31A and 32A face each other with the region corresponding to the current injection region 17B in between. Thereby, the polarization direction of laser light is fixed and stabilized in one direction.

In a surface-emitting laser diode in related art, an oxidation region of a lower DBR mirror layer is nonuniformly distributed. The oxidation region is formed by oxidizing parts of low refractive index layers of the lower DBR mirror layer, and the oxidation region is included in each low refractive index layer as a single-layer oxidation layer. Therefore, a tension stress by the oxidation region is nonuniformly generated in an active layer, but the tension stress is not sufficient, so it is difficult to fix a polarization component of laser light in one direction. More specifically, variations in the tension stress nonuniformly generated in the active layer by the oxidation region easily occur among individual surface-emitting laser diodes so that some of the surface-emitting diodes have a high tension stress and the other have a low tension stress. In other words, polarization control by the oxidation region is not sufficient, so a surface-emitting laser diode in which the polarization direction of laser light is unstable may be formed. Therefore, it is difficult to obtain a laser diode with high yields in which the polarization direction of laser light is stabilized in one direction.

On the other hand, in the laser diode 1 according to the embodiment, the oxidation sections 31 and 32 are formed in each low refractive index layer 13A of the second lower DBR mirror layer 13 as a plurality of oxidation layers 31A and 31B. Thereby, polarization controllability is improved in individual laser diodes 1, so it is difficult to cause variations in the stability of the polarization direction of laser light, and yields are improved.

Moreover, in the embodiment, the substrate is not necessarily a special substrate such as an (n11) plane substrate (n is an integer), and may be a typical (100) plane substrate, so epitaxial growth conditions such as doping conditions and a gas flow rate of the typical (100) plane substrate are usable. Thereby, the laser diode 1 is manufacturable easily at low cost.

Further, in the embodiment, the lower DBR mirror layer 11 has a configuration in which the first lower DBR mirror layer 12, the second lower DBR mirror layer 13 and the third lower DBR mirror layer 14 are laminated in order from a side closer to the substrate 10. Thereby, even if the depth D1 of the groove 22A is increased, the numbers (the thicknesses) of the oxidation layers 31A and 32A included in the second lower DBR mirror layer 13 are not changed. Therefore, without precisely controlling the depth D1 of the groove 22A, a predetermined oxidation section 30 is allowed to be formed easily, and polarization is favorably controllable. On the other hand, when the depth D1 of the groove 22A is reduced, the numbers of the oxidation layers 31A and 32A are easily adjustable by the depth D1. Therefore, an anisotropic stress is adjusted depending on the numbers of the oxidation layers 31A and 32A, thereby polarization is controllable efficiently.

Moreover, in the embodiment, the lower DBR mirror layer 11 has the above-described configuration, so as long as the bottom surface of the groove 22B with a small depth is formed somewhere in the third lower DBR mirror layer 14, an influence is hardly exerted on the polarization controllability. Therefore, it is not necessary to control the depth of the groove 22B precisely in a manufacturing step, and even if the depth of the groove 22B varies, polarization controllability does not vary among individual laser diodes 1.

Further, in the embodiment, the values x4 and x6 of Al composition of the low refractive index layer 13A (the second refractive index layer 13D and the fourth refractive index layer 13F) in the second lower DBR mirror layer 13 are preferably equal to or substantially equal to the value x13 of Al composition of the current narrowing layer 17. Thereby, the reflectivity in the low refractive index layer 13A is higher than that of the low refractive index layers 12A and 14A in the first lower DBR mirror layer 12 and the third lower DBR mirror layer 14. Therefore, light leakage to the substrate 10 is allowed to reduced, so the output of light emitted from the upper DBR mirror layer 18 to outside is allowed to be increased. Further, when the value of Al composition of AlGaAs in the low refractive index layer 13 is increased, the thermal conductivity of the low refractive index layer 13A is increased, so heat radiation of the laser diode 1 is allowed to be improved.

Moreover, in the embodiment, the number of pairs of the low refractive index layer 13A and the high refractive index layer 13B in the second lower DBR mirror layer 13 is increased to allow an increase in the numbers (thicknesses) of the oxidation layers 31A and 32A, so an anisotropic stress is allowed to be increased. Thereby, it is not necessary to expand the oxidation section 30 to a region corresponding to the light emission region 16A to apply a large stress to the active layer 16. Therefore, there is little possibility that light output declines by the oxidation section 30, and high-power laser light is allowed to be emitted.

In other words, in the embodiment, the laser diode 1 in which the polarization direction of laser light is stabilized is manufacturable easily at low cost, and higher output is achievable.

Moreover, in the embodiment, as illustrated in FIGS. 1 to 4, the groove section 22 formed around the mesa section 21 has a depth to an extent to which the groove section 22 penetrates through at least the active layer 16, so a current path passing from the upper electrode 24, the upper electrode pad 25 and the connection section 26 to the active layer 16 exists only in the mesa section 21. Thereby, the current injection efficiency does not decline by forming the groove section 22 around the mesa section 21.

2. Modifications of First Embodiment

Modifications of Laser Diode 1

Figure 10:
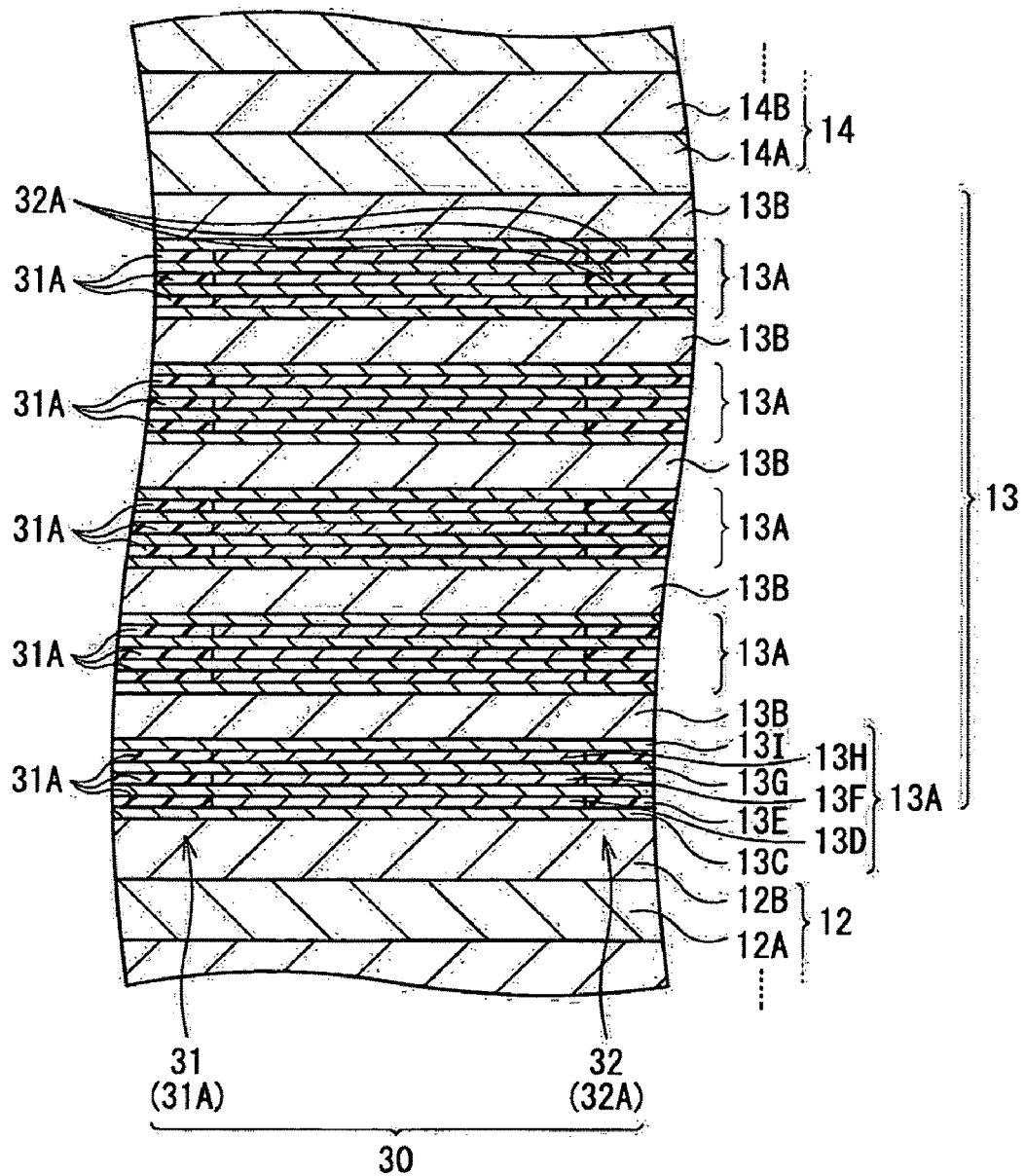
FIG. 10 is an enlarged sectional view of another example of the lower BDR mirror layer in FIG. 2.

In the first embodiment, the case where each low refractive index layer 13A in the second lower DBR mirror layer 13 includes two oxidation layers 31A and two oxidation layers 32A is described, but the lower DBR mirror layer 13 is not limited thereto, and, for example, the lower DBR mirror layer 13 may have a configuration illustrated in FIG. 10. FIG. 10 illustrates a sectional view of a modification of the lower DBR mirror layer 11 illustrated in FIG. 5.

More specifically, as illustrated in FIG. 10, each low refractive index layer 13A includes, for example, a first refractive index layer 13C made of n-type $Al_{x3}Ga_{1-x3}As$, a second refractive index layer 13D made of n-type $Al_{x4}Ga_{1-x4}As$, a third refractive index layer 13E made of n-type $Al_{x5}Ga_{1-x5}As$, a fourth refractive index layer 13F made of n-type $Al_{x6}Ga_{1-x6}As$, a fifth refractive index layer 13G made of n-type $Al_{x7}Ga_{1-x7}As$, a sixth refractive index layer 13H made of n-type $Al_{x16}Ga_{1-x16}As$, and a seventh refractive index layer 13I made of n-type $Al_{x17}Ga_{1-x17}As$ in order from a side closer to the substrate 10. In this case, the second refractive index layer 13D, the fourth refractive index layer 13F and the sixth refractive index layer 13H correspond to refractive index layers relatively susceptible to oxidation, and the oxidation sections 31 and 32 are formed in these layers so as to include three oxidation layers 31A and three oxidation layers 32A in each low refractive index layer 13A. The values x1 to x10, x13, x14, x16 and x17 of Al composition satisfy a mathematical formula represented by a formula (2). Even in the case where the lower DBR mirror layer 11 has the configuration illustrated in FIG. 10, the same effects as those in the first embodiment are obtainable, and compared to the case where two oxidation layers 31A and two oxidation layer 32A are arranged in each low refractive index layer 13, a larger anisotropic tension stress is allowed to be generated in the active layer 16. Therefore, the polarization component of laser light is allowed to be fixed more firmly, and as a result, the polarization direction of the laser light is allowed to be further stabilized in one direction. In particular, in this case, the optical thickness $L_1$ of each low refractive index layer 13A is easily increased to larger than $\lambda/4$, so the Al content included in each low refractive index layer 13 is increased by an increase in the thickness of each low refractive index layer 13A. Therefore, the heat radiation of the laser diode 1 is improved.

$$1 \geq (x4, x6, x13, x16) > (x1, x3, x5, x7, x9, x14, x17) > 0.8 > (x2, x8, x10) \geq 0 \quad (2)$$

In the formula (2), (x4, x6, x13, x16) means x4, x6, x13 or x16, and (x1, x3, x5, x7, x9, x14, x17) means x1, x3, x5, x7, x9, x14 or x17. Moreover, (x2, x8, x10) means x2, x8 or x10.

Figure 11:
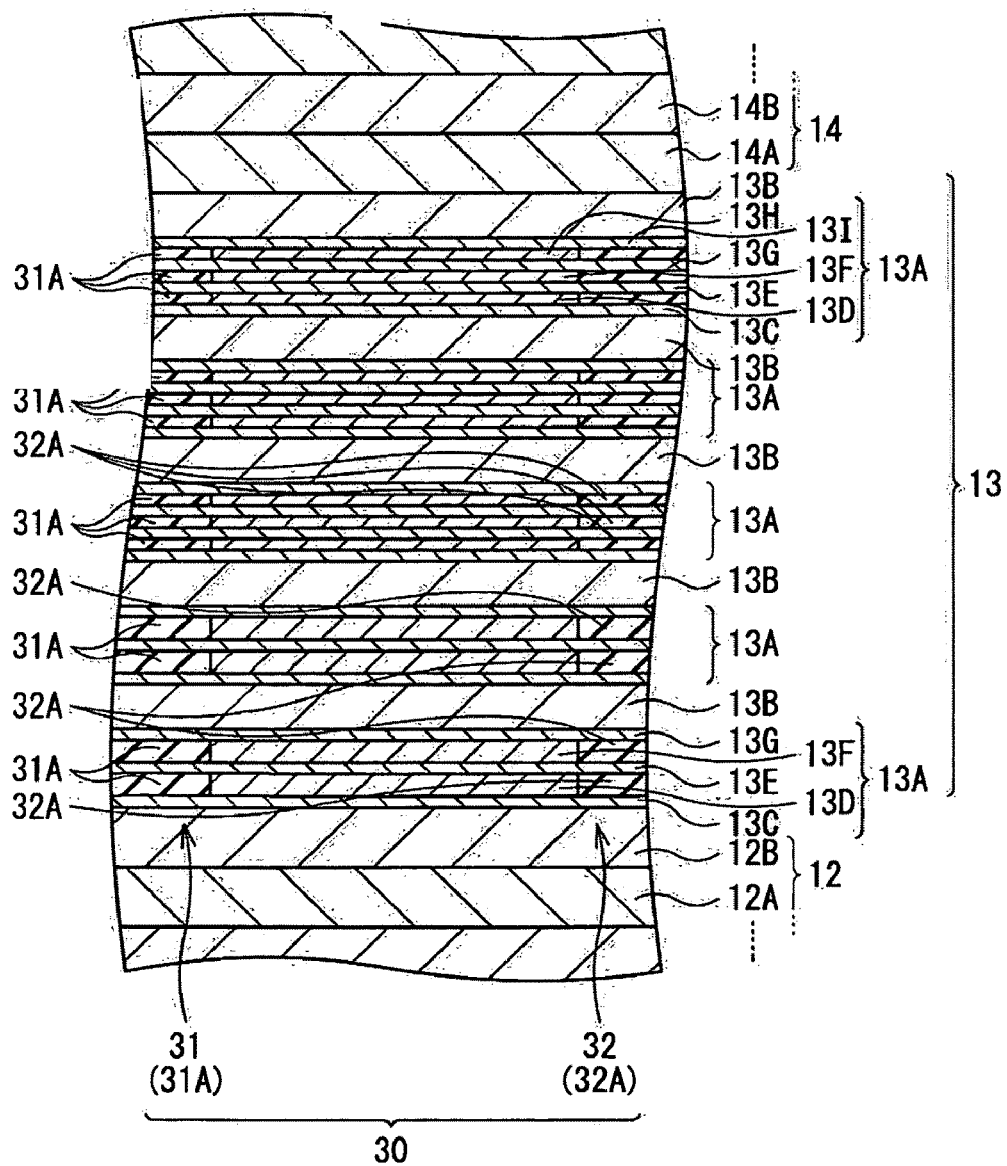
FIG. 11 is an enlarged sectional view of still another example of the lower DBR mirror layer in FIG. 2.

Moreover, for example, low refractive index layers 13A including different numbers of the oxidation layers 31A and 32A may be arranged. More specifically, among a plurality of low refractive index layers 13A, some of the low refractive index layers 13A have the configuration of the low refractive index layer 13A illustrated in FIG. 5, and other low refractive index layers 13A have the configuration of the low refractive index layer 13A illustrated in FIG. 10. Thereby, three oxidation layers 31A and three oxidation layers 32A are included in one low refractive index layer 13A, and three oxidation layers 31A and three oxidation layer 32A are included in the other low refractive index layer 13A. The values x1 to x16 of Al composition in this case satisfy the mathematical formula represented by the formula (2). Also in this case, the same effects as those in the first embodiment are obtainable. In the case where the low refractive index layers 13A including different numbers of the oxidation layers 31A and 32A are arranged, as illustrated in FIG. 11, the low refractive index layer 13A including larger numbers of the oxidation layers 31A and 32A is preferably arranged on a side closer to the active layer 16, because compared to the case where the low refractive index layer 13A including smaller numbers of the oxidation layers 31A and 32A are arranged on the side closer to the active layer 16, an anisotropic tension stress is allowed to be generated more strongly in the active layer 16. FIG. 11 illustrates a sectional view of another modification of the lower DR mirror layer 11 illustrated in FIG. 5.

In addition, FIGS. 10 and 11 illustrate the case where the second lower DBR mirror layer 13 includes the low refractive index layers 13A each of which includes three oxidation layers 31A and three oxidation layers 32A, and the case where the second lower DBR mirror layer 13 includes the low refractive index layer 13A which includes three oxidation layers 31A and three oxidation layers 32A and the low refractive index layer 13A which includes two oxidation layers 31A and two oxidation layers 32A, respectively. However, as long as one or more low refractive index layers in the lower DBR mirror layer 11 include a plurality of oxidation layers non-uniformly distributed in a direction rotating around the central axis of the mesa section 21 in a region around the region corresponding to the current injection region 17B, the second lower DBR mirror layer 13 is not limited to these cases. For example, the low refractive index layer 13A may include four or more oxidation layers 31A and four or more oxidation layers 32A, or may include the low refractive index layer 13A including two oxidation layers 31A and two oxidation layers 32A and the low refractive index layer 13A including one oxidation layer 31A and one oxidation layer 32A. Also in this case, compared to the case where each low refractive index layer in which the oxidation section is formed includes one oxidation layer, polarization controllability is improved, and an anisotropic tension stress is allowed to be more strongly generated in the active layer 16. The same holds true in embodiments which will be described later.

3. Second Embodiment

Configuration of Laser Diode 2 (Surface-Emitting Type)

Figure 12:
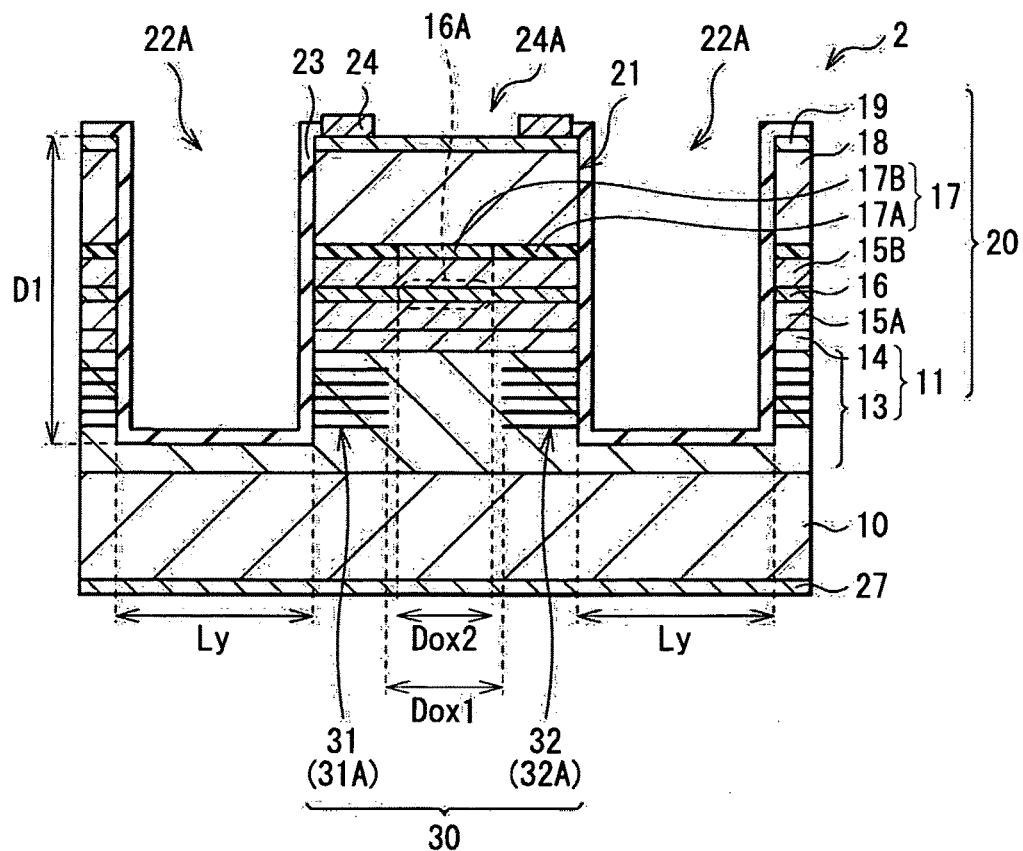
FIG. 12 is a sectional view in one direction of a laser diode according to a second embodiment of the invention.
Figure 13:
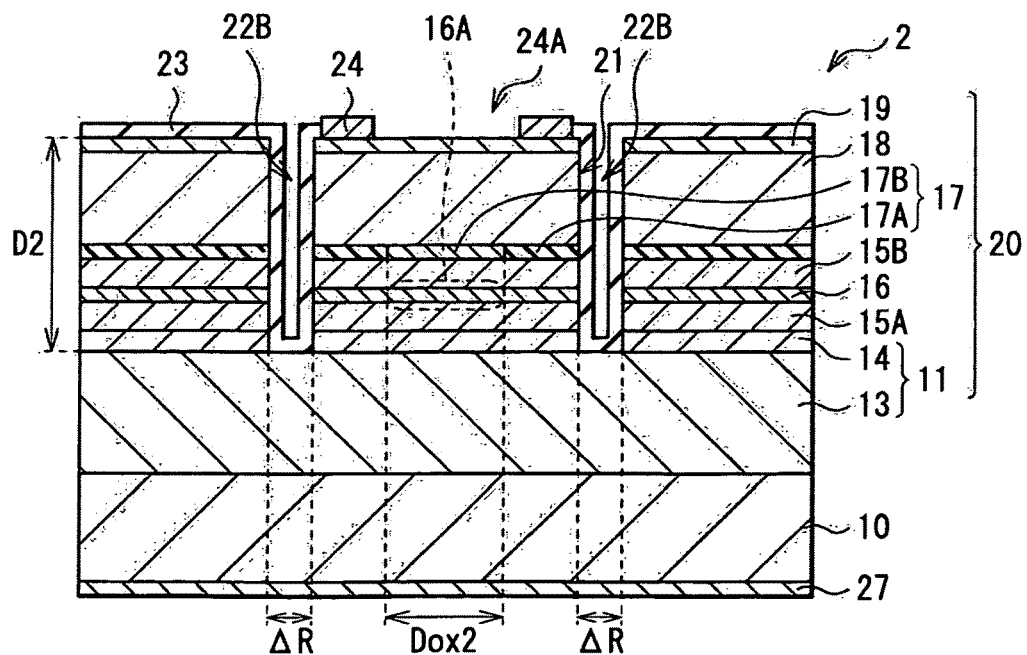
FIG. 13 is a sectional view in another direction of the laser diode according to the second embodiment of the invention.

FIGS. 12 and 13 illustrate sectional views of a surface-emitting laser diode 2 according to a second embodiment. In the first embodiment and the modifications thereof, the lower DBR mirror layer 11 has a configuration in which the first lower DBR mirror layer 12, the second lower DBR mirror layer 13 and the third lower DBR mirror layer 14 are laminated in order from the side closer to the substrate 10. On the other hand, in the embodiment, the laser diode 2 ahs the same configuration as that of the laser diode 1 according to the first embodiment, except that in the lower DBR mirror layer 11, instead of the first lower DBR mirror layer 12, the second lower DBR mirror layer 13 is formed. In other words, in the embodiment, the lower DBR mirror layer 11 is configured by laminating the second lower DBR mirror layer 13 and the third lower DBR mirror layer 14 in order from the side closer to the substrate 10. The values x3 to x10 of Al composition in the lower DBR mirror layer 11 satisfy a mathematical formula represented by a formula (3).

$$1 \geq (x4, x6, x13) > (x3, x5, x7, x9, x14) > 0.8 > (x8, x10) \geq 0 \qquad (3)$$

Figure 14A:
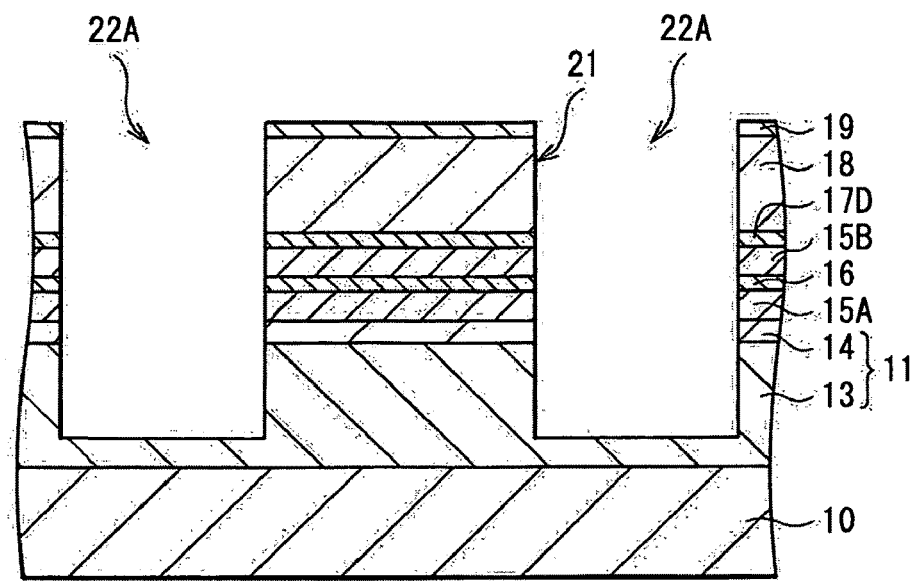
FIGS. 14A and 14B are sectional views for describing a step of manufacturing the laser diode in FIG. 12.
Figure 14B:
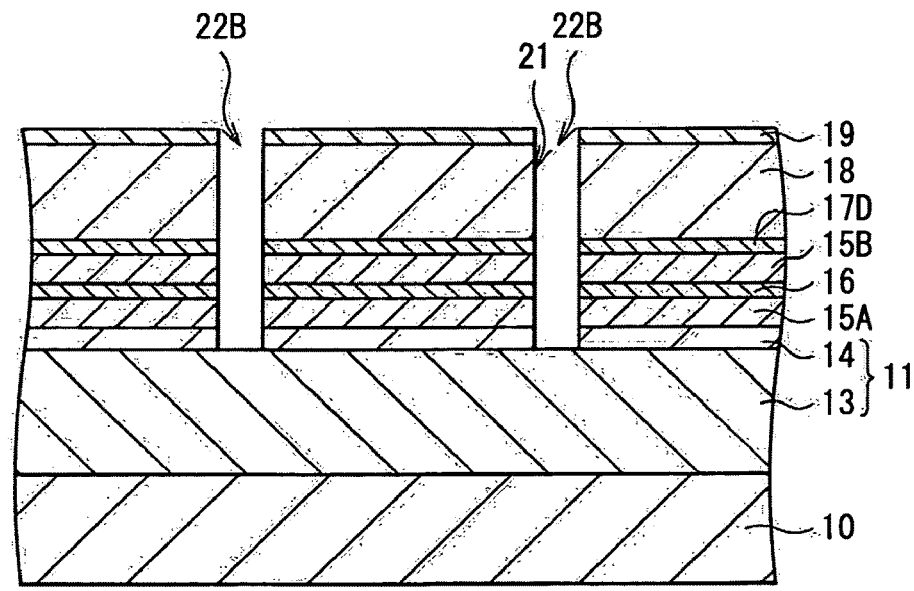
Figure 15A:
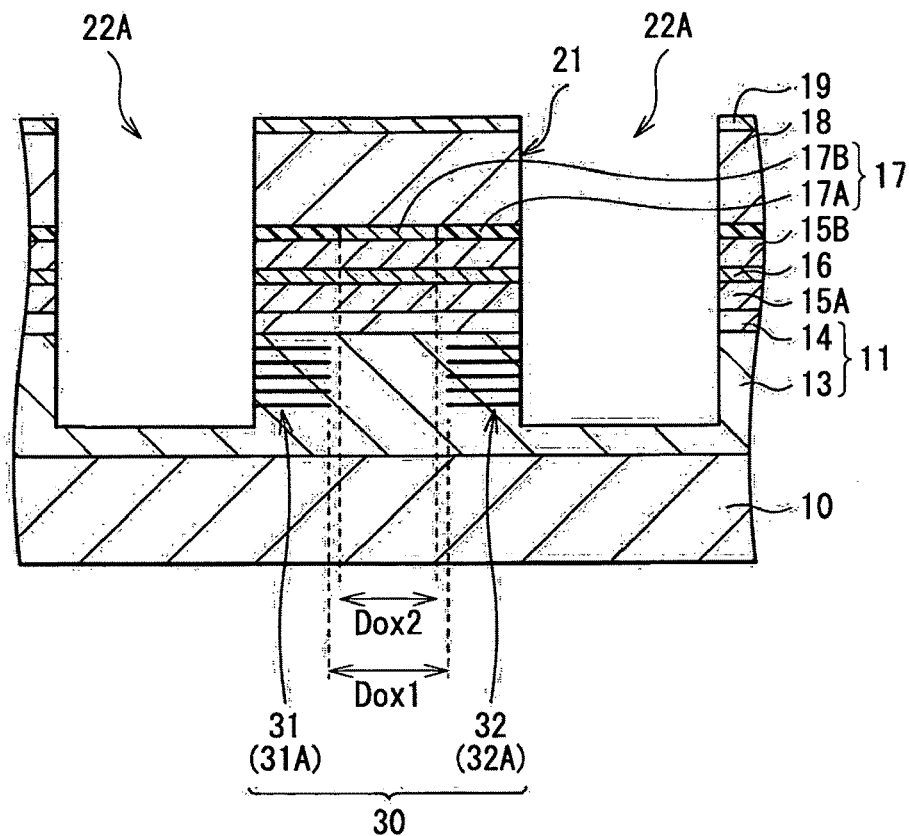
FIGS. 15A and 15B are sectional views for describing a step following FIGS. 14A and 14B.
Figure 15B:
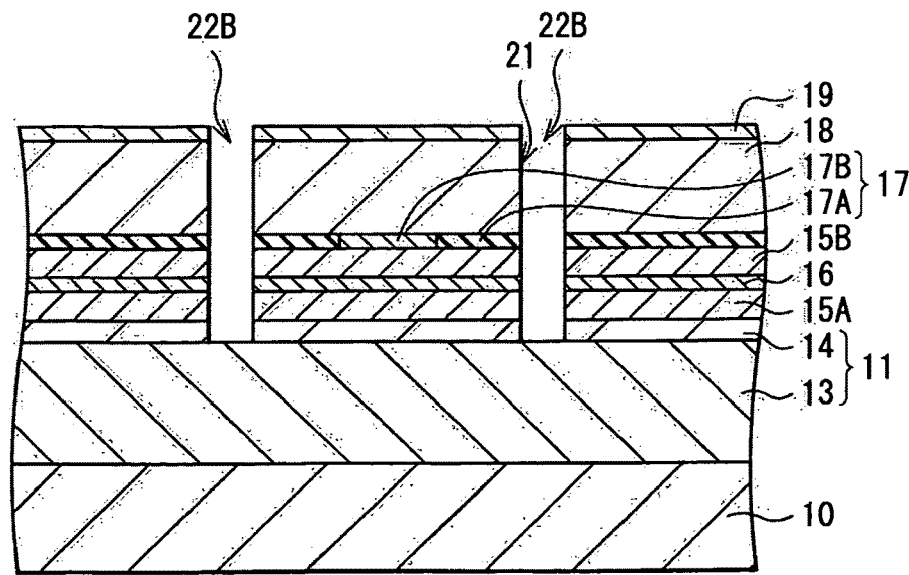

In the laser diode 2, in manufacturing steps, as illustrated in FIGS. 14A and 14B, when the groove section 22 is formed by etching, the low refractive index layer 13A is exposed to the inner surface of the groove 22A according to the depth D1 of the groove 22A. In addition, also in this case, the depth D2 of the groove 22B does not reach the second lower DBR mirror layer 13, so the low refractive index layer 13A is not exposed to the inner surface of the groove 22B. Therefore, as illustrated in FIGS. 15A and 15B, the oxidation sections 31 and 32 are formed in a part facing the groove 22A in the low refractive index layer 13A.

Functions and Effects

Thus, also in the laser diode 2 according to the embodiment, in the second lower DBR mirror layer 13 of the lower DBR mirror layer 11, the oxidation section 30 is formed around the region corresponding to the current injection region 17B, and the oxidation section 30 is nonuniformly distributed in a direction rotating around the central axis of the mesa section 21. Then, the oxidation section 30 includes a pair of oxidation sections 31 and 32 facing each other with the region corresponding to the current injection region 17B in between, and has an anisotropic distribution in a direction where the grooves 22A face each other. The oxidation sections 31 and 32 include a plurality of oxidation layers 31A and 32A arranged in the low refractive index layer 13A exposed to the groove 22A when forming the groove section 22. In other words, a sufficient tension stress by the plurality of oxidation layers 31A and 32A is nonuniformly generated in the active layer 16, and also in this case, an anisotropic tension stress is strongly generated in a direction where the grooves 22A face each other according to the distribution of the plurality of oxidation layers 31A and 32A. In addition, also in the embodiment, the low refractive index layers 13A are not oxidized in the inner surface of the groove 22B, and a stress in a direction where the grooves 22B face each other is not generated in the active layer 16. Thereby, while a polarization component in a direction orthogonal to the direction of the tension stress is enhanced, a polarization component in a direction parallel to the direction of the tension stress is suppressed.

As described above, in the laser diode 2 according to the embodiment, the second lower DBR mirror layer 13 includes a plurality of oxidation layers 31A and 32A nonuniformly distributed in the low refractive index layer 13A, and the plurality of oxidation layers 31A and 32A are arranged so as to face each other with the region corresponding to the current injection region 17B in between. Thereby, the polarization direction of laser light is fixed and stabilized in one direction.

In particular, in the embodiment, when the depth D1 of the groove 22A is changed by changing the etching time, the number of the low refractive index layers 13A exposed to the inner surface of the groove 22A is changed. Therefore, when the depth D1 of the groove 22A is increased with an increase in the etching time, the number of the exposed low refractive index layers 13A is increased, and on the other hand, when the depth D1 of the groove 22A is reduced with a reduction in the etching time, the number of the exposed low refractive index layers 13A is reduced. In other words, even if the depth D1 of the groove 22A is small, a stress in the direction where the grooves 22A face each other is allowed to be generated in the active layer 16, and the stress in the direction where the grooves 22A face each other is allowed to be increased according to (in proportion to) the depth D1 of the groove 22A. Therefore, the magnitude of the anisotropic stress generated in the active layer 16 is allowed to be set freely, and polarization controllability is allowed to be improved.

Moreover, as in the case of the above-described embodiment, each low refractive index layer 13A including the oxidation sections 31 and 32 includes a plurality of oxidation layers 31A and 32A, so compared to the case where only one oxidation layer is arranged in each low refractive index layer 13A, polarization controllability in individual laser diodes 2 is improved. Thereby, it is difficult to cause variations in the stability of the polarization direction of laser light, and the polarization direction of the laser light is allowed to be favorably stabilized. Further, the substrate is not necessarily a special substrate such as an (n11) plane substrate (n is an integer), and may be a typical (100) plane substrate, so epitaxial growth conditions such as doping conditions and a gas flow rate of the typical (100) plane substrate are usable. Thereby, the laser diode 2 is manufacturable easily at low cost. Moreover, the more the numbers (thicknesses) of the oxidation layers 31A and 32A is increased, the more the anisotropic stress is allowed to be increased, so it is not necessary to expand the oxidation section to the region corresponding to the light emission region 16A to apply a large stress to the active layer 16. Thereby, there is little possibility that light output declines by the oxidation section 30, and high-power laser light is allowed to be emitted.

In other words, in the embodiment, as in the case of the above-described embodiment, the laser diode 2 in which the polarization direction of laser light is stabilized in one direction is easily manufacturable at low cost, and higher output is allowed to be achieved. Other functions and effects are the same as those in the first embodiment and the like.

4. Third Embodiment

Configuration of Laser Diode 3 (Surface-Emitting Type)

Figure 16:
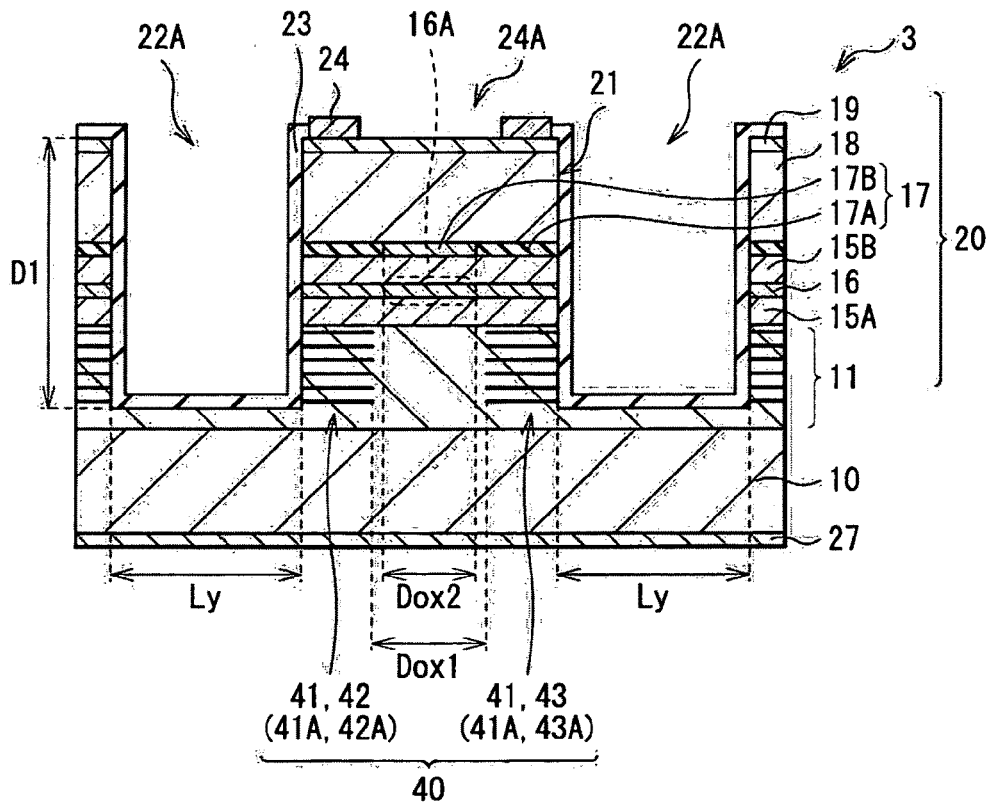
FIG. 16 is a sectional view in one direction of a laser diode according to a third embodiment of the invention.
Figure 17:
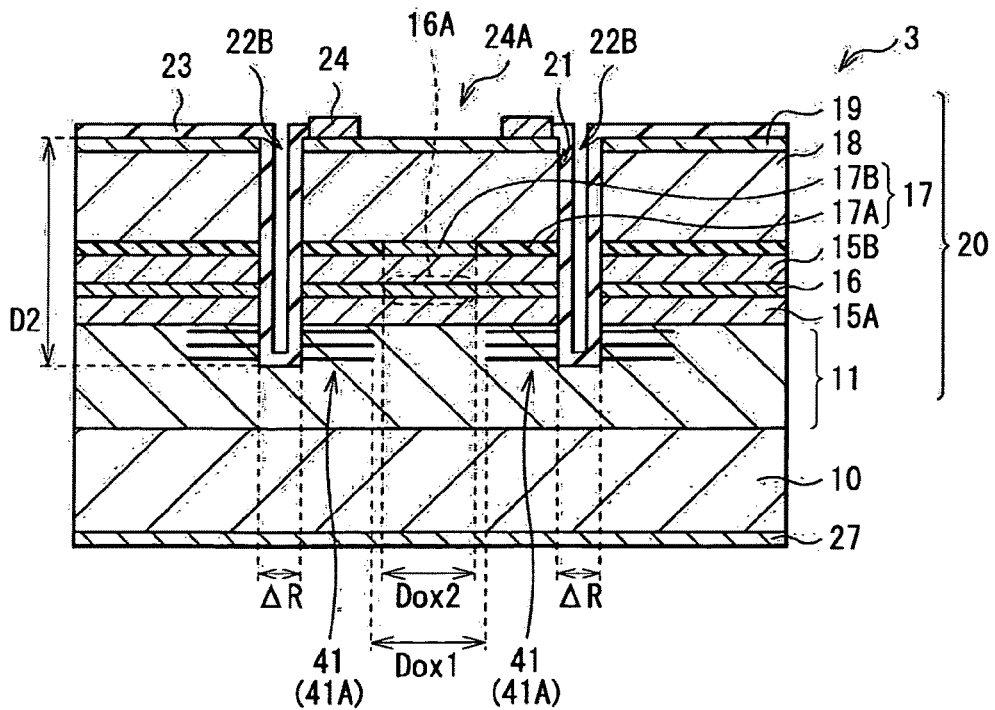
FIG. 17 is a sectional view in another direction of the laser diode according to the third embodiment of the invention.

FIGS. 16 and 17 illustrate sectional views of a surface-emitting laser diode 3 according to a third embodiment. The laser diode 3 according to the embodiment has the same configuration as that of the laser diode 1 according to the first embodiment, except that instead of the first lower DBR mirror layer 12 and the third lower DBR mirror layer 14 of the lower DBR mirror layer 11, the second lower DBR mirror layer 13 is formed. In other words, the lower DBR mirror layer 11 of the laser diode 3 has the same configuration as that of the second lower DBR mirror layer 13.

Figure 18A:
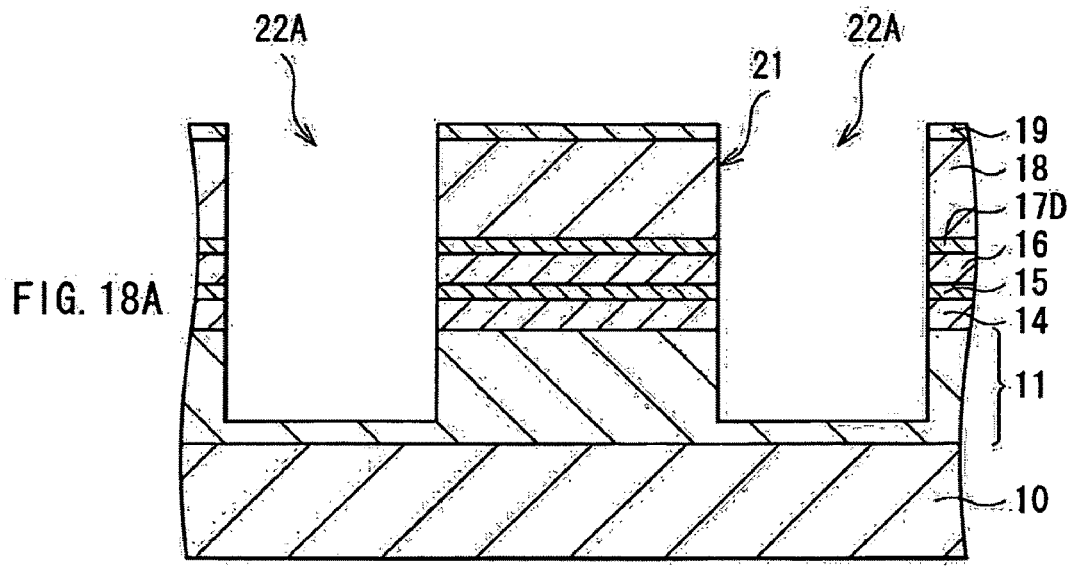
FIGS. 18A and 18B are sectional views for describing a step of manufacturing the laser diode in FIG. 16.
Figure 18B:
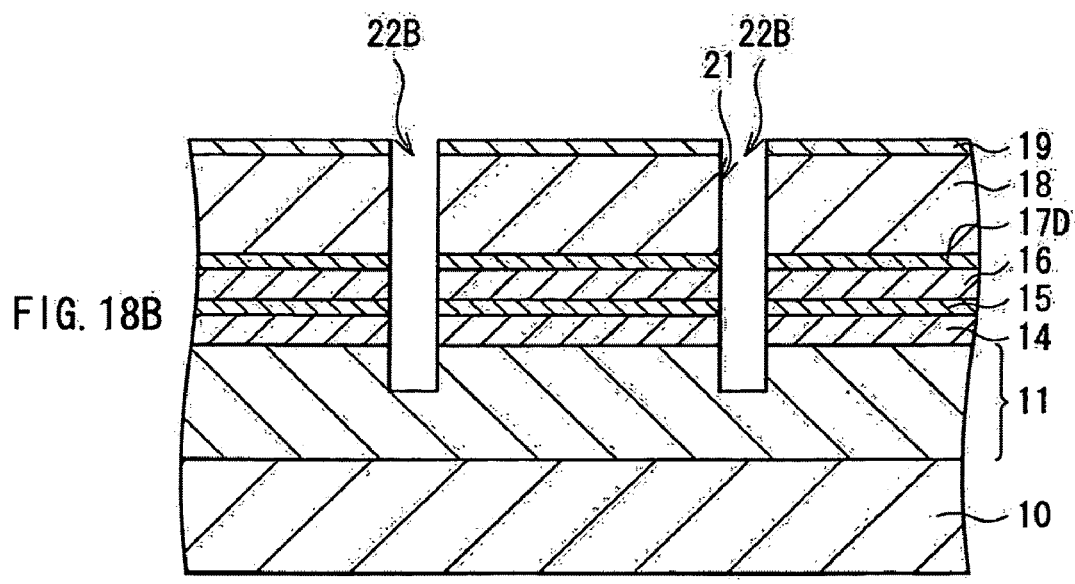

Therefore, as illustrated in FIGS. 18A and 18B, when the groove section 22 is formed by etching, the low refractive index layers 13A in the lower DBR mirror layer 11 are exposed to not only the groove 22A but also the groove 22B.

Therefore, as illustrated in FIGS. 19A and 19B, an oxidation section 40 is formed not only in a part facing the groove 22A but also in a part facing the groove 22B in the low refractive index layer 13A. The depth D1 of the groove 22A is larger than the depth D2 of the groove 22B, and the number of the low refractive index layers 13A exposed to the groove section 22 on the groove 22A side is larger than the number of the low refractive index layers exposed to the groove section 22 on the groove 22B side. Therefore, the oxidation section 40 includes an oxidation section 41 (an oxidation layer 41A) formed in a ring shape in the low refractive index layer 13A exposed to both of the inner surfaces of the grooves 22A and 22B and oxidation sections 42 and 43 (oxidation layers 42A and 43A) formed in the low refractive index layer 13A exposed to only the inner surface of the groove 22A. The oxidation sections 42 and 43 are arranged so as to face each other with the region corresponding to the current injection region 17B (or the light emission region 16A) of the lower DBR mirror layer 11 in between. Therefore, the lower DBR mirror layer 11 includes a plurality of oxidation layers 42A and 43A nonuniformly distributed in a direction rotating around the central axis of the mesa section 21 in a region around the region corresponding to the current injection region 17B in one or more low refractive index layers 13A. Thereby, the oxidation section 40 generates a nonuniform stress according to the distribution in the active layer 16.

Functions and Effects

Thus, in the laser diode 3 according to the embodiment, in the lower DBR mirror layer 11, the oxidation section 40 is formed around the region corresponding to the current injection region 17B, and the oxidation section 40 is nonuniformly distributed in a direction rotating around the central axis of the mesa section 21. Then, the oxidation section 40 includes the ring-shaped oxidation section 41 surrounding the region corresponding to the current injection region 17B, and the oxidation sections 42 and 43 facing each other with the region corresponding to the current injection region 17B, and has an anisotropic distribution in a direction where the grooves 22A face each other. The oxidation section 41 includes a plurality of oxidation layers 41A arranged in the low refractive index layer 13A exposed to both of the inner surfaces of the grooves 22A and 22B when forming the groove section 22, and the oxidation sections 42 and 43 include a plurality of oxidation layers 42A and 43A arranged in the low refractive index layer 13A exposed to only the groove 22A. In other words, while an isotropic stress is generated in the active layer 16 by the oxidation layers 41A isotropically distributed, an anisotropic stress is generated by the plurality of oxidation layers 42A and 43A anisotropically distributed. Therefore, the direction of the stress generated in the active layer 16 coincides with the direction where the grooves 22A face each other as in the case of the above-described embodiments. Thereby, while the polarization component in a direction orthogonal to the direction of the stress is enhanced, the polarization component in a direction parallel to the direction of the stress is suppressed.

As described above, in the laser diode 3 according to the embodiment, the lower DBR mirror layer 11 includes a plurality of oxidation layers 42A and 43A nonuniformly distributed in the low refractive index layer 13A, and the plurality of oxidation layers 42A and 43A are arranged so as to face each other with the region corresponding to the current narrowing region 17A in between. Thereby, the polarization direction of laser light is fixed and stabilized in one direction.

Moreover, as in the case of the above-described embodiments, each lower refractive index layer 13A including the oxidation section 40 includes a plurality of oxidation layers 41A, 42A and 43A, so compared to the case where only one oxidation layer is arranged in each low refractive index layer 13A, polarization controllability is improved in individual laser diodes 3. Thereby, it is difficult to cause variations in stability of the polarization direction of laser light, thereby the polarization direction of the laser light is allowed to be stabilized more favorably. Moreover, the substrate is not necessarily a special substrate such as an (n11) plane substrate (n is an integer), and may be a typical (100) plane substrate, so epitaxial growth conditions such as doping conditions and a gas flow rate of the typical (100) plane substrate are usable. Thereby, the laser diode 3 is manufacturable easily at low cost. Further, the more a difference between the number of oxidation layer 41A and the numbers of the oxidation layers 42A and 43A is increased, the more the anisotropic stress is allowed to be increased, so it is not necessary to expand the oxidation section 40 to the region corresponding to the light emission region 16A. Thereby, there is little possibility that light output declines by the oxidation section 40, and high-power laser light is allowed to be emitted.

In other words, in the embodiment, as in the case of the above-described embodiments, the laser diode 3 in which the polarization direction of laser light is stabilized in one direction is easily manufacturable at low cost, and higher output is allowed to be achieved. Other functions and effects are the same as those in the above-described embodiments.

5. Fourth Embodiment

Configuration of Laser Diode 4 (Surface-Emitting Type)

Figure 20:
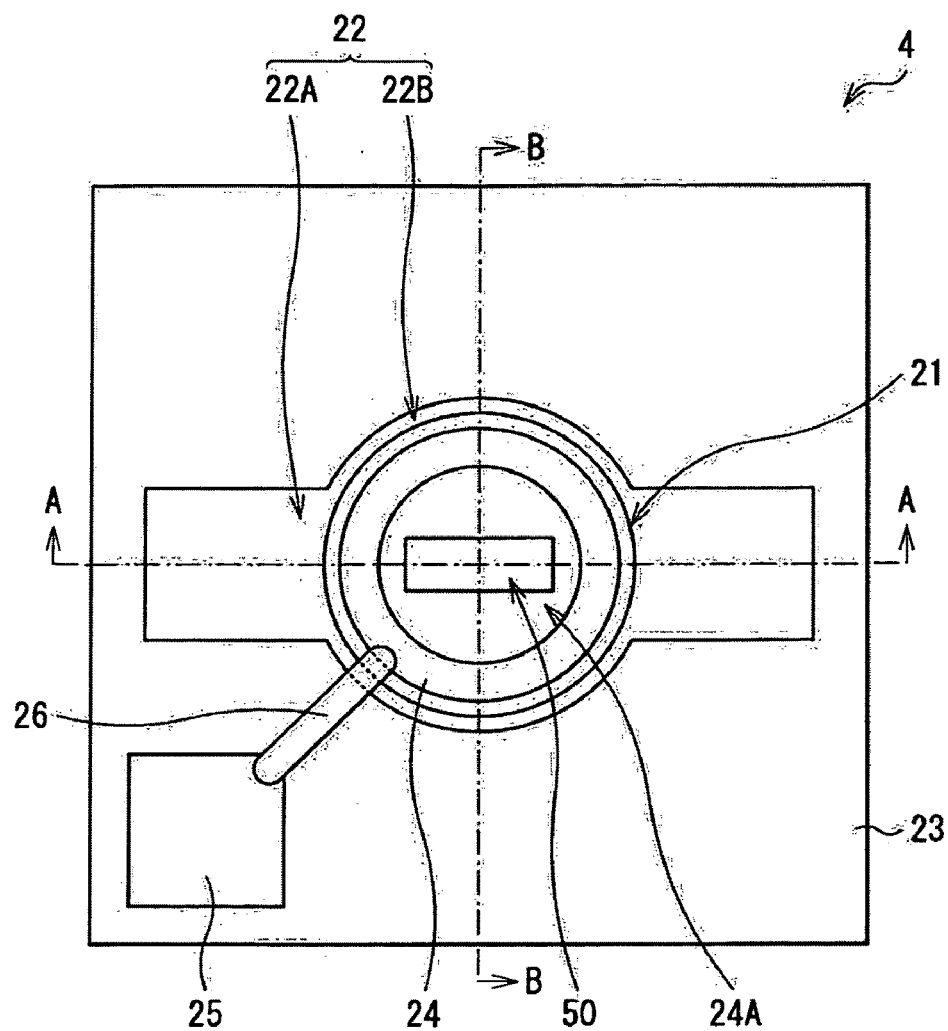
FIG. 20 is a top view of a laser diode according to a fourth embodiment of the invention.
Figure 21:
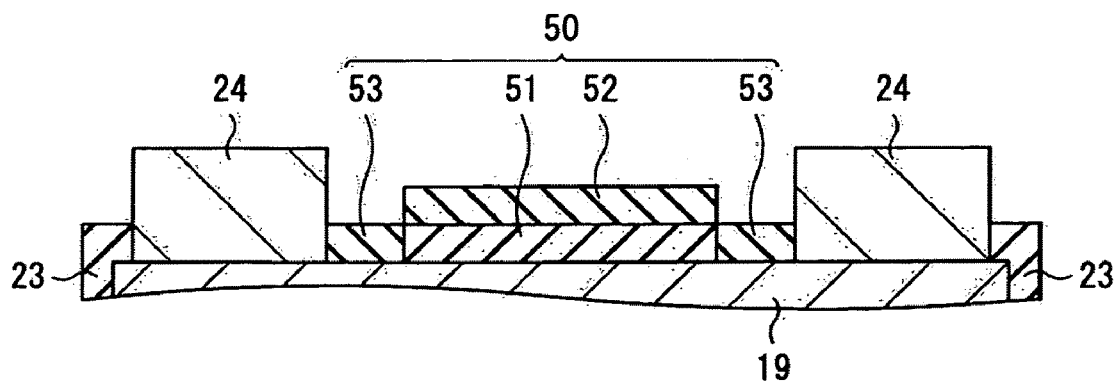
FIG. 21 is an enlarged sectional view in one direction of a transverse mode adjustment layer in FIG. 20.
Figure 22:
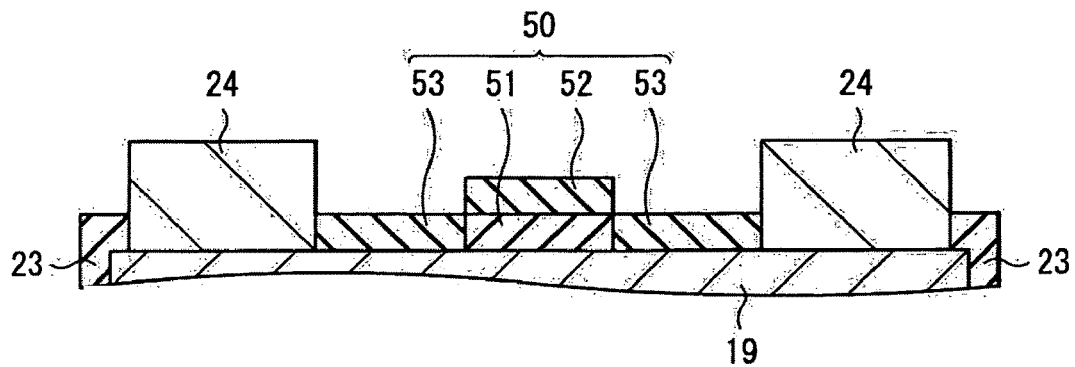
FIG. 22 is an enlarged sectional view in another direction of the transverse mode adjustment layer in FIG. 20.

FIG. 20 illustrates a top view of a surface-emitting laser diode 4 according to a fourth embodiment. FIG. 21 illustrates an enlarged sectional view of a region in proximity to the light emission opening 24A taken along an arrow direction A-A of FIG. 20, and FIG. 22 is an enlarged sectional view of the region in proximity to the light emission opening 24A taken along an arrow direction B-B of FIG. 20. The laser diode 4 has the same configuration as that of the above-described embodiments and the like, except that a transverse mode adjustment layer 50 is arranged corresponding to the light emission opening 24A.

The transverse mode adjustment layer 50 includes a first adjustment layer 51, a second adjustment layer 52 and a third adjustment layer 53, and the first adjustment layer 51 and the second adjustment layer 52 are laminated in this order in a central region of the light emission opening 24A, that is, a region where fundamental transverse mode oscillation mainly occurs. The third adjustment layer 53 is formed in an edge region surrounding the central region, that is, a region where high-order transverse mode oscillation mainly occurs.

Figure 23:
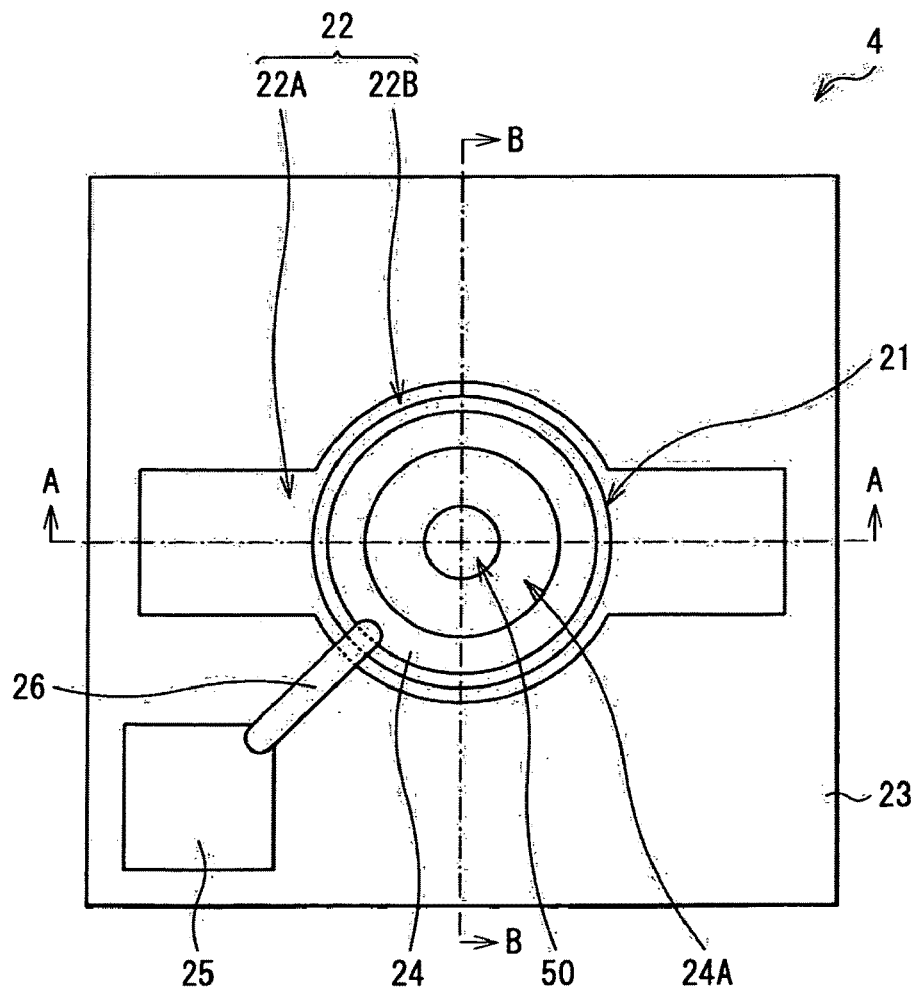
FIG. 23 is a top view of a modification of the laser diode in FIG. 20.

In addition, in FIGS. 20 to 22, to further reduce high-order transverse mode oscillation in a direction where the grooves 22B face each other, the first adjustment layer 51 and the second adjustment layer 52 each have a rectangular shape in which a width in the direction is smaller than a width in a direction where the grooves 22A face each other, but the first adjustment layer 51 and the second adjustment layer 52 may have any other shape, for example, a circular shape as illustrated in FIG. 23.

The first adjustment layer 51 has a film thickness of $(2a-1)\lambda/4n_1$ (a is an integer of 1 or more, and $n_1$ is an refractive index), and is made of a material in which the refractive index $n_1$ is lower than the refractive index of a high refractive index layer arranged on a surface of the upper DBR mirror layer 18, for example, a dielectric such as $SiO_2$ (silicon oxide). The width in a direction where the grooves 22B face each other of the first adjustment layer 51 is substantially equal to that of a region where fundamental transverse mode oscillation mainly occurs, and is preferably within a range from 3.0 μm to 5.0 μm both inclusive.

The second adjustment layer 52 has a film thickness of $(2b-1)\lambda/4n_2$ (b is an integer of 1 or more, and $n_2$ is a refractive index), and is made of a material in which the refractive index $n_2$ is higher than that of the first adjustment layer 51, for example, a dielectric such as SiN (silicon nitride).

The third adjustment layer 53 has a film thickness of $(2c-1)\lambda/4n_3$ (c is an integer of 1 or more, and $n_3$ is a refractive index), and is made of a material in which the refractive index $n_3$ is lower than that of the first adjustment layer 51, for example, a dielectric such as SiN (silicon nitride). In addition, the second adjustment layer 52 and the third adjustment layer 53 are preferably made of the same material with the same film thickness. Thereby, these layers are allowed to be collectively formed, and manufacturing steps are allowed to be simplified.

In this case, when the reflectivity of a central region of the light emission opening 24A is $R_1$, and the reflectivity of an edge region surrounding the central region is $R_2$, and the reflectivity in the case where these adjustment layers are not arranged in the light emission opening 24A is $R_3$, each refractive index is preferably adjusted so as to satisfy the relationship of a mathematical formula represented by a formula (4). Thereby, only high-order transverse mode oscillation is allowed to be suppressed without reducing fundamental transverse mode light output.

$$R1 \geq R3 > R2 \qquad (4)$$

Typically, in the surface-emitting laser diode, there is a tendency that fundamental transverse mode light output is the largest in a central part of the light emission opening, and is reduced with distance from the central part of the light emission opening. Therefore, in the case where the surface-emitting laser diode is used for an application demanding high output, the light emission opening is preferably expanded so as to take out fundamental transverse mode laser light as much as possible. However, typically, there is a tendency that high-order transverse mode light output is the largest in a region at a predetermined distance from the central part of the light emission opening, and is reduced toward the central part of the light emission opening, so when the light emission opening is too large, high-power high-order transverse mode laser light may be also outputted. Therefore, in a surface-emitting laser diode in related art, high-order transverse mode laser light is prevented from being outputted by measures such as reducing the size of the light emission opening or arranging a structure with a complicated shape in the light emission opening. Moreover, even in the case where the surface-emitting laser diode is used for an application demanding low output, to reduce high-order transverse mode laser light to a minimum, it is necessary to take the same measures as the above-described measures.

Functions and Effects

On the other hand, in the embodiment, the first adjustment layer 51 and the second adjustment layer 52 are laminated in this order in the central region of the light emission opening 24A, and the third adjustment layer 53 is arranged in the region in proximity to the central region of the light emission opening 24A. Thereby, the reflectivity of the region in proximity to the central region of the light emission opening 24A is lower than that of the central region. Therefore, the polarization direction of laser light is stabilized in one direction, and only high-order transverse mode oscillation is allowed to be suppressed without reducing fundamental transverse mode light output.

Moreover, in the embodiment, the first adjustment layer 51 is arranged on the contact layer 19 made of a semiconductor material, so it is very easy to selectively etch the first adjustment layer 51, and it is not necessary for the first adjustment layer 51, the second adjustment layer 52 and the third adjustment layer 53 to have a complicated shape, so the laser diode 4 is manufacturable easily.

6. Fifth Embodiment

Configuration of Laser Diode 5 (Surface-Emitting Type)

Figure 24:
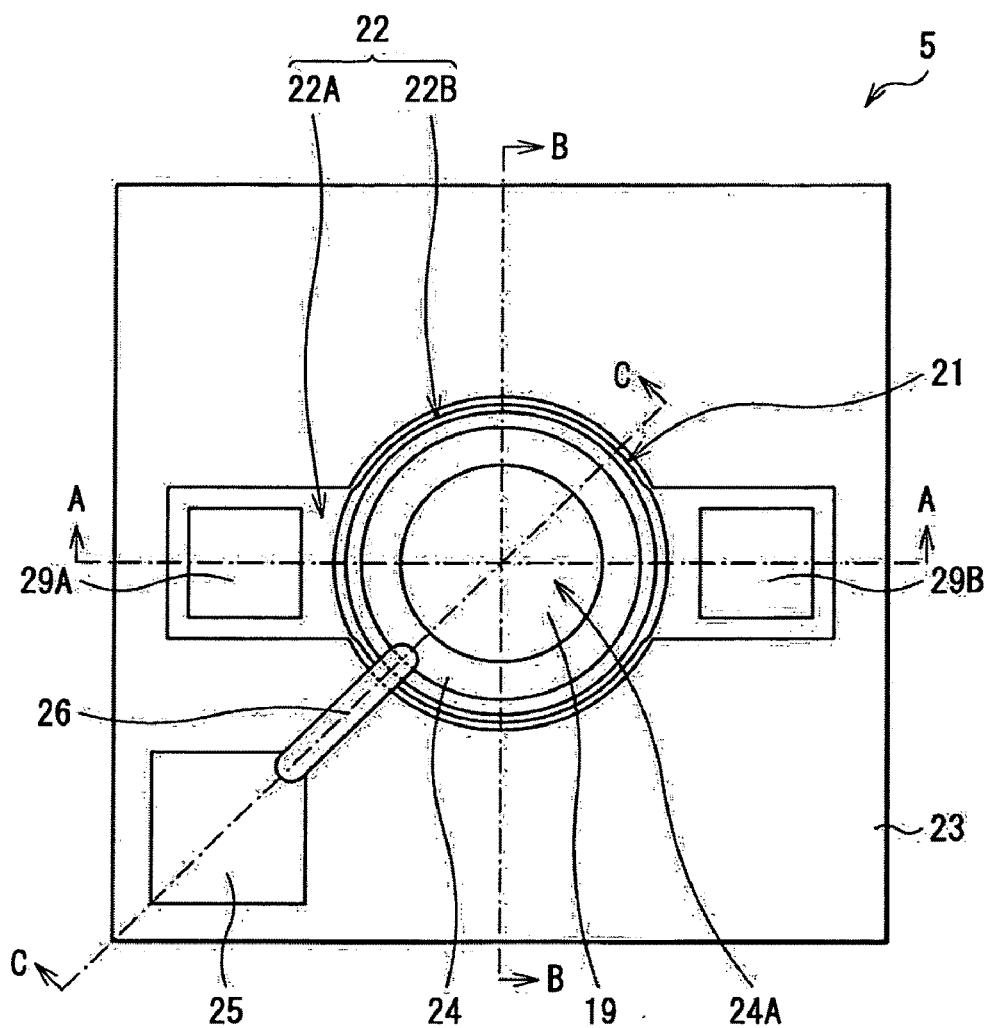
FIG. 24 is a top view of a surface-emitting laser diode according to a fifth embodiment of the invention.
Figure 25:
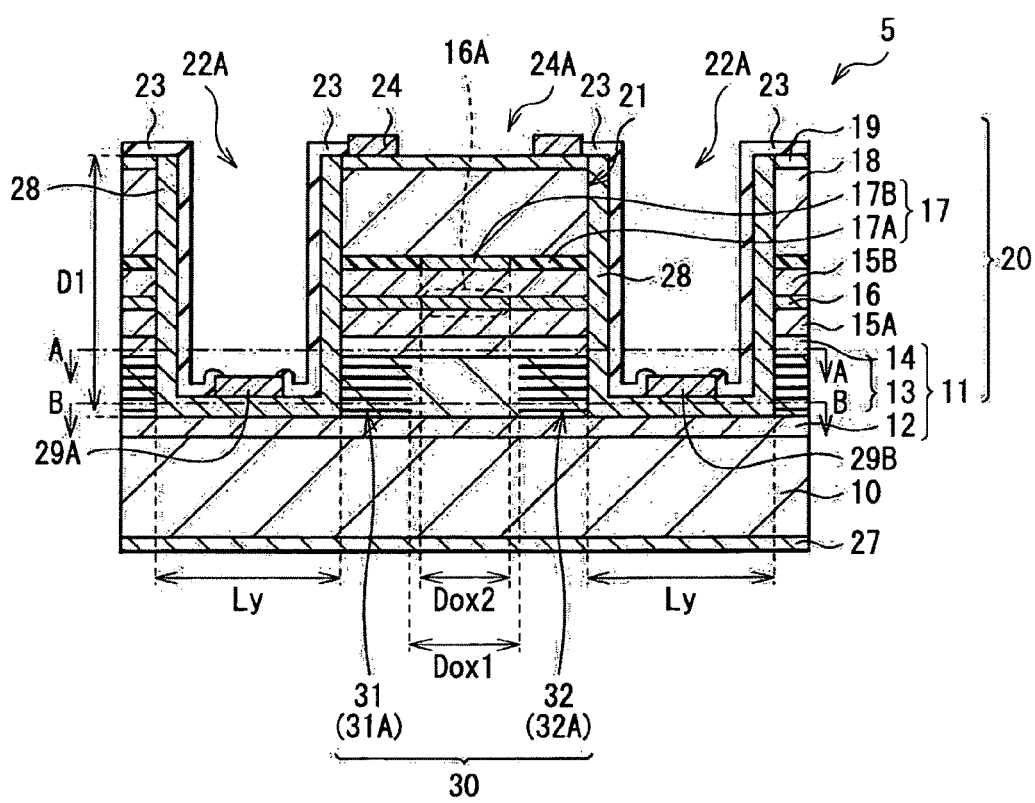
FIG. 25 is a sectional view of the laser diode taken along an arrow direction A-A of FIG. 24.
Figure 26:
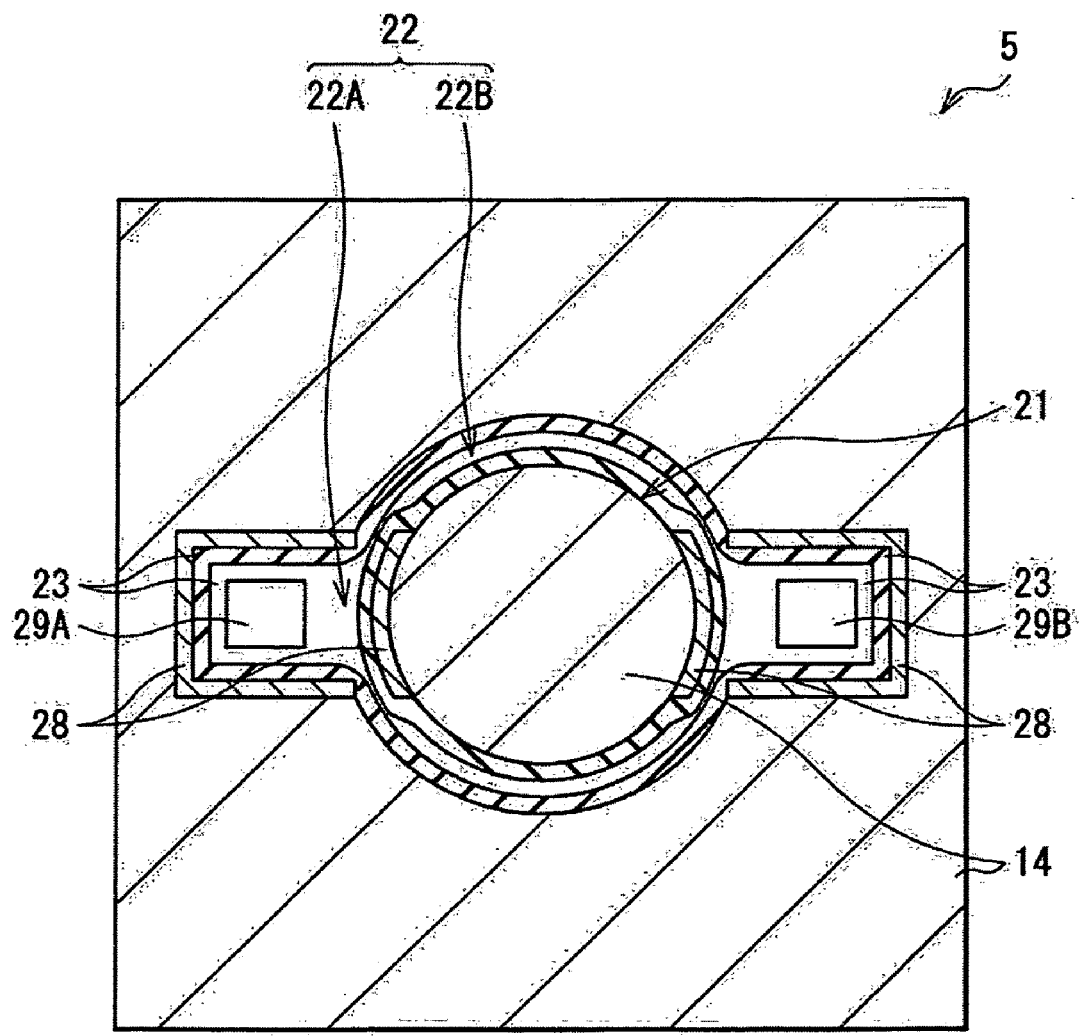
FIG. 26 is a sectional view of the laser diode taken along an arrow direction A-A of FIG. 25.
Figure 27:
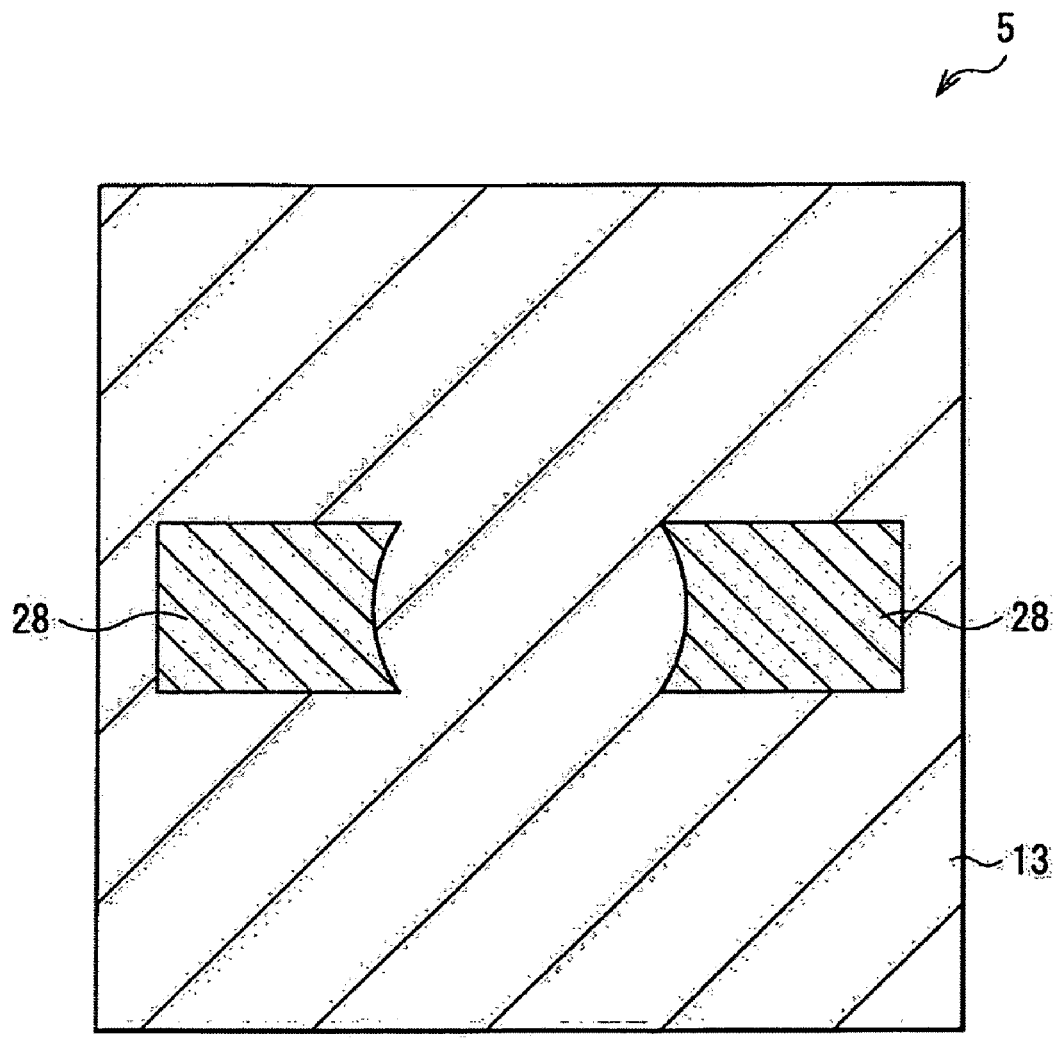
FIG. 27 is a sectional view of the laser diode taken along an arrow direction B-B of FIG. 25.

FIG. 24 illustrates a top view of a surface-emitting laser diode 5 according to a fifth embodiment. FIG. 25 illustrates a sectional view of the laser diode 5 taken along an arrow direction A-A of FIG. 24. FIG. 26 illustrates a sectional view of the laser diode 4 taken along an arrow direction A-A of FIG. 25, and FIG. 27 illustrates a sectional view of the laser diode 5 taken along an arrow direction B-B of FIG. 25. In addition, the sectional views taken along arrow directions B-B and C-C of FIG. 24 are the same as those in the case of the laser diode 1 of the above-described first embodiment.

As illustrated in FIGS. 24 to 27, the laser diode 5 has the same configuration as that of the above-described embodiments and the like, except that a semiconductor layer 28 formed on an inner wall of the groove 22A including a side wall of the mesa section 21, and a pair of electrodes 29A and 29B formed in a part of a portion corresponding to a bottom surface of the groove 22A in a surface of the semiconductor layer 28.

The semiconductor layer 28 has, for example, an NPN configuration in which an n-type semiconductor layer, a p-type semiconductor layer and an n-type semiconductor layer are laminated in order from the inner wall of the groove 22A by epitaxial crystal growth (regrowth).

The electrodes 29A and 29B each have, for example, a configuration in which a AuGe alloy layer, a Ni layer and an Au layer are laminated in order from the bottom side of the groove 22A, and are electrically connected to a surface of the semiconductor layer 28. The electrodes 29A and 29B are exposed from an opening formed on the bottom of the groove 22A of the protective film 23.

Functions and Effects

In the laser diode 5 according to the embodiment, the electrodes 29A and 29B are connected to the inner wall of the groove 22A including the mesa section 21 through the semiconductor layer 28 with an NPN configuration, so even if a DC voltage (a bias) is applied between the electrodes 29A and 29B, a current does not flow into the mesa section 21, and when a current flows between the upper electrode 24 and the lower electrode 27 for laser drive, the current does not flow into the electrodes 29A and 29B. Therefore, when a DC voltage (a bias) is applied between the electrodes 29A and 29B, an electric field is formed in the mesa section 21. The electric field is formed in a direction where the electrodes 29A and 29B face each other (a direction where the grooves 22A face each other) and in a direction substantially parallel to the laminate in-plane direction of the mesa section 21, so an absorption loss in the direction where the grooves 22A face each other is increased by the presence of the electric field.

Thereby, in the embodiment, while a polarization component in a direction orthogonal to the direction where the grooves 22A face each other is enhanced, a polarization component in the direction where the grooves 22A face each other is suppressed, so the polarization component of laser light is allowed to be fixed in one direction, and as a result, the polarization direction of laser light is allowed to be stabilized in one direction.

Moreover, in the embodiment, a part (a side wall on the groove 22A side) of the mesa section 21 is covered with the semiconductor layer 28, so the heat of the mesa section 21 is allowed to be radiated to outside through the semiconductor layer 28, and heat radiation is superior, compared to the case of the above-described embodiments.

Moreover, in the embodiment, the semiconductor layer 28 and the electrodes 29A and 29B each have a simple configuration, and the semiconductor layer 28 is allowed to be formed more easily by regrowth, so the laser diode 5 is manufacturable easily.

7. Modification of Fifth Embodiment

Configuration of Laser Diode 6 (Surface-Emitting Type) (Modification of Laser Diode 5)

In the above embodiment, the semiconductor layer 28 is formed in the groove 22A, but as illustrated in a surface-emitting laser diode 6 in FIGS. 28 to 31, the semiconductor layer 28 is formed also in the groove 22B so that the groove 22B is allowed to be filled with the semiconductor layer 28. In such a case, a large part (side walls on sides close to the grooves 22A and 22B) of the mesa section 21 is covered with the semiconductor layer 28, so the heat of the mesa section 21 is allowed to be effectively radiated through a part with which the groove 22B is filled of the semiconductor layer 28, and heat radiation is superior, compared to the case of the above-described fifth embodiment.

Figure 28:
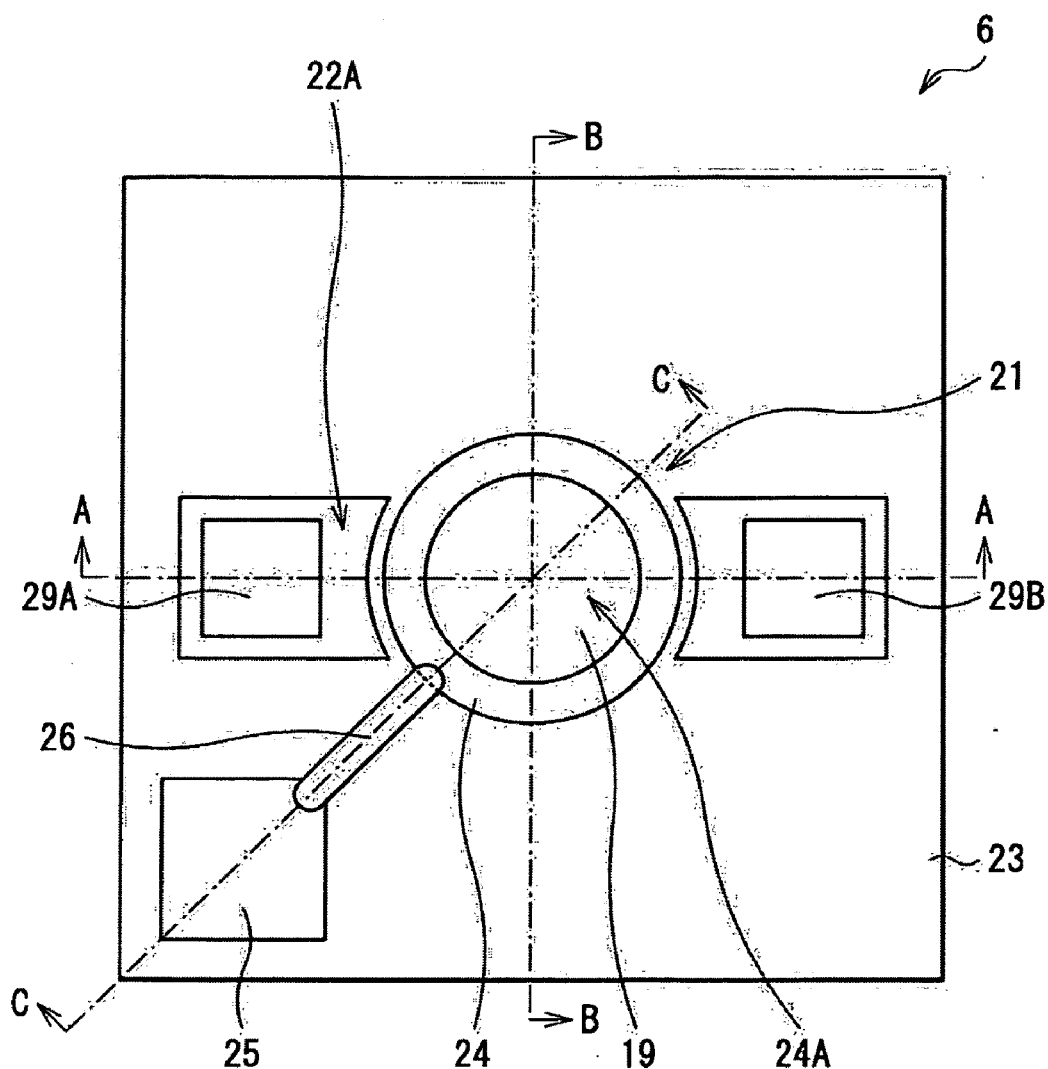
FIG. 28 is a top view of a modification of the laser diode in FIG. 24.
Figure 29:
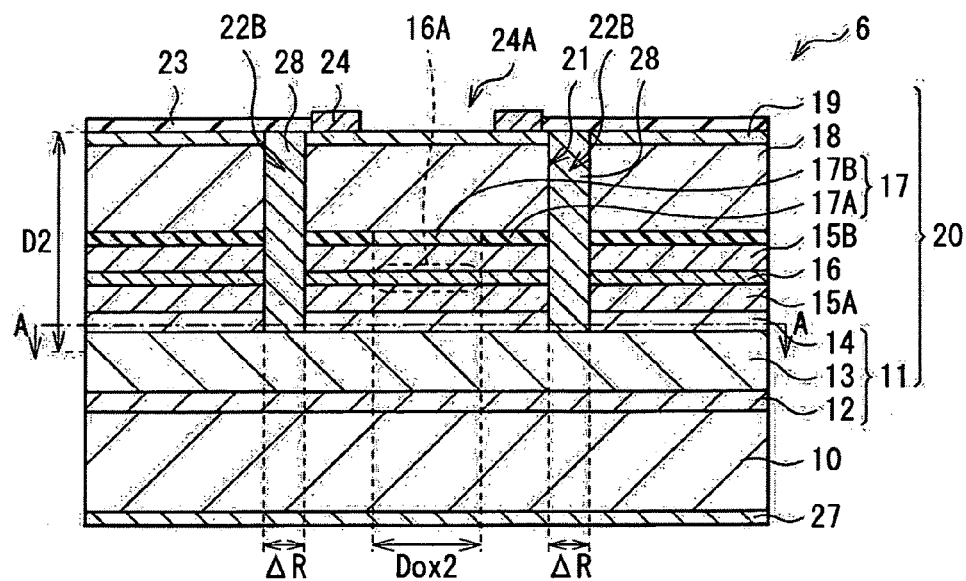
FIG. 29 is a sectional view of the laser diode taken along an arrow direction A-A of FIG. 28.
Figure 30:
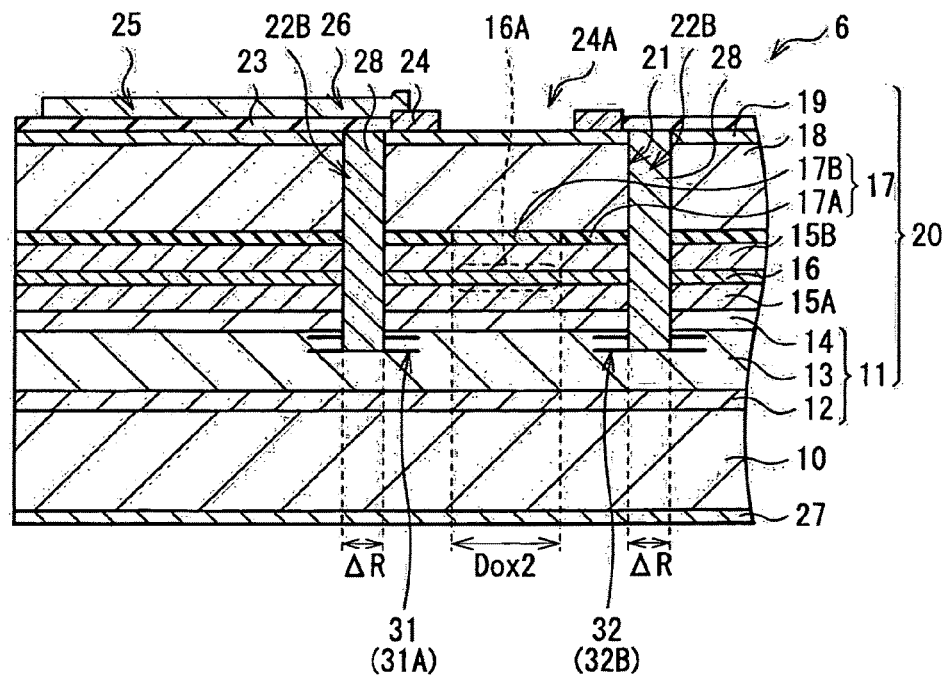
FIG. 30 is a sectional view of the laser diode taken along an arrow direction C-C of FIG. 28.
Figure 31:
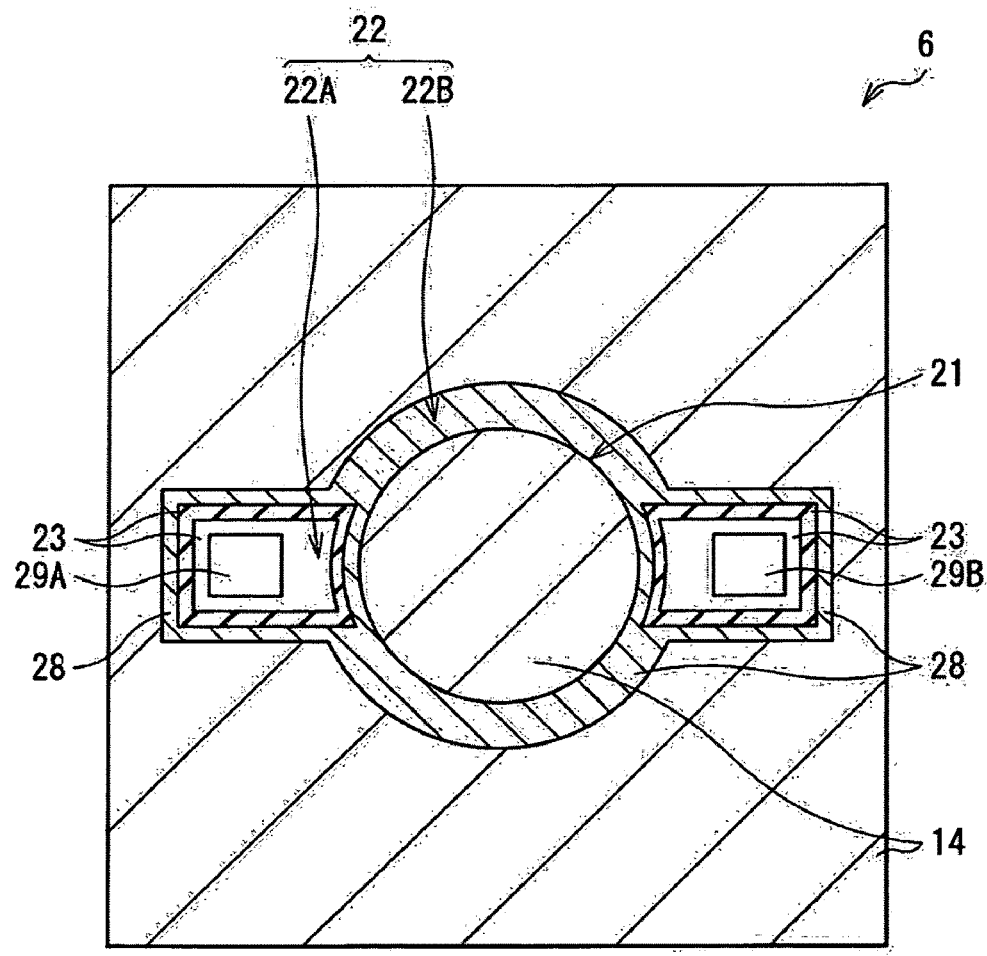
FIG. 31 is a sectional view of the laser diode taken along an arrow direction A-A of FIG. 29.

In addition, FIG. 28 illustrates a top view of the laser diode 6 according to a modification, and FIG. 29 illustrates a sectional view taken along an arrow direction B-B of FIG. 28, and FIG. 30 illustrates a sectional view taken along an arrow direction C-C of FIG. 28. Moreover, a sectional view taken along an arrow direction A-A of FIG. 28 is the same as that in FIG. 25, and FIG. 31 illustrates a sectional view taken along an arrow direction A-A of FIG. 29.

EXAMPLE

An example of the invention will be described in detail below.

Example 1

The laser diode 1 illustrated in FIG. 1 was considered as one channel, and a laser array including 40 channels was formed.

First, the laminate configuration 20 was formed on the substrate 10 by an MOCVD method. At that time, the material of a Group III-V compound semiconductor, for example, trimethyl aluminum (TMA), trimethyl gallium (TMG), trimethyl indium (TMIn) or arsine ($AsH_3$) was used, and as a material of a donor impurity, for example, silicon was used, and as a material of acceptor impurity, for example, carbon was used.

More specifically, as illustrated in Table 1, the first lower DBR mirror layer 12, the second lower DBR mirror layer 13 and the third lower DBR mirror layer 14 were laminated in this order on the substrate 10 made of n-type GaAs so as to form the lower DBR mirror layer 11. In addition, the thickness of each layer illustrated in Table 1 is an approximate value. Next, the n-type lower spacer layer 15A, the active layer 16 configured of two to four pairs of quantum well layers and the p-type upper spacer layer 15B were laminated in this order on lower DBR mirror layer 11 so as to form a 1λ cavity. The oscillation wavelength λ in this case was, for example, approximately 785 nm. Next, the $Al_{x13}Ga_{1-x13}As$ layer 17D ($1 \leq x13 < 0.9$) was formed on the upper spacer layer 15B, and then the upper DBR mirror layer 18 having a multilayer configuration including low refractive index layers and high refractive index layers are formed on the $Al_{x13}Ga_{1-x13}As$ layer 17D. Finally, the contact layer 19 made of p-type GaAs was laminated on the upper DBR mirror layer 18.

TABLE 1

| EXAMPLE 1 | | | MATERIAL | | THICKNESS | NUMBER |
|---|---|---|---|---|---|---|
| | | | COMPOSITION FORMULA | x1 to x10 | (nm) | OF PAIRS |
| THIRD LOWER DBR MIRROR LAYER | HIGH REFRACTIVE INDEX LAYER | | n-type $Al_{x10}Ga_{1-x10}As$ | $0.3 \leq x10 < 0.4$ | 57 | 4 |
| | LOW REFRACTIVE INDEX LAYER | | n-type $Al_{x9}Ga_{1-x9}As$ | $0.8 < x9 < 0.9$ | 62 | |
| SECOND LOWER DBR MIRROR LAYER | HIGH REFRACTIVE INDEX LAYER | | n-type $Al_{x8}Ga_{1-x8}As$ | $0.3 \leq x8 < 0.4$ | 47 | 10 |
| | LOW REFRACTIVE INDEX LAYER | FIFTH REFRACTIVE INDEX LAYER | n-type $Al_{x7}Ga_{1-x7}As$ | x7 = 0.9 | 7.5 | |
| | | FOURTH REFRACTIVE INDEX LAYER | n-type $Al_{x6}Ga_{1-x6}As$ | x6 = 1 | 15 | |
| | | THIRD REFRACTIVE INDEX LAYER | n-type $Al_{x5}Ga_{1-x5}As$ | x5 = 0.9 | 20 | |
| | | SECOND REFRACTIVE INDEX LAYER | n-type $Al_{x4}Ga_{1-x4}As$ | x4 = 1 | 15 | |
| | | FIRST REFRACTIVE INDEX LAYER | n-type $Al_{x3}Ga_{1-x3}As$ | x3 = 0.9 | 7.5 | |
| FIRST LOWER DBR MIRROR LAYER | HIGH REFRACTIVE INDEX LAYER | | n-type $Al_{x2}Ga_{1-x2}As$ | $0.3 \leq x2 < 0.4$ | 57 | 31 |
| | LOW REFRACTIVE INDEX LAYER | | n-type $Al_{x1}Ga_{1-x1}As$ | $0.8 < x1 < 0.9$ | 62 | |

After that, the resist layer R including ring-shaped openings W with nonuniform widths for 40 channels was formed on a surface of the contact layer 19. At that time, each of the openings W included a pair of arc-shaped openings W1 with a width Ly in a radial direction of 5 μm and a width Lx in a circumferential direction of 5 μm and a pair of arc-shaped openings W2 with a width ΔR in a radial direction of 2 μm in communication with the pair of openings W1.

Next, etching was performed from the contact layer 19 by a reactive ion etching (RIE) method using the resist layer R as a mask. Thereby, the groove 22A was formed corresponding to the opening W1, and the groove 22B was formed corresponding to the opening W2, and the mesa section 21 was formed in a part surrounded by the grooves 22A and 22B.

Next, an oxidation process was performed at high temperature in a water vapor atmosphere, and Al of the second refractive index layer 13D and the fourth refractive index layer 13F in the low refractive index layer 13A and Al of the $Al_{x13}Ga_{1-x13}As$ layer 17D were selectively oxidized from the inside of the groove section 22 so as form the oxidation sections 31 and 32 and the current narrowing region 17A.

Next, after silicon oxide was deposited all over the surfaces of the mesa section 21, the groove section 22 and a region around the groove section 22 by a CVD method, a part corresponding to a top surface of the mesa section 21 of the silicon oxide deposited was selectively removed by etching to expose the contact layer 19. Next, a metal material was laminated all over the surface by a vacuum deposition method, and then by, for example, selective etching, the upper electrode 24 having the light emission opening 24A was formed on the top surface of the mesa section 21 and the upper electrode pad 25 was formed in a position away from the mesa section 21. Moreover, the connection section 26 was formed by plating to electrically connect the upper electrode 24 and the upper electrode pad 25 to each other, and after the back surface of the substrate 10 was polished to adjust the thickness of the substrate 10, the lower electrode 27 was formed on the back surface of the substrate 10. Thus, the laser array including the laser diodes 1 was completed.

Figure 32A:
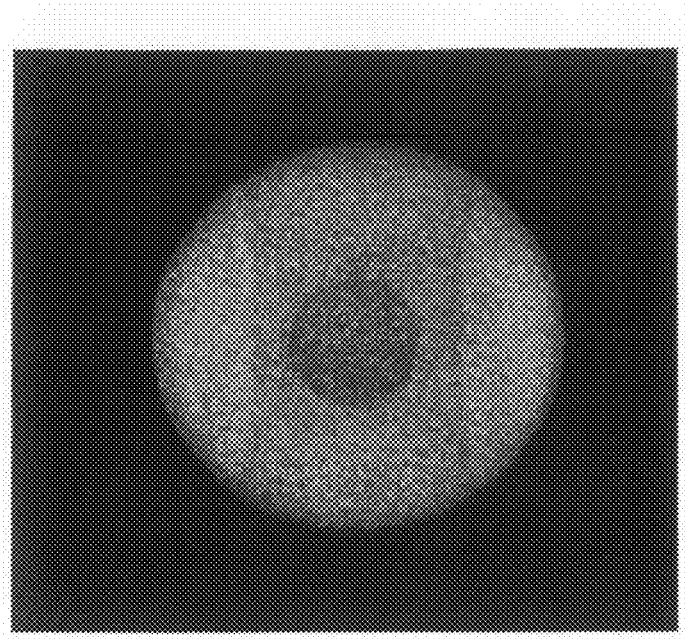
FIGS. 32A and 32B are an infrared microscope photograph and a schematic view from a light emission opening side of an oxidation section and a current narrowing layer in an example, respectively.
Figure 32B:
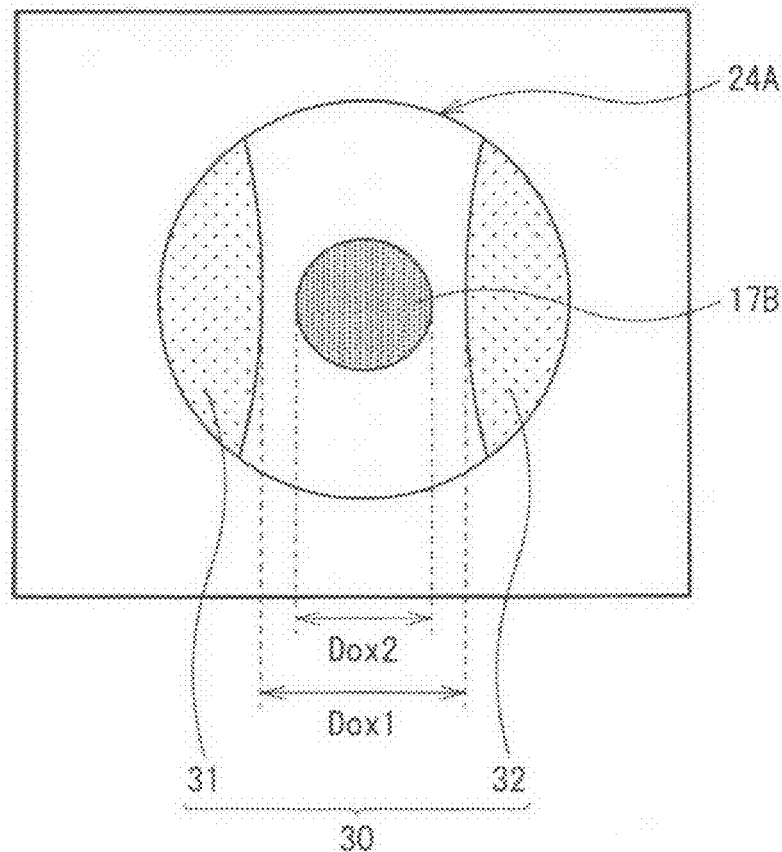

In each laser diode 1 of Example 1, the oxidation section 30 and the current narrowing region 17A were observed from the light emission opening 24A side with an infrared microscope. FIGS. 32A and 32B illustrate photographs of a representative example by the result. FIG. 32A is a photograph taken by the infrared microscope from the light emission opening 24A side, and FIG. 32B is a schematic view of the photograph of FIG. 32A. Thus, the oxidation sections 31 and 32 (the oxidation layers 31A and 32A) were arranged in a region surrounded by the groove 22A so as to face each other with the region corresponding to the current injection region 17B. Moreover, the distance Dox1 between the oxidation sections 31 and 32 was larger than the diameter Dox2 of the current injection region 17B.

Figure 33A:
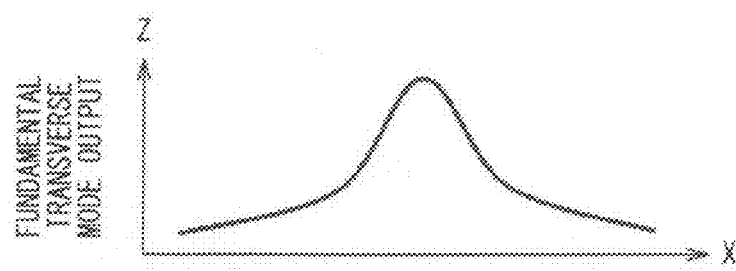
FIGS. 33A and 33B are plots of a stress distribution applied to an active layer in the example.
Figure 33B:
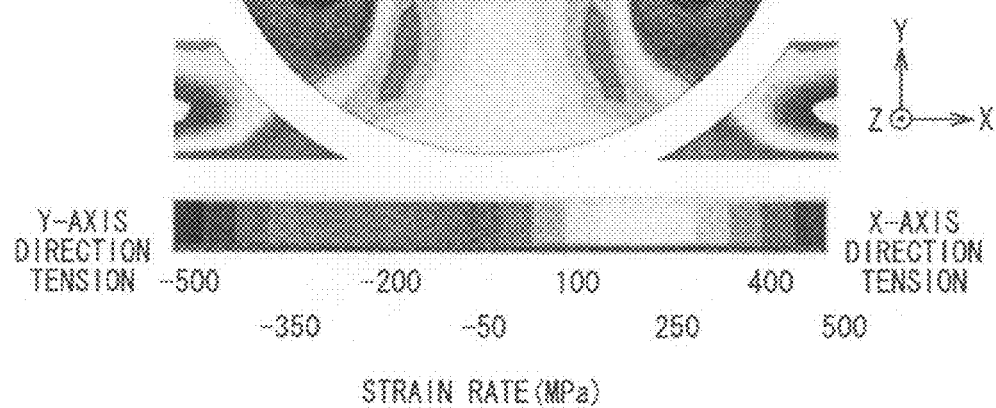

Moreover, when a stress generated in the active layer 16 was simulated, a result illustrated in FIGS. 33A and 33B was obtained. FIG. 33A illustrates a fundamental transverse mode output distribution in the laser diode 1, and FIG. 33B illustrates a stress simulation result (a strain rate distribution). In addition, in FIGS. 33A and 33B, a direction where the grooves 22A faced each other is an x-axis direction, a direction where the groove 22B faced each other is a y-axis direction, and a direction perpendicular to the active layer 16 is an x-axis direction. Moreover, in the strain rate in FIG. 33B, a plus value and a minus value represent tensile strain and compressive strain, respectively. As illustrated in FIG. 33B, in the active layer 16, regions having strong compressive strain in the x-axis direction (regions having a minus value) were arranged so as to face each other with a region corresponding to the current injection region 17B (the light emission region 16A) in between. Therefore, FIG. 33B illustrates a distribution of a value obtained by subtracting tensile strain in the Y-axis direction from tensile strain in the X-axis direction (tensile strain in the X-axis direction-tensile strain in the Y-axis direction) in the active layer 16. Then, the strain rate in the region corresponding to the current injection region 17B of the active layer 16 was a plus value. Therefore, in the light emission region 16A, tensile strain in the X-axis direction was strong, so it was suggested that the polarization of laser light was aligned in the Y-axis direction.

Comparative Example 1

A lens array was formed by the same steps as those in Example 1, except that the second lower DBR mirror layer 13 of the lower DBR mirror layer 11 was formed as illustrated in Table 2.

TABLE 2

| COMPARATIVE EXAMPLE 1 | | | MATERIAL | | THICKNESS | NUMBER |
|---|---|---|---|---|---|---|
| | | | COMPOSITION FORMULA | y1 to y4 | (nm) | OF PAIRS |
| SECOND LOWER DBR MIRROR LAYER | HIGH REFRACTIVE INDEX LAYER | | n-type $Al_{y4}Ga_{1-y4}As$ | $0.3 \leq y4 < 0.4$ | 57 | 10 |
| | LOW REFRACTIVE INDEX LAYER | THIRD REFRACTIVE INDEX LAYER | n-type $Al_{y3}Ga_{1-y3}As$ | y3 = 0.9 | 23.5 | |
| | | SECOND REFRACTIVE INDEX LAYER | n-type $Al_{y2}Ga_{1-y2}As$ | y2 = 1 | 15 | |
| | | FIRST REFRACTIVE INDEX LAYER | n-type $Al_{y1}Ga_{1-y1}As$ | y1 = 0.9 | 23.5 | |

Figure 34A:
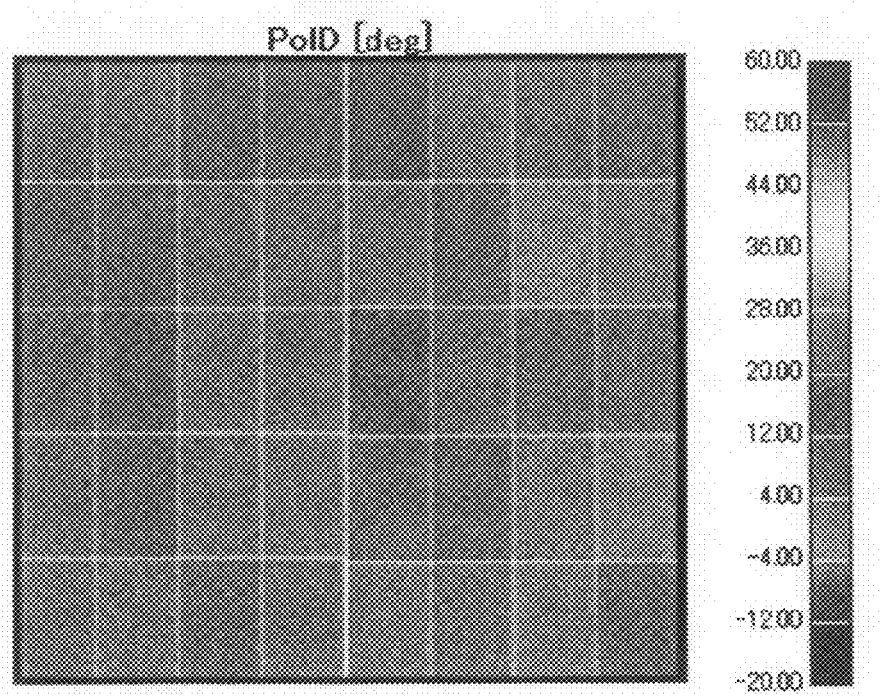
FIGS. 34A and 34B are a plot illustrating the displacement amount of a polarization direction of laser light and a plot illustrating a relationship between an injection current and light output and a relationship of the change amount of the light output with respect to the change amount of the injection current in the example, respectively.
Figure 34B:
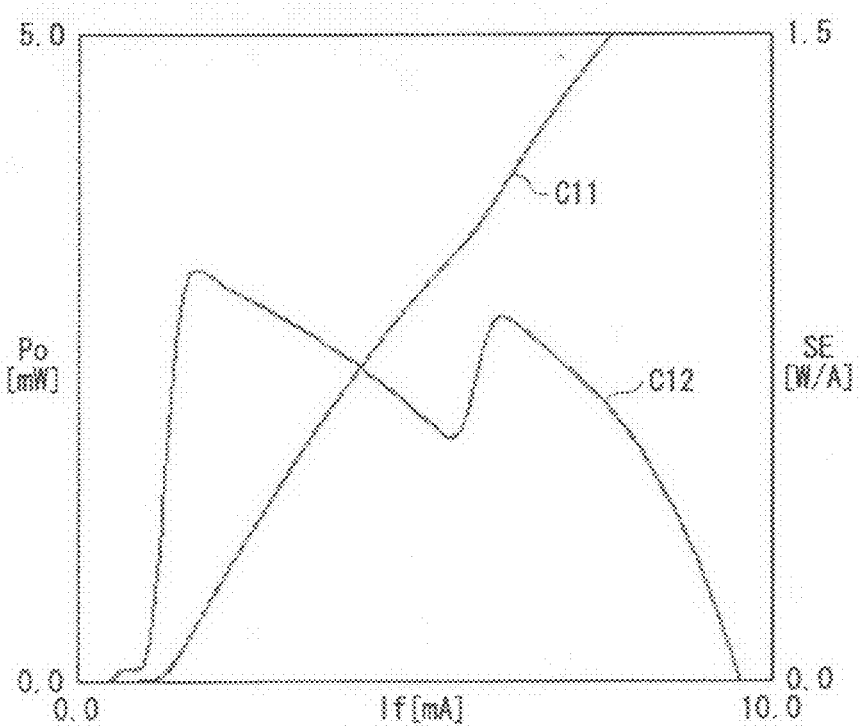
Figure 35A:
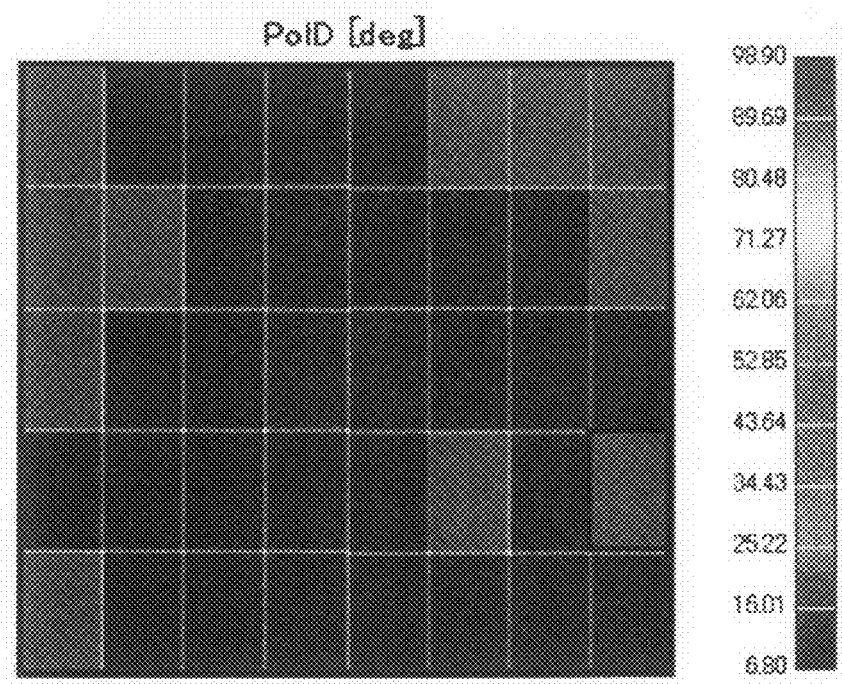
FIGS. 35A and 35B are a plot illustrating the displacement amount of a polarization direction of laser light in a comparative example, and a plot illustrating a relationship between an injection current and light output and a relationship of the light output with respect to the change amount of the injection current in the comparative example, respectively.
Figure 35B:
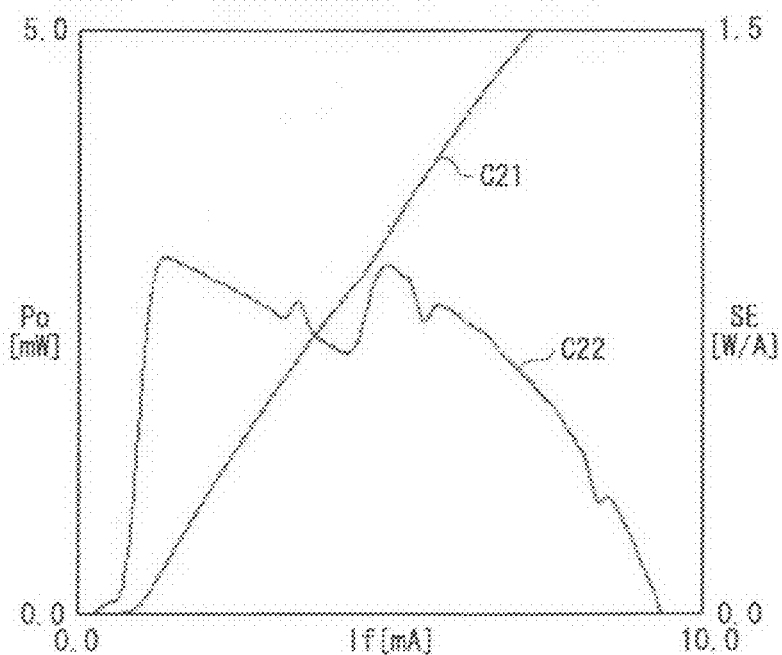

When the angle change amount of a polarization component when changing an injection current in an atmosphere at 60° C. and I-L characteristics of the laser arrays of Example 1 and Comparative Example 1 were examined, results illustrated in FIGS. 34A, 34B, 35A and 35B were obtained. FIGS. 34A and 34B illustrate the results of Example 1, and FIGS. 35A and 35B illustrates results of Comparative Example 1. FIGS. 34A and 35A illustrate the angle change amount (PoLD: °) of the polarization component with a light output of 2.5 mW when an injection current was changed in an atmosphere at 60° C., and partitions arranged in a pattern of 5 partitions high by 8 partitions represent channels, respectively. Moreover, FIGS. 34B and 35B illustrate a relationship of a light output (Po) with respect to an injection current (If) (I-L characteristics: curves C11 and C21) and a relationship of a change amount (SE) of light output (curves C12 and C22) with respect to the change amount of the injection current in each injection current value.

As illustrated in FIGS. 34A and 34B, in Example 1 including a plurality of oxidation layers 31A and 32A nonuniformly distributed in each low refractive index layer 13A, in all of 40 channels, the polarization direction of laser diode was fixed in one direction (refer to FIG. 34A). The result of the I-L characteristics of Example 1 indicated that fundamental transverse mode oscillation occurred at a injection current of 1 mA or over, and then high-order transverse mode oscillation occurred at an injection current of 6 mA or over (refer to FIG. 34B). It was obvious from the result that in Example 1, laser light was allowed to oscillate with high output, and an inflection point indicating that the polarization direction was rotated was not observed during fundamental transverse mode oscillation and high-order transverse mode oscillation (refer to curves C11 and C12). On the other hand, as illustrated in FIGS. 35A and 35B, in Comparative Example 1 having one oxidation layer nonuniformly distributed in each low refractive index layer, the polarization direction was rotated by approximately 90° in 11 channels (channels indicated by red in FIG. 35A). In the channels where the polarization direction was rotated at approximately 90° in Comparative Example 1, a plurality of inflection points indicating that the direction of the polarization component was rotated during fundamental transverse mode oscillation and high-order transverse mode oscillation were observed (refer to curves C21 and C22 in FIG. 35B).

Therefore, in the surface-emitting laser diode in which a pair of oxidation sections 31 and 32 facing each other with the region corresponding to the current injection region 17B in the second lower DBR mirror layer 13 had an anisotropic distribution in a direction where the grooves 22A faced each other, the following was confirmed. That is, the oxidation sections 31 and 32 were formed in the low refractive index layer 13A as a plurality of oxidation layers 31A and 32A, thereby a tension stress in a direction where the oxidation sections 31 and 32 faced each other was strongly generated in the active layer 16. Therefore, variations among individual laser diodes did not occur, and the polarization direction of laser light was fixed and stabilized in one direction.

Although the present invention is described referring to the embodiments, the modifications thereof and the example, the invention is not limited thereto, and may be variously modified.

Figure 36:
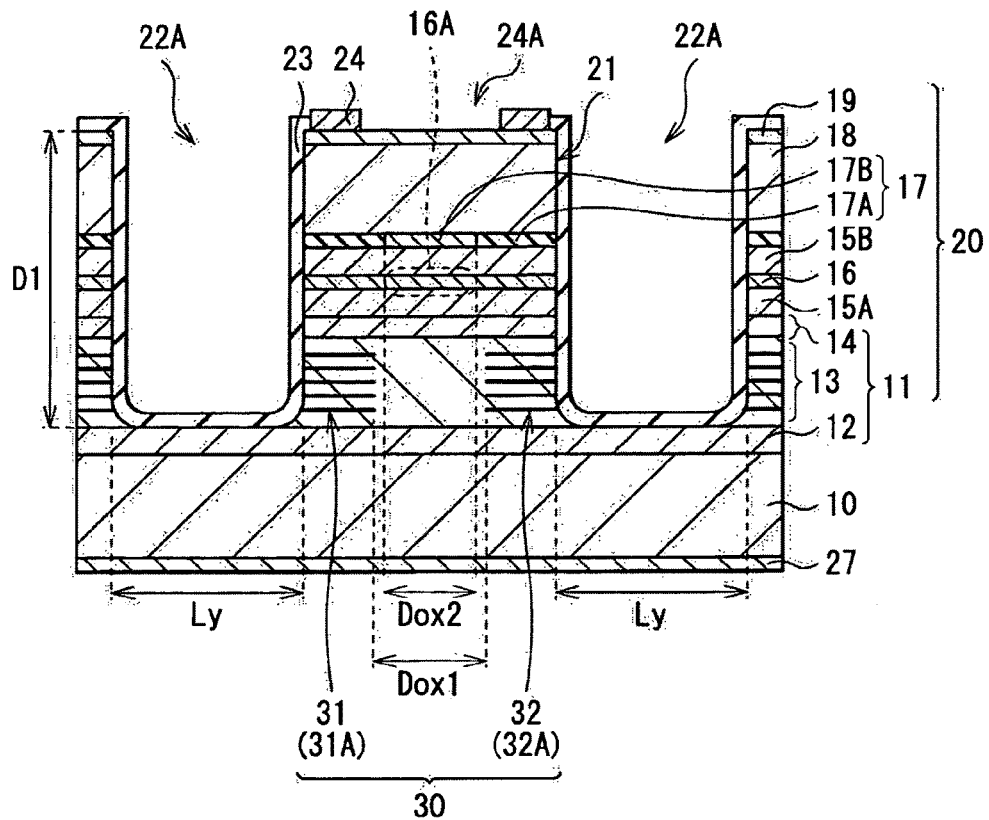
FIG. 36 is a sectional view of a modification of the laser diode in FIG. 2.
Figure 37:
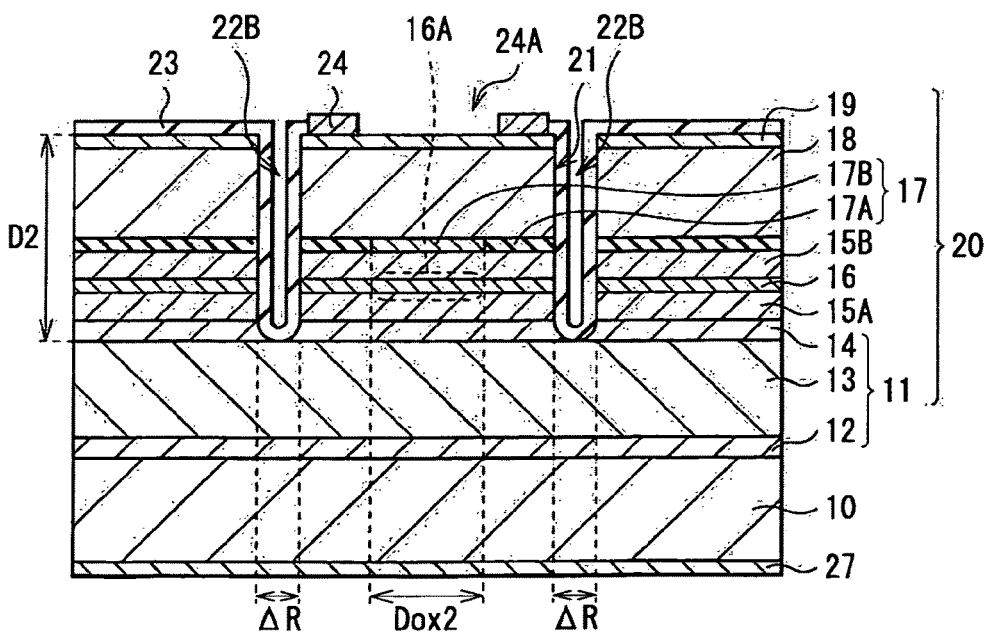
FIG. 37 is a sectional view in a direction orthogonal to a cutting direction of the laser diode in FIG. 36.
Figure 38:
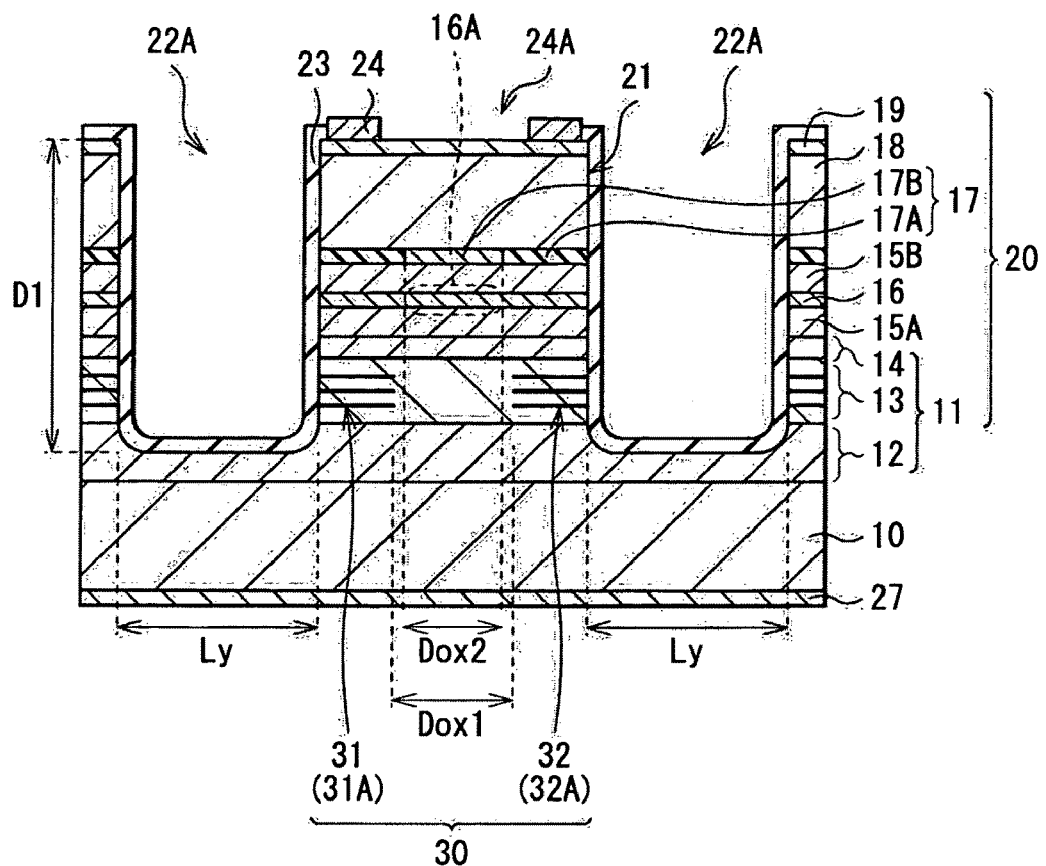
FIG. 38 is a sectional view of another modification of the laser diode in FIG. 2.
Figure 39:
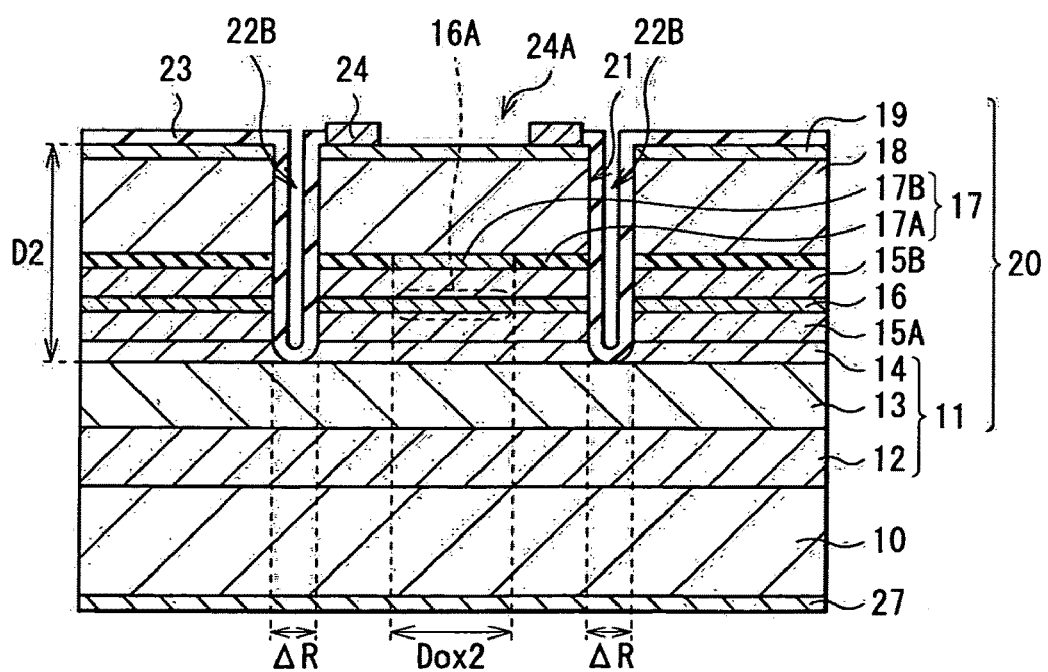
FIG. 39 is a sectional view in a direction orthogonal to a cutting direction of the laser diode in FIG. 38.

For example, as illustrated in FIGS. 36 and 37, the bottom of the groove section 22 (the grooves 22A and 22B) may have a tapered shape. In this case, in the above-described surface-emitting laser diodes 1 to 3, there is a possibility that the tapered shape varies among individual surface-emitting laser diodes, thereby to cause variations in the numbers or distribution of the oxidation layers 31A and 32A among the individual laser diodes. When the tapered shape or the depth of the groove 22A varies, the magnitude of a stress applied to the active layer 16 may vary among individual laser diodes. In such a case, the laminate configuration 20 has the same configuration as that of the laser diode 1, and as illustrated in FIGS. 38 and 39, the groove 22A is formed so as to reach a midpoint of the first lower DBR mirror layer 12, and the groove 22B is formed so as not to reach the second lower DBR mirror layer 13. Thereby, even if the bottom of the groove section 22 has a tapered shape, the tapered shape of the bottom does not reach the second lower DBR mirror layer 13, so an adverse influence due to variations in the tapered shape is not exerted on the distribution of the oxidation layers 31A and 32A. Therefore, variations in the magnitude of a stress applied to the active layer 16 among individual laser diode are preventable.

Figure 40:
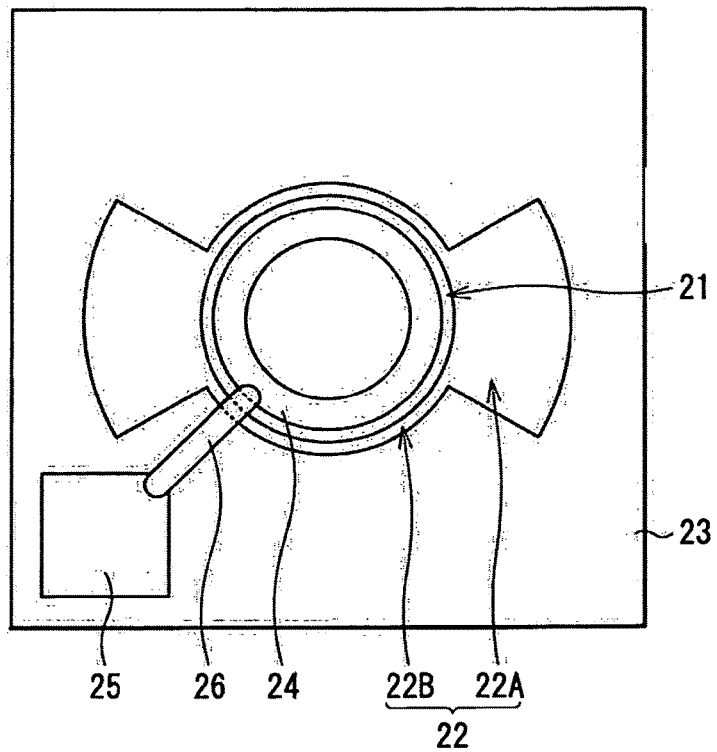
FIG. 40 is a top view of a modification of the laser diode in FIG. 1.
Figure 41:
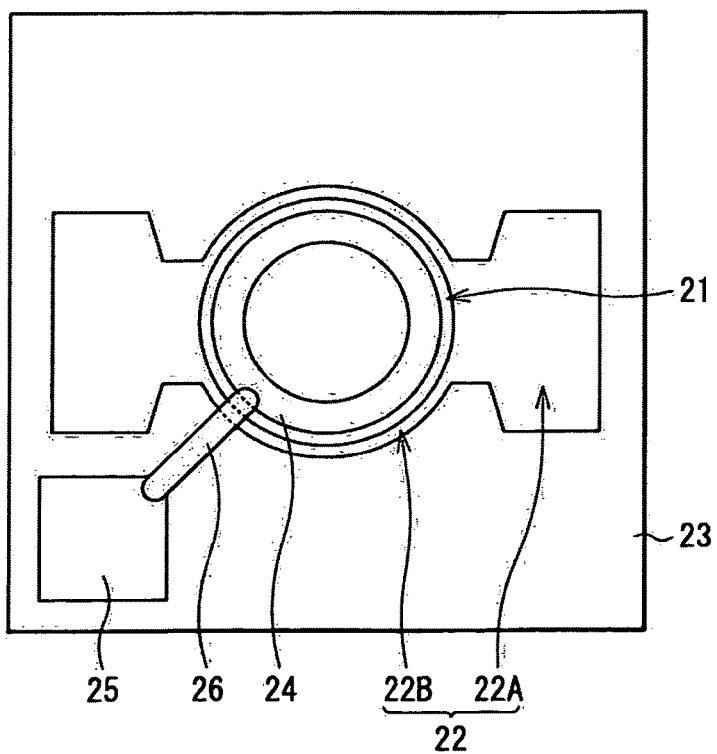
FIG. 41 is a top view of another modification of the laser diode in FIG. 1.

Moreover, in the above-described embodiments and the like, the shape of the groove 22A viewed from a top surface side is a substantially quadrilateral shape, but, for example, the shape of the groove 22A may be the shape of a sector as illustrated in FIG. 40 or the shape of a sectional surface of a nail as illustrated in FIG. 41.

Figure 42:
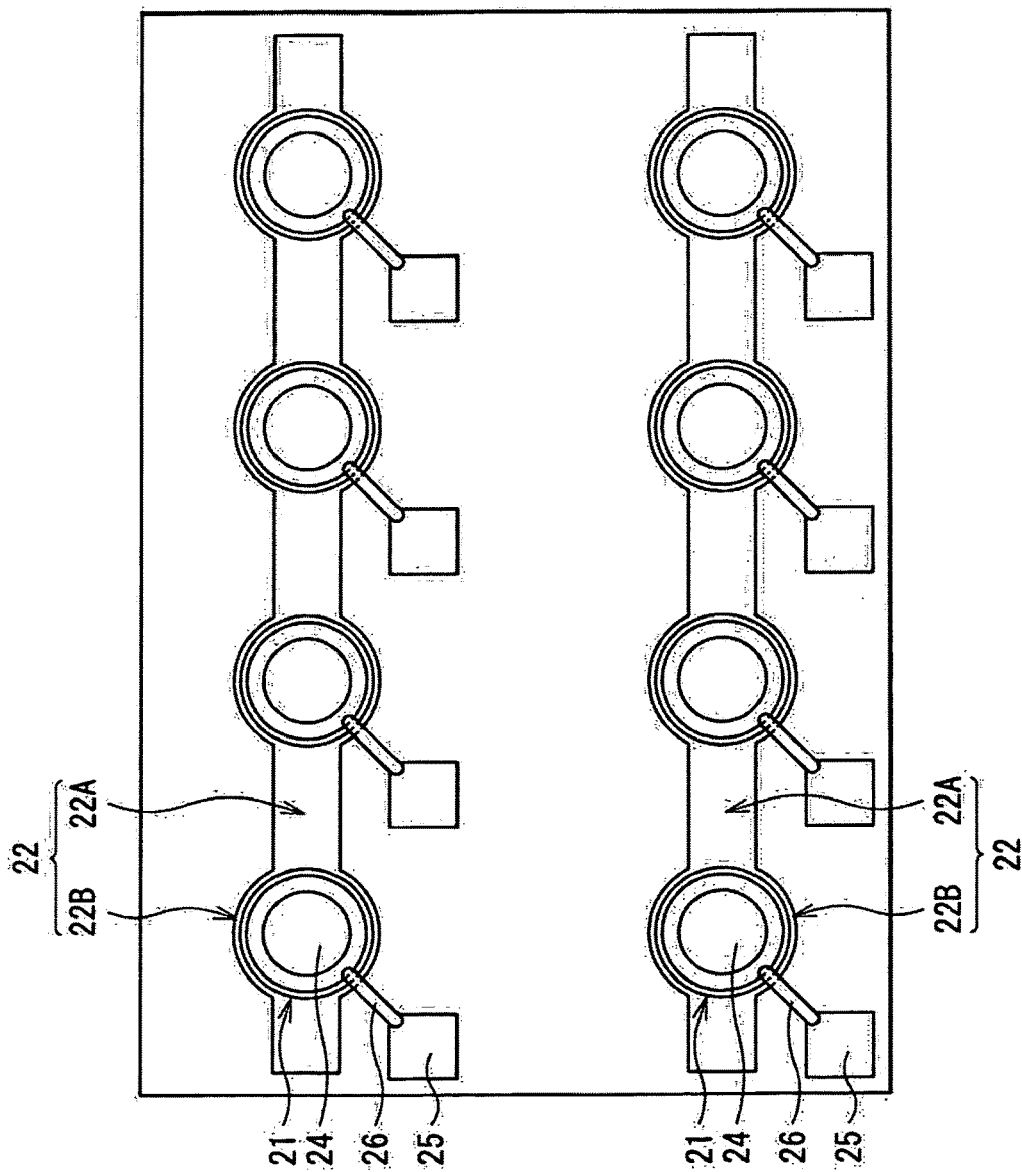
FIG. 42 is a top view of still another modification of the laser diode in FIG. 1.
Figure 43:
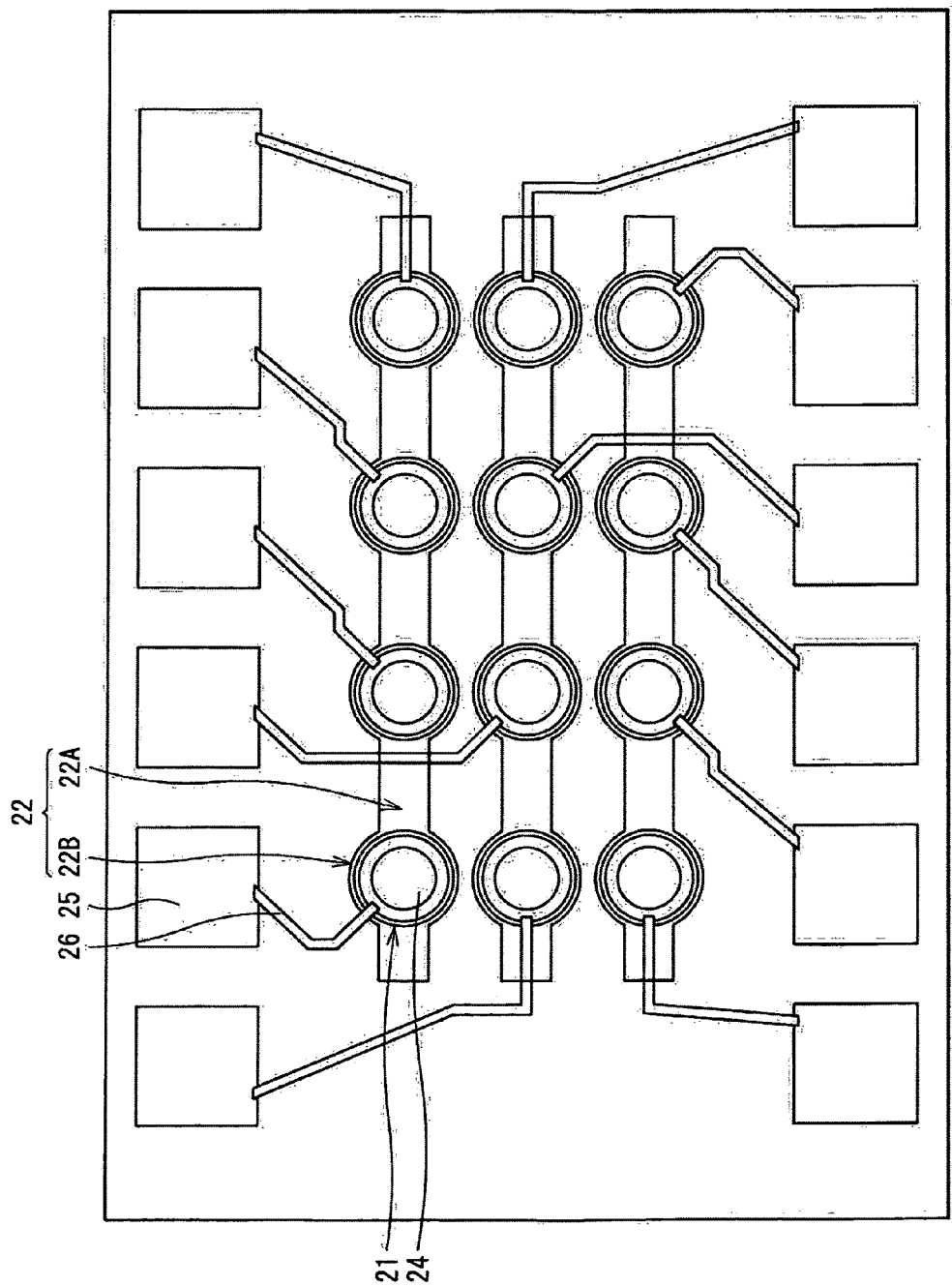
FIG. 43 is a top view of a further modification of the laser diode in FIG. 1.
Figure 44:
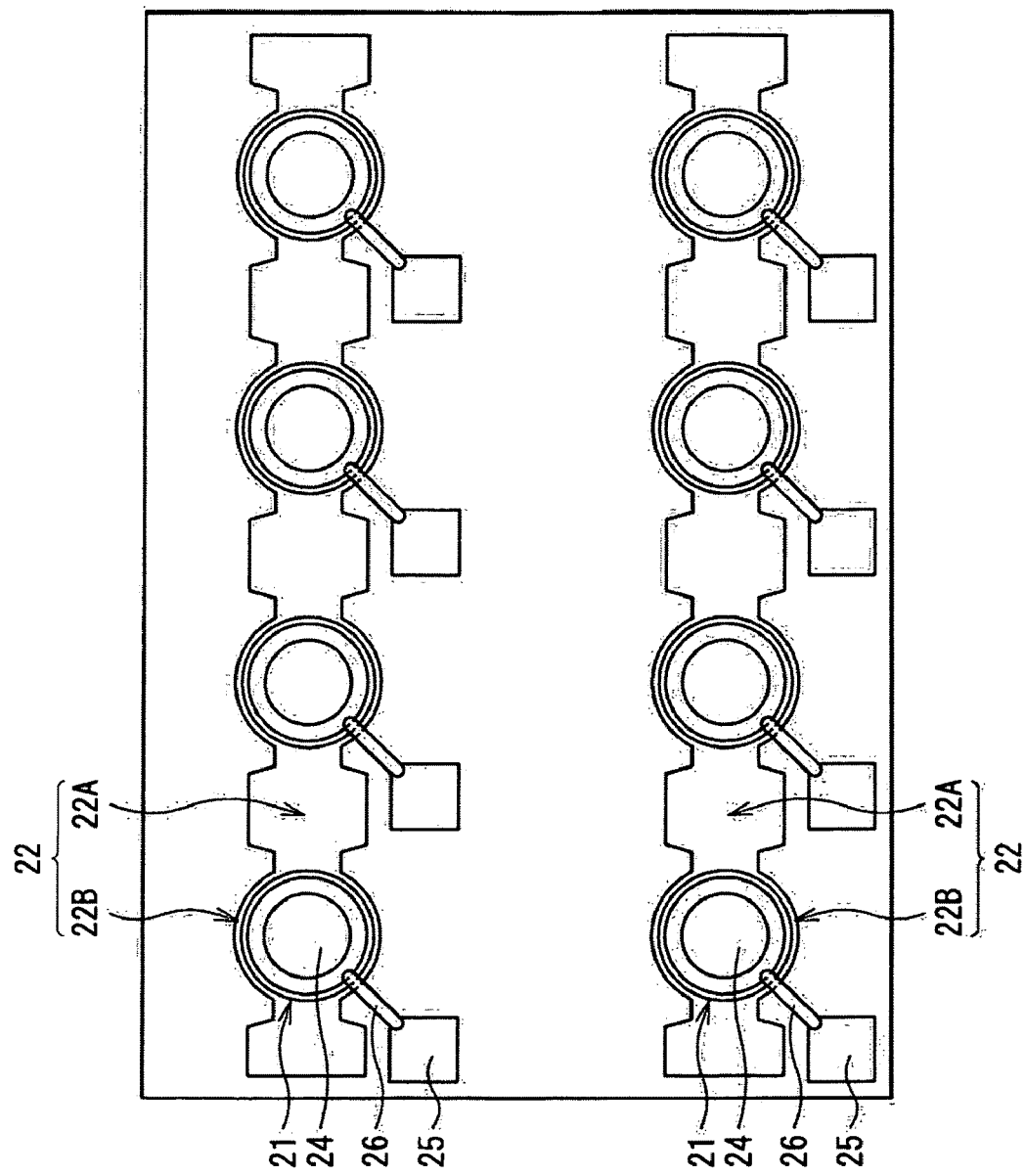
FIG. 44 is a top view of a modification of the laser diode in FIG. 41.
Figure 45:
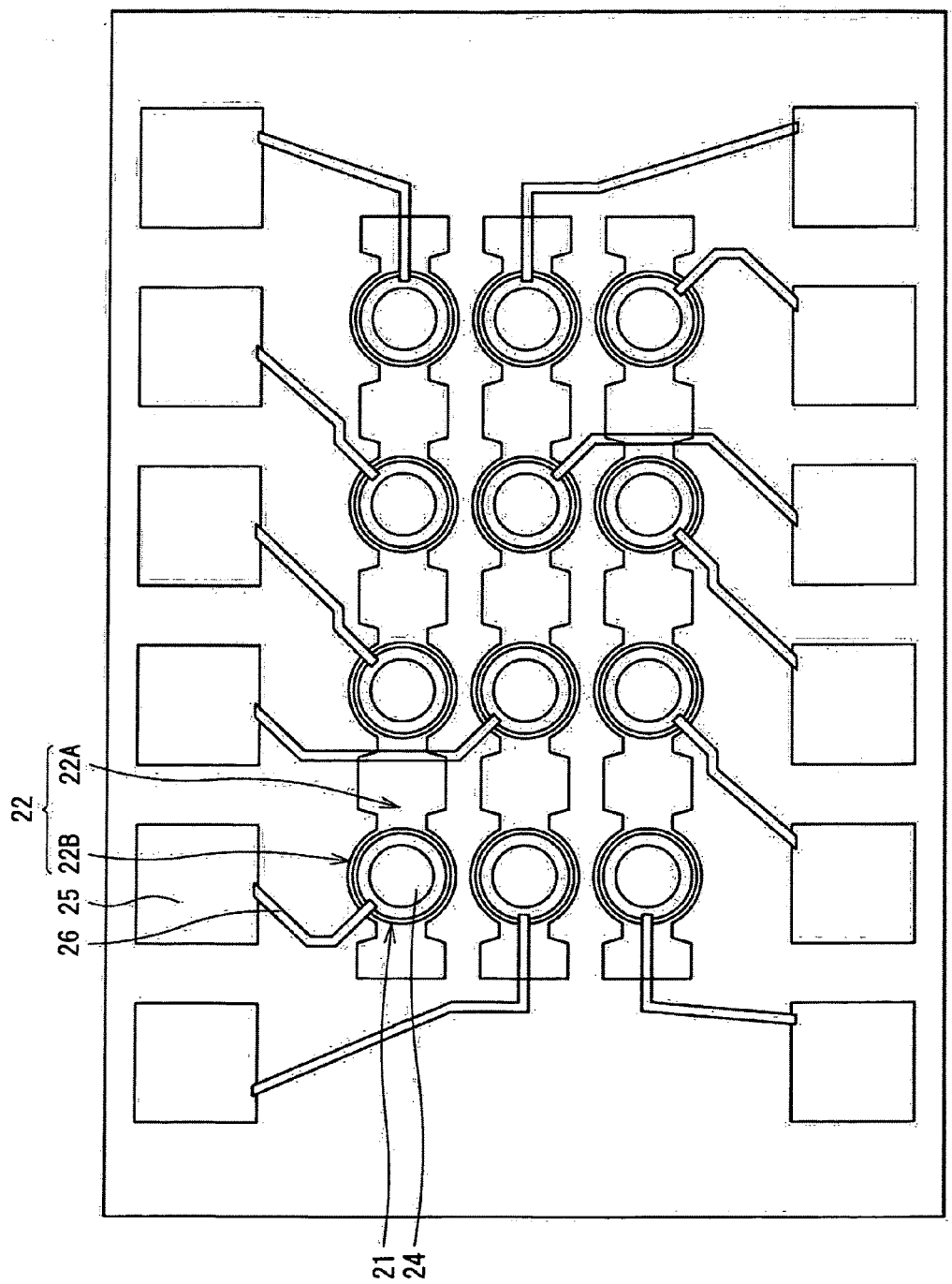
FIG. 45 is a top view of another modification of the laser diode in FIG. 41.

In the above-described embodiments and the like, the case where only one mesa section 21 is arranged is described. However, as illustrated in FIGS. 42 and 43, a plurality of mesa sections 21 may be arranged in an array form, and groove sections 22 around the mesa sections 21 may be formed in communication with one another. At this time, the groove sections 22 may have the shape of a sectional surface of a nail as illustrated in FIGS. 44 and 45. Thus, in the case where the groove sections 22 around the mesa sections 21 are formed in communication with one another, in a wafer before dicing the surface-emitting laser diodes 1 into chips, warpage of the whole wafer caused by epitaxial crystal growth is allowed to be reduced. Thereby, the warpage amount remaining in each chip after dicing is allowed to be reduced, and variations in the warpage amount among chips are allowed to be reduced.

Figure 46:
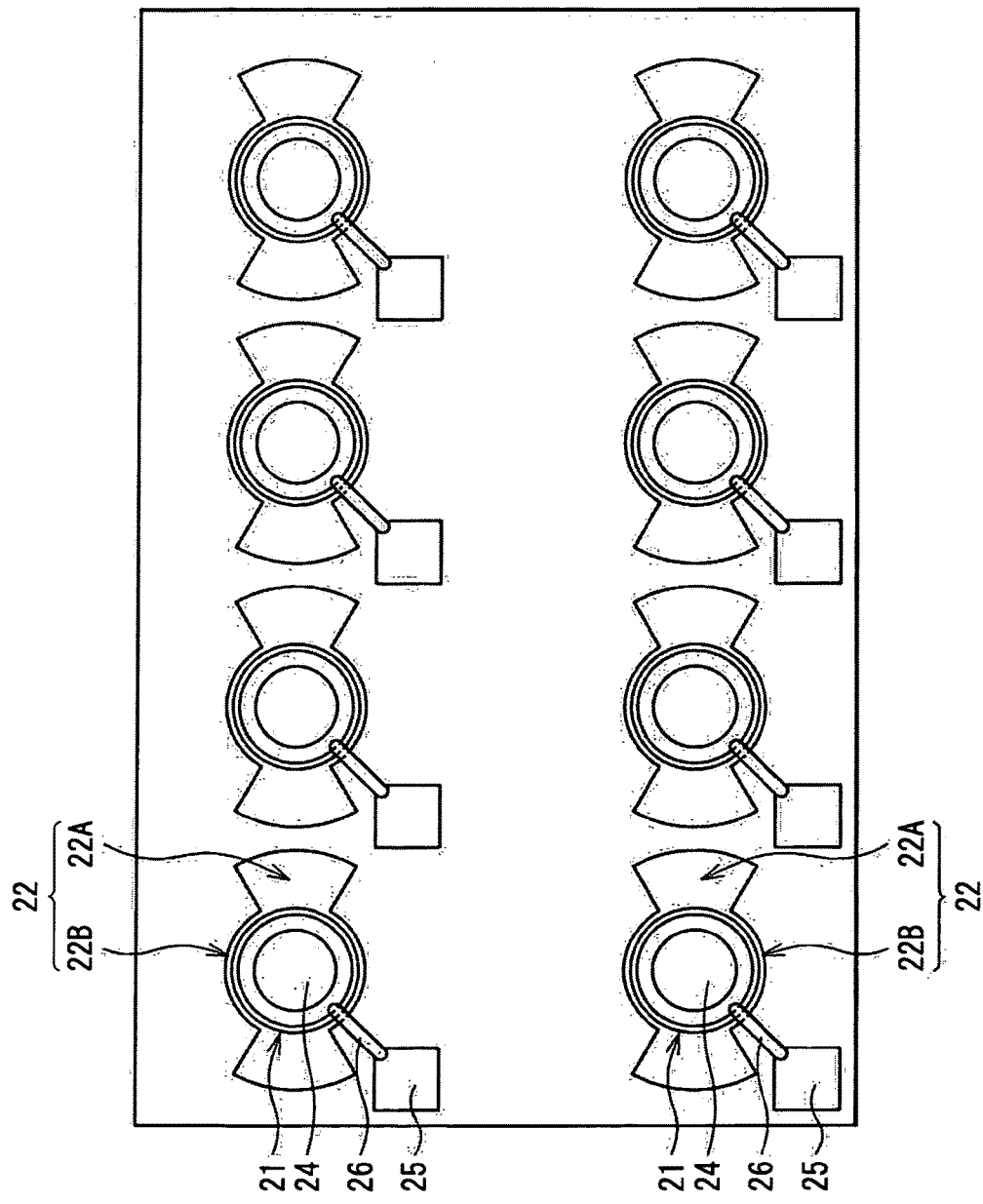
FIG. 46 is a top view of a modification of the laser diode in FIG. 40.
Figure 47:
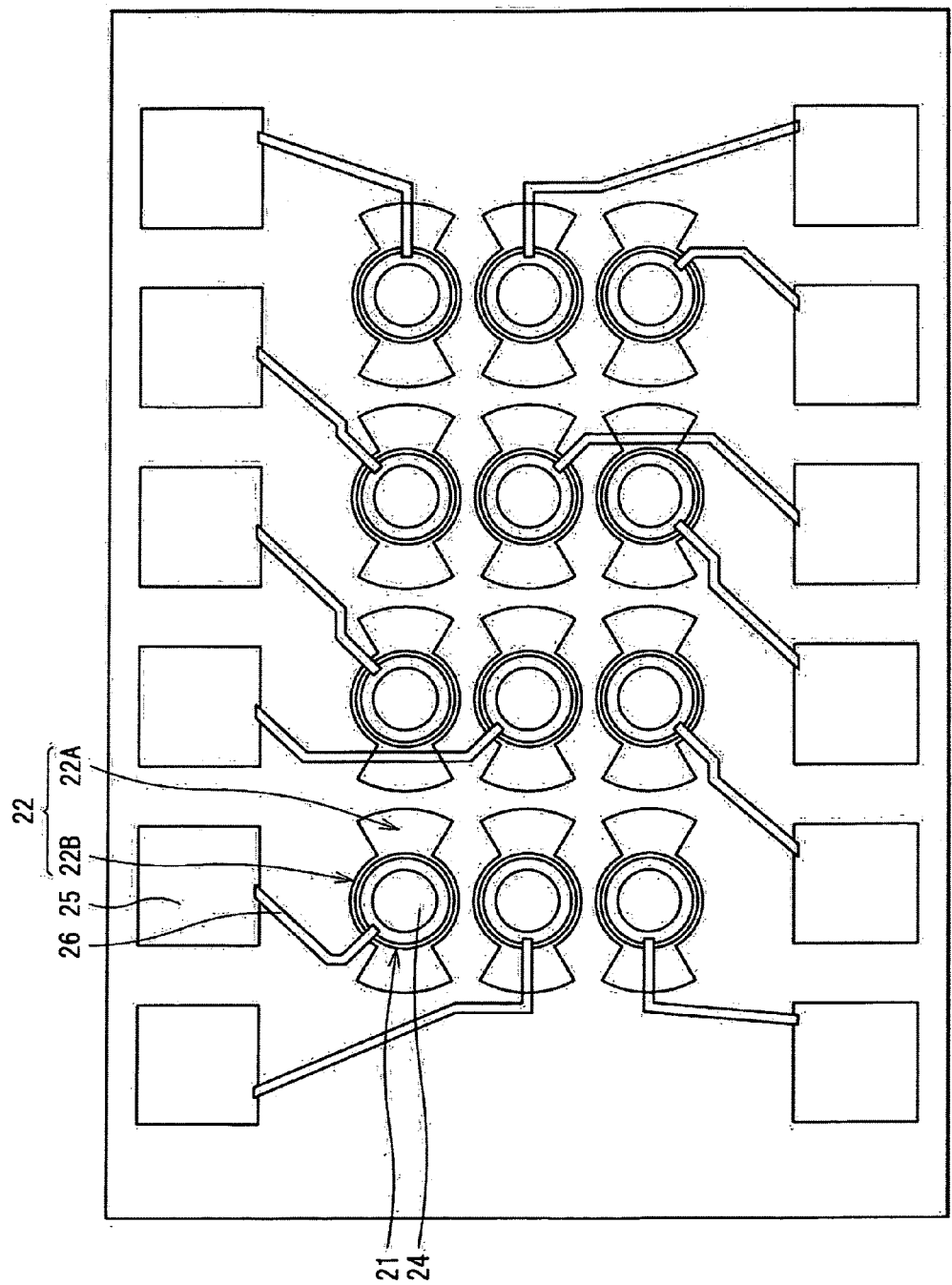
FIG. 47 is a top view of another modification of the laser diode in FIG. 40.
Figure 48:
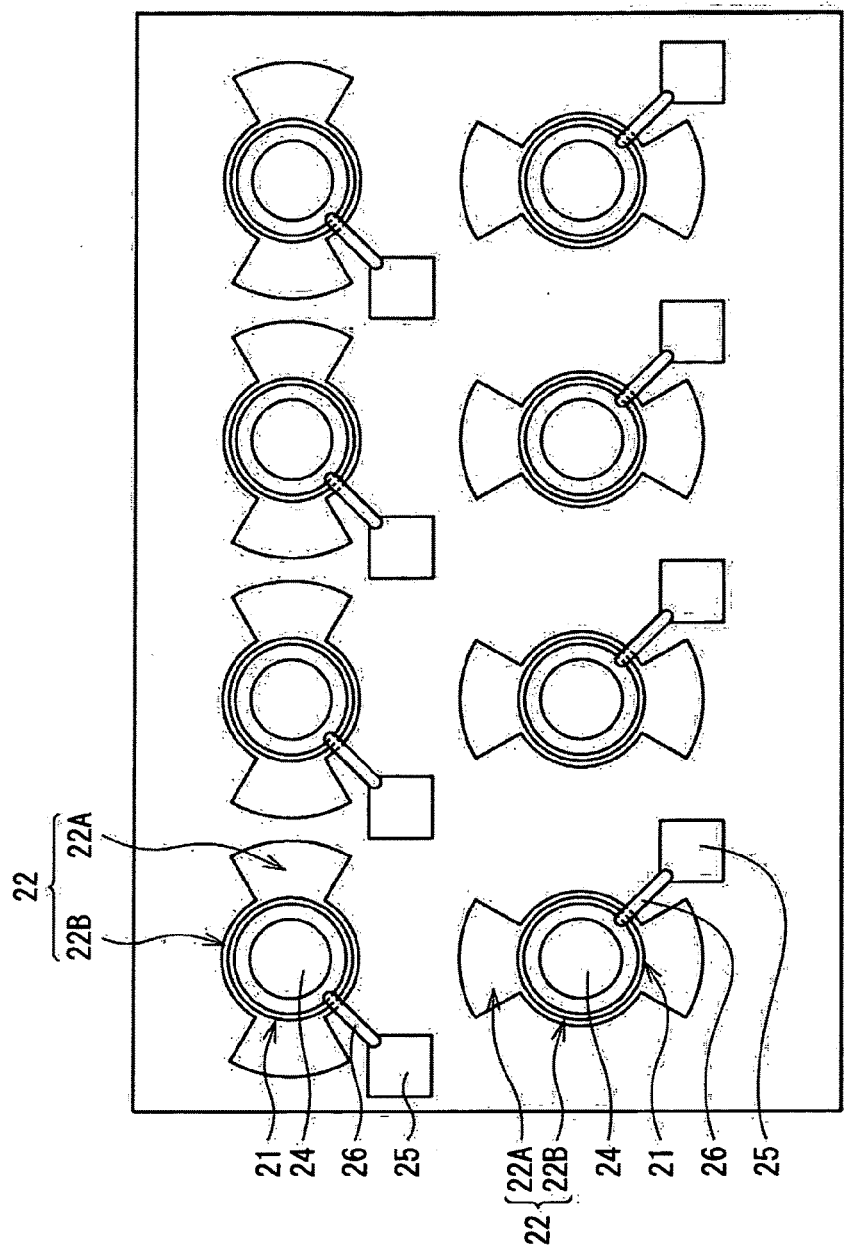
FIG. 48 is a top view of still another modification of the laser diode in FIG. 40.
Figure 49:
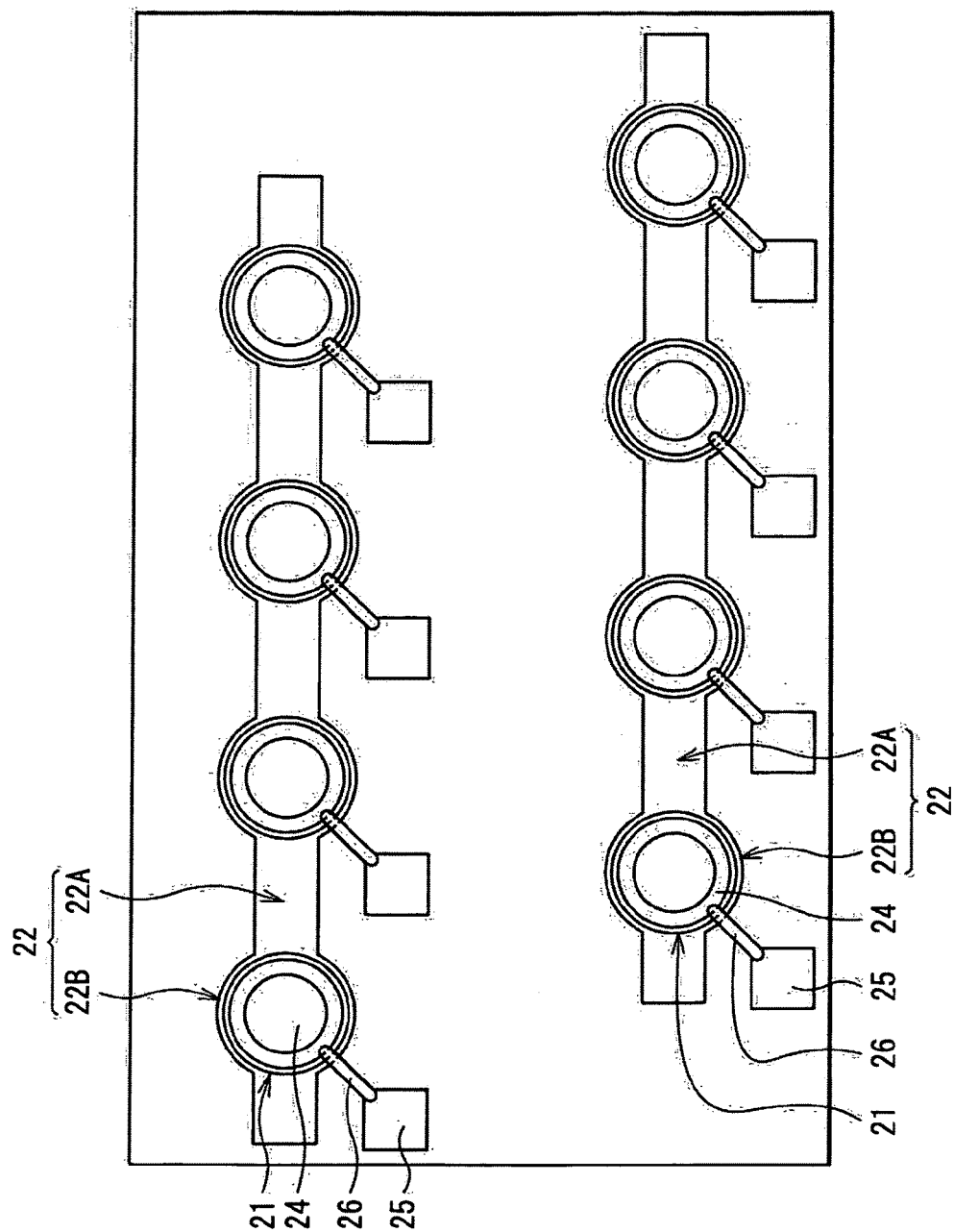
FIG. 49 is a top view of a modification of the laser diode in FIG. 42.

Moreover, in the case where the groove sections 22 each have the shape of a sector, as illustrated in FIGS. 46 and 47, when the directions where the grooves 22A face each other of the groove sections 22 are the same, a polarization component of laser light emitted from the light emission opening 24A of each mesa section 21 is fixed in one direction, and as a result, while high output is achieved, the polarization direction of laser light is allowed to be stabilized in one direction. However, as illustrated in FIG. 48, in the case where the directions where the grooves 22A face each other of the groove sections 22 are alternately different, the surface-emitting laser diode is driven so that a period of applying a voltage to each mesa section 21 surrounded by the groove section 22 in which the direction where the grooves 22A face each other is fixed in one direction and a period of applying a voltage to each mesa section 21 surrounded by the groove section 22 in which the direction where the grooves 22A face each other is fixed in another direction do not overlap each other, thereby while the polarization direction of laser light is stabilized in one direction, the polarization direction is switchable as necessary. Moreover, as illustrated in FIG. 49, a plurality of mesa sections 21 included in one array and a plurality of mesa sections 21 included in another array may be alternately arranged.

In the above-described embodiments and the like, the invention is described referring an AlGaAs-based compound laser diode as an example. However, the invention is applicable to any other compound laser diode, for example, a GaInP-based, AlGaInP-based, InGaAs-based, GaInP-based, InP-based, GaN-based, GaInN-based, or GaInNAs-based compound semiconductor laser diode.

In the above-described embodiments and the like, the case where the oxidation section for generating a nonuniform stress in the active layer 16 is formed in the lower DBR mirror layer 11 is described. However, the oxidation section may be formed in the upper DBR mirror layer 18. Also in this case, when a laser diode includes the oxidation section as a plurality of oxidation layers nonuniformly distributed in a direction rotating around the central axis of the mesa section 21 in a region around a region corresponding to the current injection region 17B in one or more low refractive index layer in the upper DBR mirror layer 18, the laser diode functions as those in the above-described embodiments and the like, and the same effects as those in the above-described embodiments and the like are obtained.

In the above-described embodiments and the like, the laminate configuration 20 is described as a laminate in which first lower DBR mirror layer 11 and the like are laminated, but the "laminate" does not eliminate the possibility that the laminate configuration 20 includes any other layer in addition to the first lower DBR mirror layer 11 and the like. In other words, the laminate configuration 20 may include any other layer in addition to the first lower DBR mirror layer 11 and the like. In addition, the same holds true in, for example, a configuration in which the first lower DBR mirror layer 11 and the like are laminated.

In the above-described embodiments and the like, description about an appropriate value range of the Al composition, optical thickness or the like of the low refractive index layer in which the oxidation section is formed is given, but the description does not completely eliminate the possibility that the Al composition, optical thickness or the like of the low refractive index layer in which the oxidation section was formed is out of the appropriate range. More specifically, the above-described appropriate range is a specifically preferable range for obtaining the effects of the invention, and as long as the effect of the invention is obtainable, the Al composition, optical thickness or the like of the low refractive index layer in which the oxidation section is formed may be out of the range to some extent.

The present application contains subject matter related to that disclosed in Japanese Priority Patent Application JP 2009-054677 filed in the Japan Patent Office on Mar. 9, 2009, the entire content of which is hereby incorporated by references.

It should be understood by those skilled in the art that various modifications, combinations, sub-combinations and alterations may occur depending on design requirements and other factors insofar as they are within the scope of the appended claims or the equivalents thereof.

What is claimed is:

1. A laser diode comprising
a laminate configuration including a lower multilayer reflecting mirror, an active layer and an upper multilayer reflecting mirror in order from a substrate side,
wherein the laminate configuration includes a columnar mesa section including an upper part of the lower multilayer reflecting mirror, the active layer and the upper multilayer reflecting mirror, and
the lower multilayer reflecting mirror includes a first lower multilayer mirror section and a second lower multilayer mirror section with each having a plurality of pairs of a low refractive index layer and a high refractive index layer, and a third lower multilayer mirror section disposed between the first and second multilayer mirror sections and having a plurality of pairs of the low refractive index layer and the high refractive index layer and a plurality of oxidation layers nonuniformly distributed in a direction rotating around a central axis of the mesa section in a region except for a central region of one or more of the low refractive index layers of the third multilayer mirror section.

2. The laser diode according to claim 1, wherein one or more of the plurality of oxidation layers include a first oxidation section and a second oxidation section arranged so as to face each other with the central axis of the mesa section in between.

3. The laser diode according to claim 1, wherein an optical distance $L_1$ in a thickness direction of the low refractive index layer including the oxidation layer satisfies $L_1 \geq \lambda/4$ where $\lambda$ indicates wavelength of light emitted from the active layer.

4. The laser diode according to claim 3, wherein the optical distance $L_1$ satisfies $\lambda/4 \leq L_1 \leq 1.4 \times (\lambda/4)$, and an optical distance $L_2$ in a thickness direction of one of high refractive index layers adjacent to the low refractive index layer including the oxidation layer satisfies $0.6 \times (\lambda/4) \leq L_2 \leq \lambda/4$.

5. The laser diode according to claim 4, wherein the optical distance $L_1$ satisfies $\lambda/4 \leq L_1 \leq 1.2 \times (\lambda/4)$, and the optical distance $L_2$ satisfies $0.8 \times (\lambda/4) \leq L_2 \leq \lambda/4$.

6. The laser diode according to claim 1, wherein the lower multilayer reflecting mirror includes a first multilayer film relatively resistant to oxidation, a second multilayer film relatively susceptible to oxidation and a third multilayer film relatively resistant to oxidation in order from the substrate side, and
the oxidation layer is formed in the second multilayer film.

7. A laser diode, comprising
a laminate configuration including a lower multilayer reflecting mirror, an active layer and an upper multilayer reflecting mirror in order from a substrate side,
wherein the laminate configuration includes a columnar mesa section including an upper part of the lower multilayer reflecting mirror, the active layer and the upper multilayer reflecting mirror, and
the lower multilayer reflecting mirror includes a plurality of pairs of a low refractive index layer and a high refractive index layer, and a plurality of oxidation layers nonuniformly distributed in a direction rotating around a central axis of the mesa section in a region except for a central region of one or more of the low refractive index layers, wherein
the lower multilayer reflecting mirror includes a first multilayer film relatively resistant to oxidation, a second multilayer film relatively susceptible to oxidation and a third multilayer film relatively resistant to oxidation in order from the substrate side, and
the oxidation layer is formed in the second multilayer film, and wherein
the first multilayer film includes a plurality of pairs of a low refractive index layer including $Al_{x1}Ga_{1-x1}As$ and a high refractive index layer including $Al_{x2}Ga_{1-x2}As$,
the second multilayer film includes a plurality of pairs of a low refractive index layer and a high refractive index layer including $Al_{x8}Ga_{1-x8}As$, the low refractive index layer configured of a first refractive index layer including $Al_{x3}Ga_{1-x3}As$, a second refractive index layer including $Al_{x4}Ga_{1-x4}As$, a third refractive index layer including $Al_{x5}Ga_{1-x5}As$, a fourth refractive index layer including $Al_{x6}Ga_{1-x6}As$ and a fifth refractive index layer including $Al_{x7}Ga_{1-x7}As$,
the third multilayer film includes a plurality of pairs of a low refractive index layer including $Al_{x9}Ga_{1-x9}As$ and a high refractive index layer including $Al_{x10}Ga_{1-x10}As$, and
x1 to x10 satisfy a mathematical formula represented by a formula (1):

$$1 \geq (x4, x6) > (x1, x3, x5, x7, x9) > 0.8 > (x2, x8, x10) \geq 0 \quad (1).$$

8. The laser diode according to claim 1 wherein
the lower multilayer reflecting mirror includes a second multilayer film relatively susceptible to oxidation and a third multilayer film relatively resistant to oxidation in order from the substrate side, and
the oxidation layer is formed in the second multilayer film.

9. A laser diode, comprising
a laminate configuration including a lower multilayer reflecting mirror, an active layer and an upper multilayer reflecting mirror in order from a substrate side, wherein the laminate configuration includes a columnar mesa section including an upper part of the lower multilayer reflecting mirror, the active layer and the upper multilayer reflecting mirror, and the lower multilayer reflecting mirror includes a plurality of pairs of a low refractive index layer and a high refractive index layer, and a plurality of oxidation layers nonuniformly distributed in a direction rotating around a central axis of the mesa section in a region except for a central region of one or more of the low refractive index layers, wherein the lower multilayer reflecting mirror includes a second multilayer film relatively susceptible to oxidation and a third multilayer film relatively resistant to oxidation in order from the substrate side, and the oxidation layer is formed in the second multilayer film, and wherein the second multilayer film includes a plurality of pairs of a low refractive index layer and a high refractive index layer including $Al_{x8}Ga_{1-x8}As$, the low refractive index layer configured of a first refractive index layer including $Al_{x3}Ga_{1-x3}As$, a second refractive index layer including $Al_{x4}Ga_{1-x4}As$, a third refractive index layer including $Al_{x5}Ga_{1-x5}As$, a fourth refractive index layer including $Al_{x6}Ga_{1-x6}As$ and a fifth refractive index layer including $Al_{x7}Ga_{1-x7}As$, the third multilayer film includes a plurality of pairs of a low refractive index layer including $Al_{x9}Ga_{1-x9}As$ and a high refractive index layer including $Al_{x10}Ga_{1-x10}As$, and x3 to x10 satisfy a mathematical formula represented by a formula (2):

$$1 \geq (x4, x6) > (x3, x5, x7, x9) > 0.8 > (x8, x10) \geq 0 \qquad (2).$$

10. The laser diode according to claim 1, wherein the lower multilayer reflecting mirror includes low refractive index layers including a plurality of the oxidation layers.

11. The laser diode according to claim 10, wherein in the lower multilayer reflecting mirror, a low refractive index layer having a larger number of oxidation layers among the low refractive index layers having including a plurality of oxidation layers is arranged on a side closer to the active layer.

12. The laser diode according to claim 1, wherein the mesa section includes a non-oxidized region in a central region in a surface thereof, and includes a current narrowing layer including a ring-shaped oxidization region around the non-oxidized region, and the thickness of the oxidation layer is smaller than that of the current narrowing layer.

13. The laser diode according to claim 1, wherein the laminate configuration includes a groove section surrounding the mesa section, and the groove section has a nonuniform depth corresponding to a distribution of the oxidation layer.

14. The laser diode according to claim 13, wherein one or more of the plurality of oxidation layers include a first oxidation section and a second oxidation section arranged so as to face each other with a central axis of the mesa section in between, and the first oxidation section and the second oxidation section are formed corresponding to a part with a large depth of the groove section.

15. The laser diode according to claim 13, wherein the groove section has a nonuniform width corresponding to a distribution of the oxidation layers.

16. The laser diode according to claim 13, wherein a width of a part corresponding to a small depth of the groove section is within a range from 1 µm to 3 µm both inclusive.

17. A method of manufacturing a laser diode comprising:

a laminate configuration including a lower multilayer reflecting mirror, an active layer and an upper multilayer reflecting mirror in order from a substrate side, wherein the laminate configuration includes a columnar mesa section including an upper part of the lower multilayer reflecting mirror, the active layer and the upper multilayer reflecting mirror, and the lower multilayer reflecting mirror includes a first lower multilayer mirror section and a second lower multilayer mirror section with each having a plurality of pairs of a low refractive index layer and a high refractive index layer, and a third lower multilayer mirror section disposed between the first and second multilayer mirror sections and having a plurality of pairs of the low refractive index layer and the high refractive index layer and a plurality of oxidation layers nonuniformly distributed in a direction rotating around a central axis of the mesa section in a region except for a central region of one or more of the low refractive index layers of the third multilayer mirror section, the method comprising the steps of:

forming a lower multilayer reflecting mirror including a plurality of pairs of a low refractive index layer and a high refractive index layer on a substrate, and arranging a refractive index layer relatively resistant to oxidation and a plurality of refractive index layers relatively susceptible to oxidation in one or more of the low refractive index layer;

forming an active layer and an upper multilayer reflecting mirror in this order on a top surface of the lower multilayer reflecting mirror;

forming a coating layer including one or a plurality of ring-shaped openings with a nonuniform width on a top surface of the upper multilayer reflecting mirror;

forming a groove section with a nonuniform depth corresponding to the width of the opening by dry etching using the coating layer as a mask; and forming an oxidation section nonuniformly distributed corresponding to a depth of the groove section in the lower multilayer reflecting mirror by oxidizing a side surface of the groove section.

* * * * *